US010451993B2

(12) United States Patent
Kondo

(10) Patent No.: US 10,451,993 B2
(45) Date of Patent: Oct. 22, 2019

(54) LIGHT-EMITTING COMPONENT, PRINTHEAD, AND IMAGE FORMING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/114,258

(22) Filed: Aug. 28, 2018

(65) Prior Publication Data

US 2019/0086831 A1  Mar. 21, 2019

(30) Foreign Application Priority Data

Sep. 21, 2017 (JP) ................... 2017-181760

(51) Int. Cl.
| | | |
|---|---|---|
| G03G 15/04 | (2006.01) | |
| G03G 15/02 | (2006.01) | |
| H01L 25/16 | (2006.01) | |
| H01L 25/075 | (2006.01) | |
| H01L 33/36 | (2010.01) | |
| H01L 33/30 | (2010.01) | |
| H05B 33/08 | (2006.01) | |

(52) U.S. Cl.
CPC ....... *G03G 15/04054* (2013.01); *G03G 15/02* (2013.01); *H01L 33/30* (2013.01); *H01L 33/36* (2013.01); *H01L 25/0753* (2013.01); *H01L 25/167* (2013.01); *H05B 33/0815* (2013.01)

(58) Field of Classification Search
CPC .................. G03G 15/04054; G03G 15/02
See application file for complete search history.

(56) References Cited

U.S. PATENT DOCUMENTS

| | | | |
|---|---|---|---|
| 7,948,004 | B2 | 5/2011 | Suzuki |
| 2013/0214303 | A1* | 8/2013 | Kinoshita ............... H01L 33/14 257/88 |
| 2014/0320579 | A1* | 10/2014 | Ohno .................... H01L 33/005 347/141 |
| 2018/0006645 | A1* | 1/2018 | Kondo ............... H01L 31/1113 |
| 2018/0031362 | A1* | 2/2018 | Kondo ............... G01B 9/02007 |
| 2018/0062041 | A1* | 3/2018 | Nakanishi ........ G03G 15/04045 |

FOREIGN PATENT DOCUMENTS

| | | |
|---|---|---|
| JP | H01238962 | 9/1989 |
| JP | 2001308385 | 11/2001 |
| JP | 2009286048 | 12/2009 |

* cited by examiner

*Primary Examiner* — Ryan D Walsh
(74) *Attorney, Agent, or Firm* — JCIPRNET

(57) ABSTRACT

A light-emitting component includes a substrate, plural light-emitting elements, and plural thyristors. The plural light-emitting elements are disposed on the substrate and emit light in a direction perpendicular to a front surface of the substrate. The plural thyristors are respectively stacked on the plural light-emitting elements and turn on to drive the light-emitting elements to emit light or to increase an emitted light amount. Each of the thyristors includes an opening in a path of light from the corresponding light-emitting element to the thyristor.

17 Claims, 25 Drawing Sheets

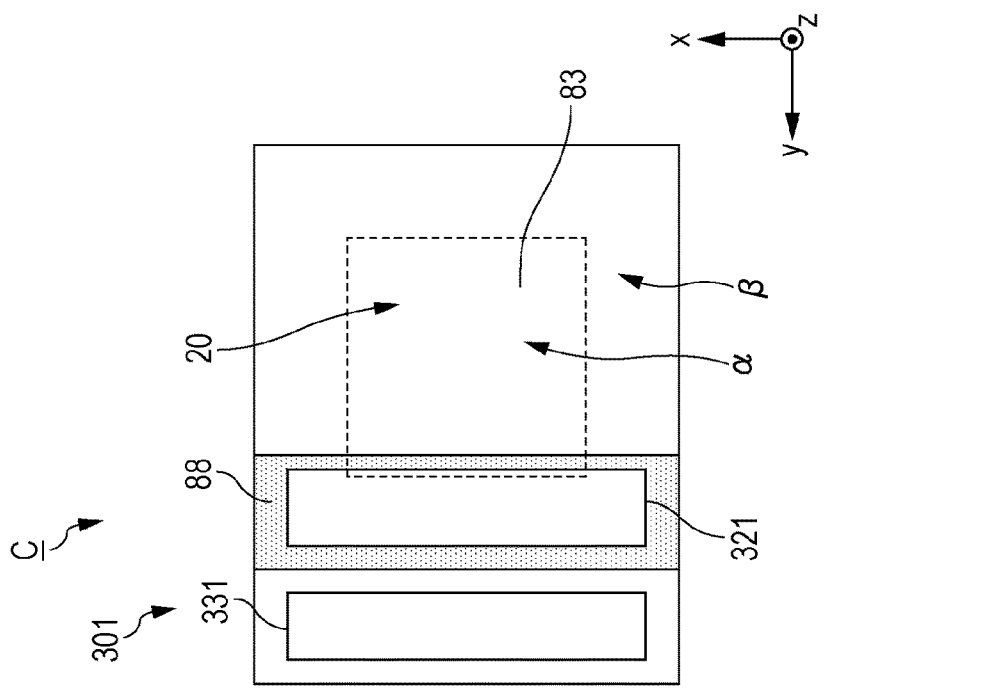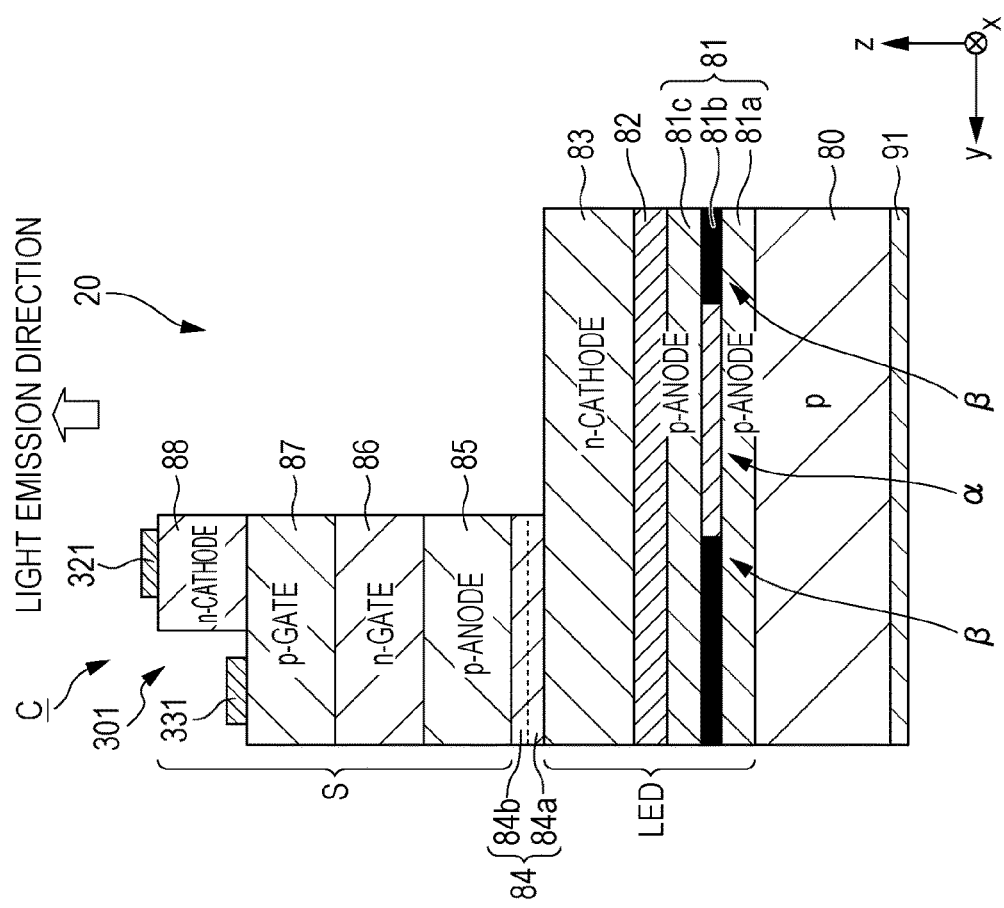

LIGHT-EMITTING COMPONENT, PRINTHEAD, AND IMAGE FORMING APPARATUS

CROSS-REFERENCE TO RELATED APPLICATIONS

This application is based on and claims priority under 35 USC 119 from Japanese Patent Application No. 2017-181760 filed Sep. 21, 2017.

BACKGROUND

Technical Field

The present invention relates to a light-emitting component, a printhead, and an image forming apparatus.

SUMMARY

According to an aspect of the invention, there is provided a light-emitting component including a substrate, plural light-emitting elements, and plural thyristors. The plural light-emitting elements are disposed on the substrate and emit light in a direction perpendicular to a front surface of the substrate. The plural thyristors are respectively stacked on the plural light-emitting elements and turn on to drive the light-emitting elements to emit light or to increase an emitted light amount. Each of the thyristors includes an opening in a path of light from the corresponding light-emitting element to the thyristor.

BRIEF DESCRIPTION OF THE DRAWINGS

Exemplary embodiments of the present invention will be described in detail based on the following figures, wherein:

FIG. 6A is a plan layout view of the light-emitting chip and FIG. 6B is a cross-sectional view taken along line VIB-VIB illustrated in FIG. 6A;

FIG. 7A is an enlarged cross-sectional view of the island and FIG. 7B is a plan view of the island;

FIG. 8A is a schematic energy band diagram in the stack structure of the light-emitting diode and the setting thyristor, FIG. 8B is an energy band diagram in a reverse-bias state of a tunnel junction layer, and FIG. 8C illustrates current-voltage characteristics of the tunnel junction layer;

FIG. 10A illustrates a semiconductor stack forming step, FIG. 10B illustrates an n-ohmic electrode forming step, and FIG. 10C illustrates a semiconductor stack dividing step;

FIG. 11A illustrates an opening forming step, FIG. 11B illustrates a current blocking portion forming step, and FIG. 11C illustrates a p-gate layer exposure etching step;

FIG. 12A illustrates a p-ohmic electrode forming step, FIG. 12B illustrates a protective layer forming step, and FIG. 12C illustrates a wire-and-electrode forming step;

FIG. 13A illustrates a bandgap of InNAs with respect to an InN composition ratio, FIG. 13B illustrates a bandgap of InNSb with respect to the InN composition ratio, and FIG. 13C illustrates lattice constants of group VI elements and group III-V compounds with respect to the bandgap;

FIG. 15A is a cross-sectional view of a thyristor including a voltage reduction layer, FIG. 15B illustrates a thyristor not including a voltage reduction layer, and FIG. 15C illustrates characteristics of the thyristors;

FIGS. 17A and 17B are enlarged views of an island in which a light-emitting diode and a setting thyristor are stacked for illustrating a first modification, specifically, FIG. 17A is an enlarged cross-sectional view of the island and FIG. 17B is a plan view of the island;

FIG. 18A is an enlarged cross-sectional view of the island and FIG. 18B is a plan view of the island;

FIG. 19A is an enlarged cross-sectional view of the island and FIG. 19B is a plan view of the island;

FIG. 20A is an enlarged cross-sectional view of the island and FIG. 20B is a plan view of the island;

FIG. 21A is an enlarged cross-sectional view of the island and FIG. 21B is a plan view of the island;

DETAILED DESCRIPTION

Exemplary embodiments of the present invention will be described in detail below with reference to the accompanying drawings.

Note that a chemical symbol is used to represent a substance below in such a manner that Al is used for aluminum.

First Exemplary Embodiment

A light-emitting chip C, which is an example of a light-emitting component, is herein applied to an image forming apparatus 1 as an example in the following description.

Image Forming Apparatus 1

Figure 1:
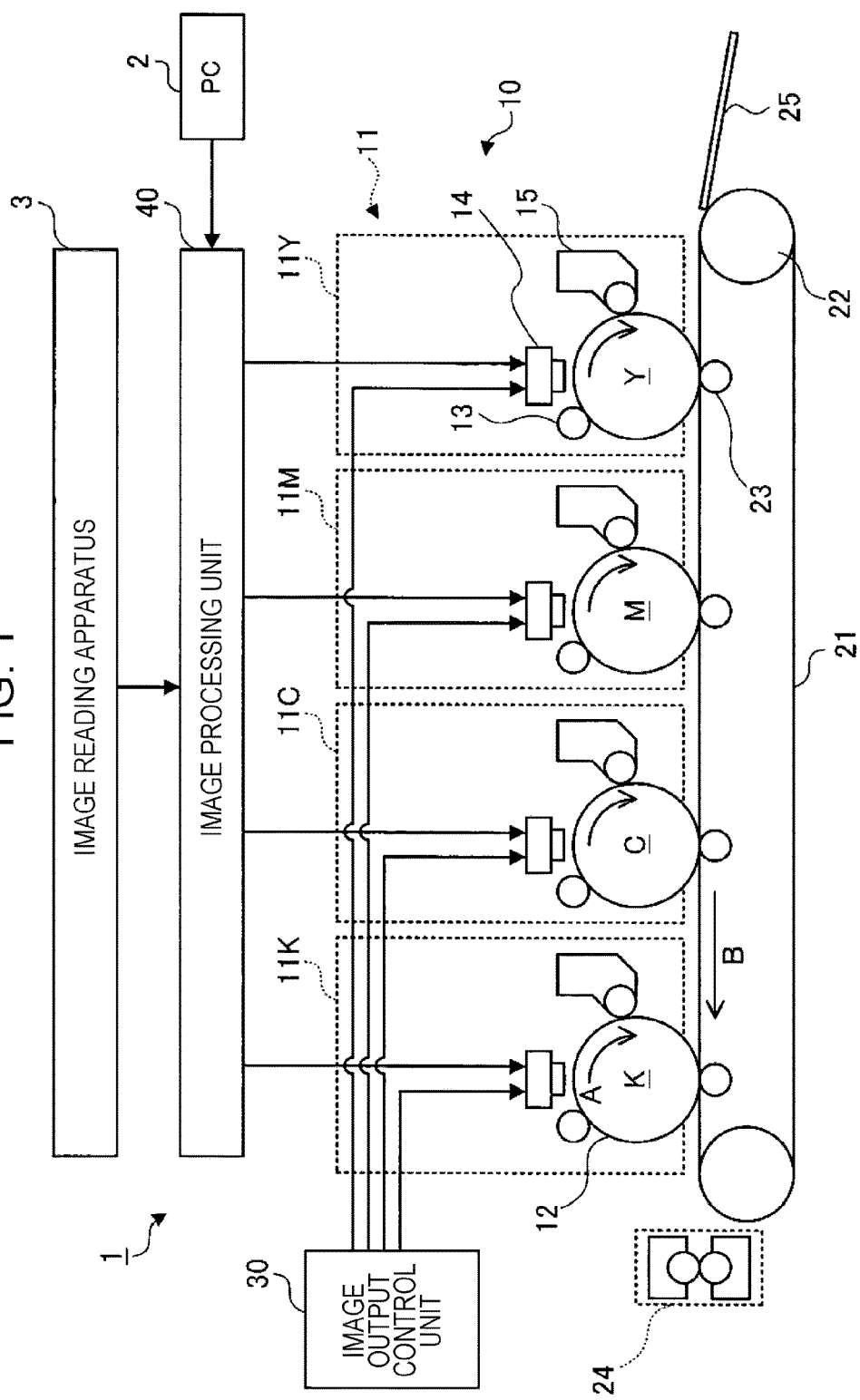
FIG. 1 illustrates an example of an overall configuration of an image forming apparatus to which a first exemplary embodiment is applied.

FIG. 1 illustrates an example of an overall configuration of the image forming apparatus 1 to which a first exemplary embodiment is applied. The image forming apparatus 1 illustrated in FIG. 1 is an image forming apparatus generally called a tandem type. The image forming apparatus 1 includes an image forming process unit 10, an image output control unit 30, and an image processing unit 40. The image forming process unit 10 forms an image in accordance with image data of each color. The image output control unit 30 controls the image forming process unit 10. The image processing unit 40 is connected to, for example, a personal computer (PC) 2 and an image reading apparatus 3 and performs predetermined image processing on image data received from the PC 2 and the image reading apparatus 3.

The image forming process unit 10 includes image forming units 11Y, 11M, 11C, and 11K that are disposed in parallel to each other with a predetermined space therebetween. The image forming units 11Y, 11M, 11C, and 11K are referred to as image forming units 11 when they are not distinguished from one another. Each of the image forming units 11 includes a photoconductor drum 12, a charger 13, a printhead 14, and a developer 15. The photoconductor drum 12, which is an example of an image bearing member, bears an electrostatic latent image and a toner image formed thereon. The charger 13, which is an example of a charging member, charges the surface of the photoconductor drum 12 to a predetermined potential. The printhead 14 exposes the photoconductor drum 12 that has been charged by the charger 13 to light. The developer 15, which is an example of a developing member, develops the electrostatic latent image obtained by the printhead 14. The image forming units 11Y, 11M, 11C, and 11K form toner images of yellow (Y), magenta (M), cyan (C), and black (K), respectively.

The image forming process unit 10 also includes a sheet transporting belt 21, a drive roll 22, transfer rolls 23, and a fixer 24 to transfer the toner images of the respective colors formed on the photoconductor drums 12 of the respective image forming units 11Y, 11M, 11C, and 11K onto a recording sheet 25 so that the toner images are superimposed together. The recording sheet 25 is an example of a transferred-image-receiving medium. The sheet transporting belt 21 transports the recording sheet 25. The drive roll 22 drives the sheet transporting belt 21. Each of the transfer rolls 23, which is an example of a transfer member, transfers the corresponding toner image on the corresponding photoconductor drum 12 onto the recording sheet 25. The fixer 24 fixes the toner images on the recording sheet 25.

In the image forming apparatus 1, the image forming process unit 10 performs an image forming operation in accordance with various control signals supplied thereto from the image output control unit 30. Under control of the image output control unit 30, the image processing unit 40 performs image processing on image data received from the PC 2 or the image reading apparatus 3 and supplies the resultant image data to the image forming units 11. Then, for example, in the image forming unit 11K for black (K), the photoconductor drum 12 is charged to a predetermined potential by the charger 13 while rotating in a direction of an arrow A and is exposed to light by the printhead 14 that emits light on the basis of the image data supplied thereto from the image processing unit 40. Consequently, an electrostatic latent image for an image of black (K) is formed on the photoconductor drum 12. The electrostatic latent image formed on the photoconductor drum 12 is then developed by the developer 15, and consequently a toner image of black (K) is formed on the photoconductor drum 12. Toner images of yellow (Y), magenta (M), and cyan (C) are formed in the image forming units 11Y, 11M, and 11C, respectively.

The toner images of the respective colors formed on the respective photoconductor drums 12 in the corresponding image forming units 11 are sequentially transferred electrostatically onto the recording sheet 25 that is fed in response to a movement of the sheet transporting belt 21 moving in a direction of an arrow B, by a transfer electric field applied to the transfer rolls 23. Consequently, a combined toner image in which the toner images of the respective colors are superimposed together is formed on the recording sheet 25.

Then, the recording sheet 25 having the electrostatically transferred combined toner image is transported to the fixer 24. The combined toner image on the recording sheet 25 transported to the fixer 24 undergoes a heat/pressure-based fixing process performed by the fixer 24 and is fixed on the recording sheet 25. Then, the recording sheet 25 is discharged from the image forming apparatus 1.

Printhead 14

Figure 2:
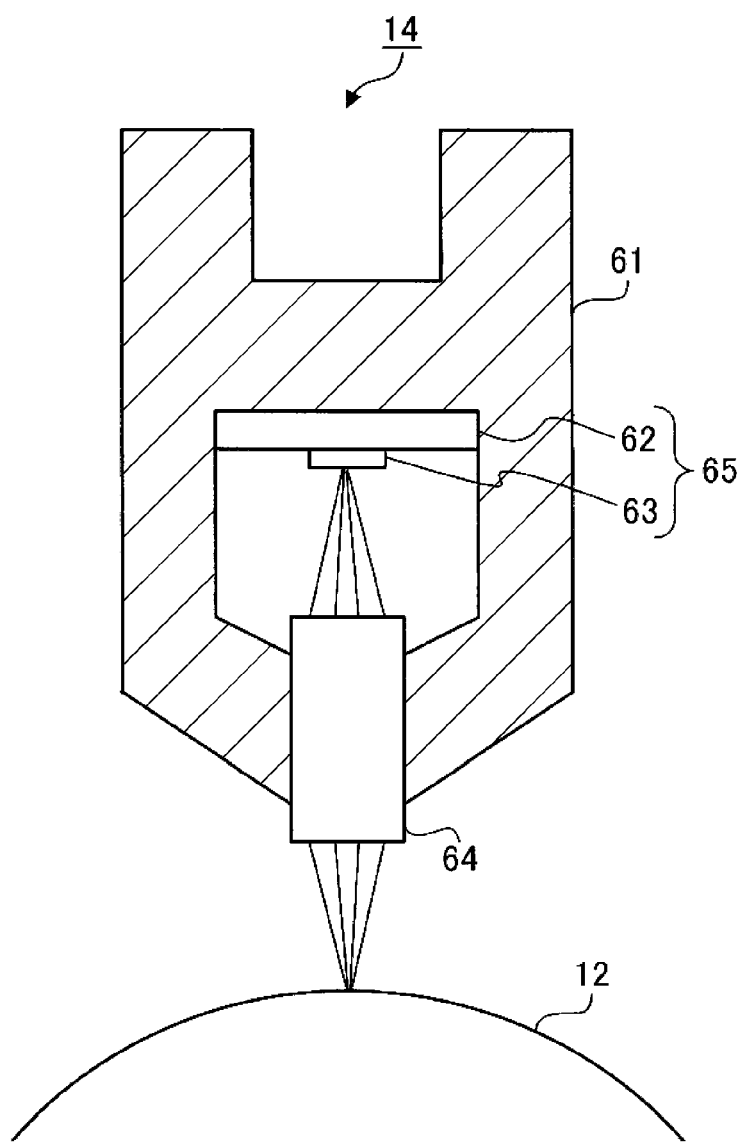
FIG. 2 is a cross-sectional view illustrating an example of a configuration of a printhead.

FIG. 2 is a cross-sectional view illustrating an example of a configuration of the printhead 14. The printhead 14, which is an example of an exposure device, includes a housing 61, a light-emitting device 65, and a rod lens array 64. The light-emitting device 65, which is an example of a light-emitting device, includes a light source unit 63 including plural light-emitting elements that expose the photoconductor drum 12 to light. In the first exemplary embodiment, the light-emitting elements are light-emitting diodes LED. The rod lens array 64, which is an example of an optical system, focuses the light emitted from the light source unit 63 onto the surface of the photoconductor drum 12 to form an image thereon.

The light-emitting device 65 includes a circuit board 62 on which the light source unit 63 described above, a signal generation circuit 110 (described later with reference to FIG. 3) that drives the light source unit 63, and so forth are mounted.

The housing 61 is formed of a metal, for example. The housing 61 supports the circuit board 62 and the rod lens array 64 to set the light-emitting surface of the light-emitting elements of the light source unit 63 to be a focal plane of the rod lens array 64. In addition, the rod lens array 64 is disposed in an axial direction of the photoconductor drum 12 (which is a main scanning direction and an X direction in FIGS. 3 and 4B described later).

Light-Emitting Device 65

Figure 3:
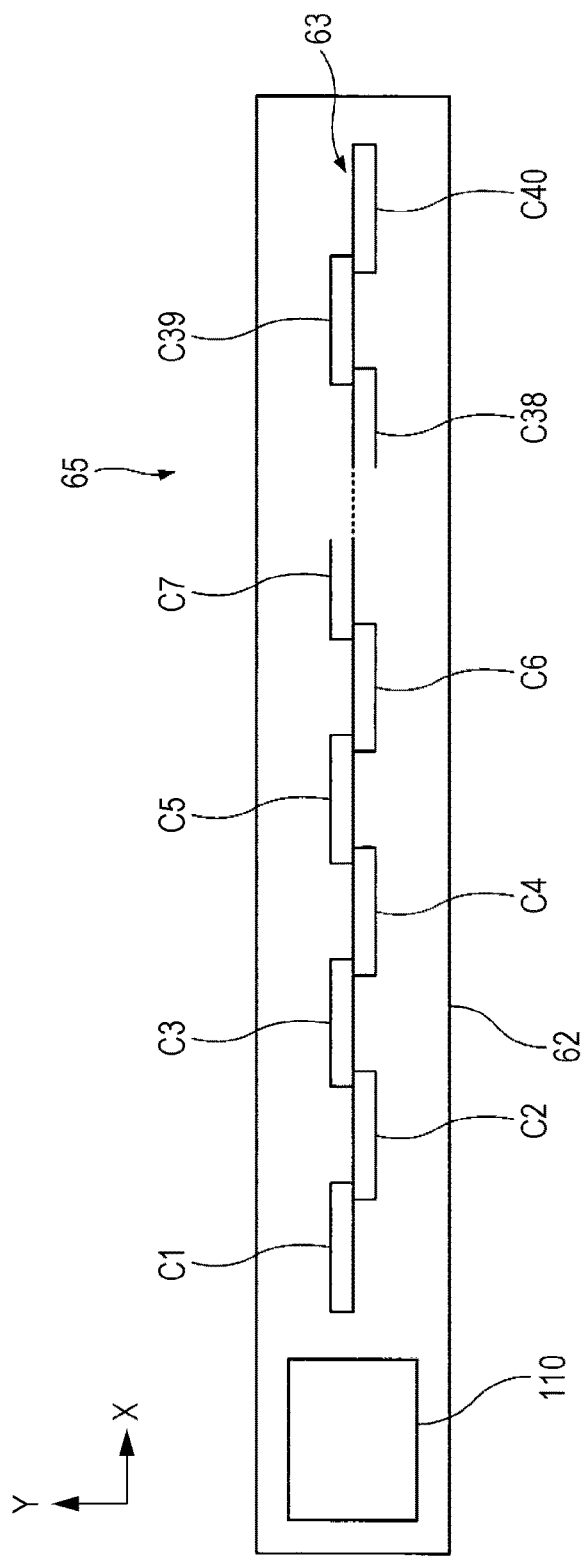
FIG. 3 is a top view of an example of a light-emitting device.

FIG. 3 is a top view of an example of the light-emitting device 65.

In the light-emitting device 65 illustrated by way of example in FIG. 3, the light source unit 63 includes 40 light-emitting chips C1 to C40, each of which is an example of a light-emitting component, arranged in two lines in the X direction which is the main scanning direction on the circuit board 62 to form a staggered pattern. The light-emitting chips C1 to C40 are referred to as light-emitting chips C when they are not distinguished from one another. The light-emitting chips C1 to C40 may have an identical configuration.

Herein, a symbol "-" or a word "to" is used to indicate plural components that are distinguished from one another using numbers and indicates that the plural components include components that are assigned the numbers preceding and following the symbol "-" or the word "to" and components that are assigned numbers between the preceding and following numbers. For example, the light-emitting chips C1-C40 (C1 to C40) include the light-emitting chip C1 through the light-emitting chip C40 in the numbered order.

In the first exemplary embodiment, 40 light-emitting chips C in total are used; however, the number of light-emitting chips C is not limited to 40.

The light-emitting device 65 includes the signal generation circuit 110 that drives the light source unit 63. The signal generation circuit 110 is constituted by an integrated circuit (IC), for example. Note that the light-emitting device 65 need not necessarily include the signal generation circuit 110. In such a case, the signal generation circuit 110 is provided outside the light-emitting device 65 and supplies control signals for controlling the light-emitting chips C or the like to the light-emitting device 65 through a cable or the like. The description is given herein on the assumption that the light-emitting device 65 includes the signal generation circuit 110.

An arrangement of the light-emitting chips C will be described in detail later.

FIGS. 4A and 4B illustrate an example of a configuration of each of the light-emitting chips C, an example of a configuration of the signal generation circuit 110 of the light-emitting device 65, and an example of a configuration of wires (lines) on the circuit board 62. Specifically, FIG. 4A illustrates the configuration of the light-emitting chip C, and FIG. 4B illustrates the configuration of the signal generation circuit 110 of the light-emitting device 65 and the configuration of wires (lines) on the circuit board 62. Note that FIG. 4B illustrates the light-emitting chips C1 to C9 among the light-emitting chips C1 to C40.

First, the configuration of the light-emitting chip C illustrated in FIG. 4A will be described.

The light-emitting chip C includes a light-emitting unit 102 including plural light-emitting elements arranged in a line along long sides to be closer to one of the long sides on a front surface of a substrate 80 having a rectangular shape. In the first exemplary embodiment, the plural light-emitting elements are light-emitting diodes LED1 to LED128. The light-emitting diodes LED1 to LED128 are referred to as light-emitting diodes LED when they are not distinguished from one another. The light-emitting chip C further includes terminals ($\phi 1$, $\phi 2$, Vga, and $\phi I$) at respective ends of a long-side direction on the front surface of the substrate 80. The terminals are plural bonding pads for receiving various control signals, for example. These terminals are disposed in an order of the terminal $\phi I$ and the terminal $\phi 1$ from one of the ends of the substrate 80 and in an order of the terminal Vga and the terminal $\phi 2$ from the other end of the substrate 80. The light-emitting unit 102 is disposed between the terminals $\phi 1$ and $\phi 2$. A back-surface electrode 91 (see FIGS. 6A and 6B described later), which serves as a terminal Vsub, is also disposed on a back surface of the substrate 80. The light-emitting diodes LED are examples of light-emitting elements (elements used for emitting light). A direction in which the light-emitting elements (i.e., the light-emitting diodes LED1-LED128) are arranged on the front surface of the substrate 80 is defined as an x direction, and a direction perpendicular to the x direction is defined as a y direction.

Note that the expression "arranged in a line" refers not only to a state in which plural light-emitting elements are arranged in a line as illustrated in FIG. 4A but also to a state in which the plural light-emitting elements are shifted from each other by different displacement amounts in a direction perpendicular to the direction of the line. For example, the light-emitting elements may be arranged to be shifted from each other by a displacement amount in a direction perpendicular to the direction of the line. In addition, adjacent light-emitting elements or sets of plural adjacent light-emitting elements may be arranged in a zigzag pattern.

The configuration of the signal generation circuit 110 of the light-emitting device 65 and the configuration of wires (lines) on the circuit board 62 will be described next with reference to FIG. 4B.

As described above, the signal generation circuit 110 and the light-emitting chips C1 to C40 are mounted on the circuit board 62 of the light-emitting device 65, and wires (lines) that connect the signal generation circuit 110 and the respective light-emitting chips C1 to C40 to each other are provided on the circuit board 62.

The configuration of the signal generation circuit 110 will be described first.

The signal generation circuit 110 receives various control signals and pieces of image data that have been subjected to image processing respectively from the image output control unit 30 and the image processing unit 40 (see FIG. 1). The signal generation circuit 110 rearranges the pieces of image data and corrects an amount of light on the basis of the pieces of image data and the various control signals.

The signal generation circuit 110 includes a transfer signal generation unit 120 that sends a first transfer signal $\phi 1$ and a second transfer signal $\phi 2$ to the light-emitting chips C1 to C40 on the basis of the various control signals.

The signal generation circuit 110 also includes a turn-on signal generation unit 140 that sends turn-on signals $\phi I1$ to $\phi I40$ to the light-emitting chips C1 to C40 on the basis of the various control signals, respectively. The turn-on signals $\phi I1$ to $\phi I40$ are referred to as turn-on signals $\phi I$ when they are not distinguished from each other.

The signal generation circuit 110 further includes a reference potential supplying unit 160 and a power supply potential supplying unit 170. The reference potential supplying unit 160 supplies a reference potential Vsub, which serves as a reference of the potential, to the light-emitting chips C1 to C40. The power supply potential supplying unit 170 supplies a power supply potential Vga for driving the light-emitting chips C1 to C40.

The arrangement of the light-emitting chips C1 to C40 will be described next.

Odd-numbered light-emitting chips C1, C3, C5, . . . are arranged in a line in a long-side direction of the substrate 80 with a space interposed therebetween. Similarly, even-numbered light-emitting chips C2, C4, C6, . . . are also arranged in a line in the long-side direction of the substrate 80 with a space interposed therebetween. The odd-numbered light-emitting chips C1, C3, C5, . . . and the even-numbered light-emitting chips C2, C4, C6, . . . are arranged in a staggered pattern with being rotated 180° from each other so that the long sides close to the light-emitting units 102 on the adjacent odd-numbered and even-numbered light-emitting chips C face each other. Positions of the light-emitting chips C are set such that the light-emitting elements of the light-emitting chips C are arranged in the main scanning direction (X direction) at predetermined intervals. Note that a direction in which the light-emitting elements of the light-emitting unit 102 illustrated in FIG. 4A are arranged (i.e., the numbered order of the light-emitting diodes LED1 to LED128 in the first exemplary embodiment) is indicated using an arrow in each of the light-emitting chips C1 to C40 in FIG. 4B.

The wires (lines) that connect the signal generation circuit 110 and the light-emitting chips C1 to C40 to each other will be described.

A power supply line 200a is provided on the circuit board 62. The power supply line 200a is connected to the back-surface electrodes 91 (see FIGS. 6A and 6B described later) which serve as the terminals Vsub disposed on the back surfaces of the substrates 80 of the respective light-emitting chips C and supplies the reference potential Vsub.

A power supply line 200b is also provided on the circuit board 62. The power supply line 200b is connected to the terminals Vga provided in the respective light-emitting chips C and supplies the power supply potential Vga for driving.

A first transfer signal line 201 and a second transfer signal line 202 are provided on the circuit board 62. The first transfer signal line 201 is used to send the first transfer signal $\phi 1$ from the transfer signal generation unit 120 of the signal generation circuit 110 to the terminals $\phi 1$ of the respective light-emitting chips C1 to C40. The second transfer signal line 202 is used to send the second transfer signal $\phi 2$ from the transfer signal generation unit 120 of the signal generation circuit 110 to the terminals $\phi 2$ of the respective light-emitting chips C1 to C40. The first transfer signal $\phi 1$ and the second transfer signal $\phi 2$ are sent to the light-emitting chips C1 to C40 in common (in parallel).

In addition, turn-on signal lines 204-1 to 204-40 are provided on the circuit board 62. The turn-on signal lines 204-1 to 204-40 are used to send the turn-on signals $\phi I1$ to $\phi I40$ from the turn-on signal generation unit 140 of the signal generation circuit 110 to the terminals $\phi I$ of the light-emitting chips C1 to C40 through respective current-limiting resistors RI, respectively. The turn-on signal lines 204-1 to 204-40 are referred to as turn-on signal lines 204 when they are not distinguished from one another.

As described above, the reference potential Vsub and the power supply potential Vga are supplied to all the light-emitting chips C1 to C40 on the circuit board 62 in common. The first transfer signal $\phi 1$ and the second transfer signal $\phi 2$ are also sent to the light-emitting chips C1 to C40 in common (in parallel). On the other hand, the turn-on signals $\phi I1$ to $\phi I40$ are individually sent to the light-emitting chips C1 to C40, respectively.

Light-Emitting Chip C

Figure 4:
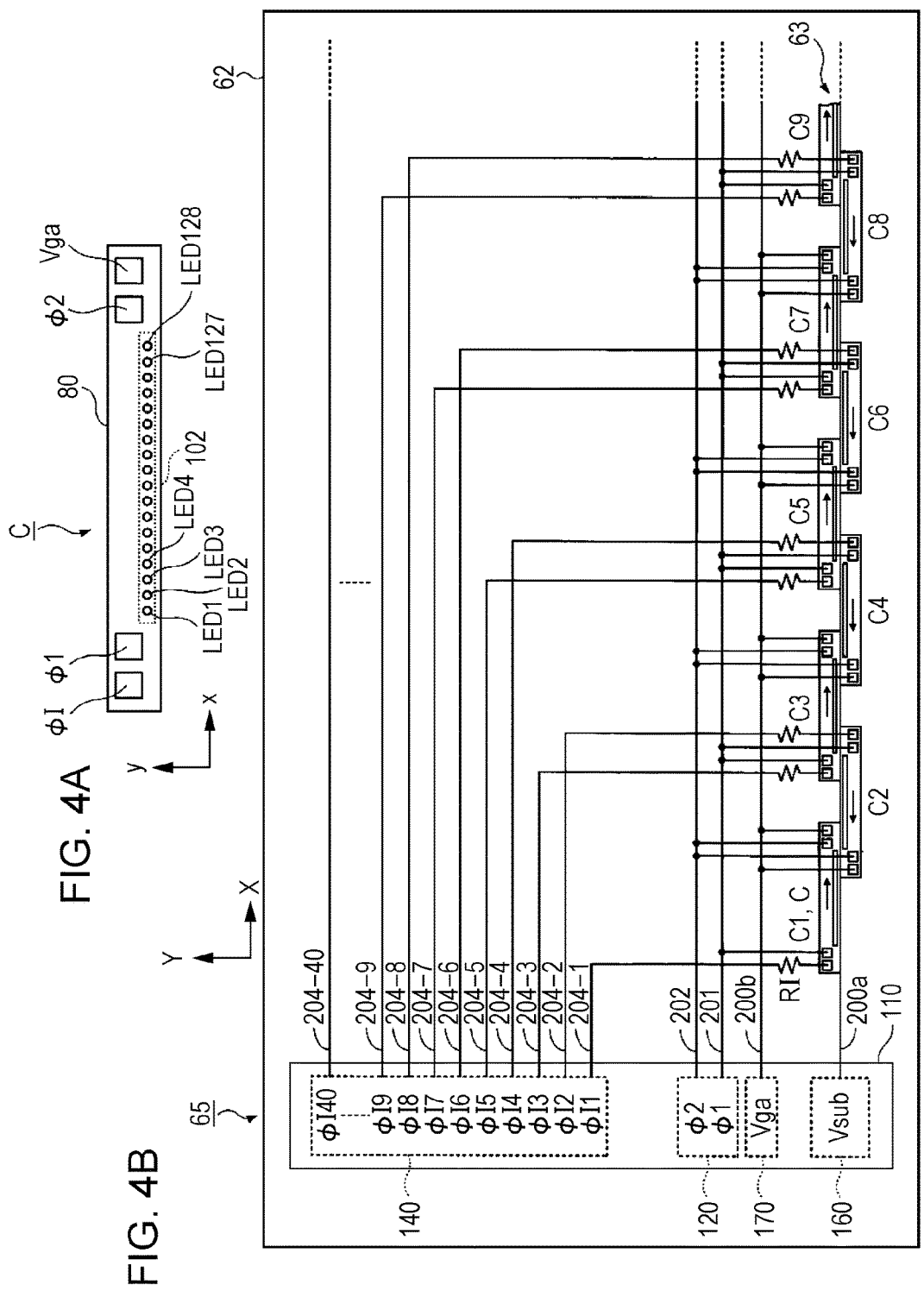
FIGS. 4A and 4B illustrate an example of a configuration of a light-emitting chip, an example of a configuration of a signal generation circuit of the light-emitting device, and an example of a configuration of wires (lines) on a circuit board.
Figure 5:
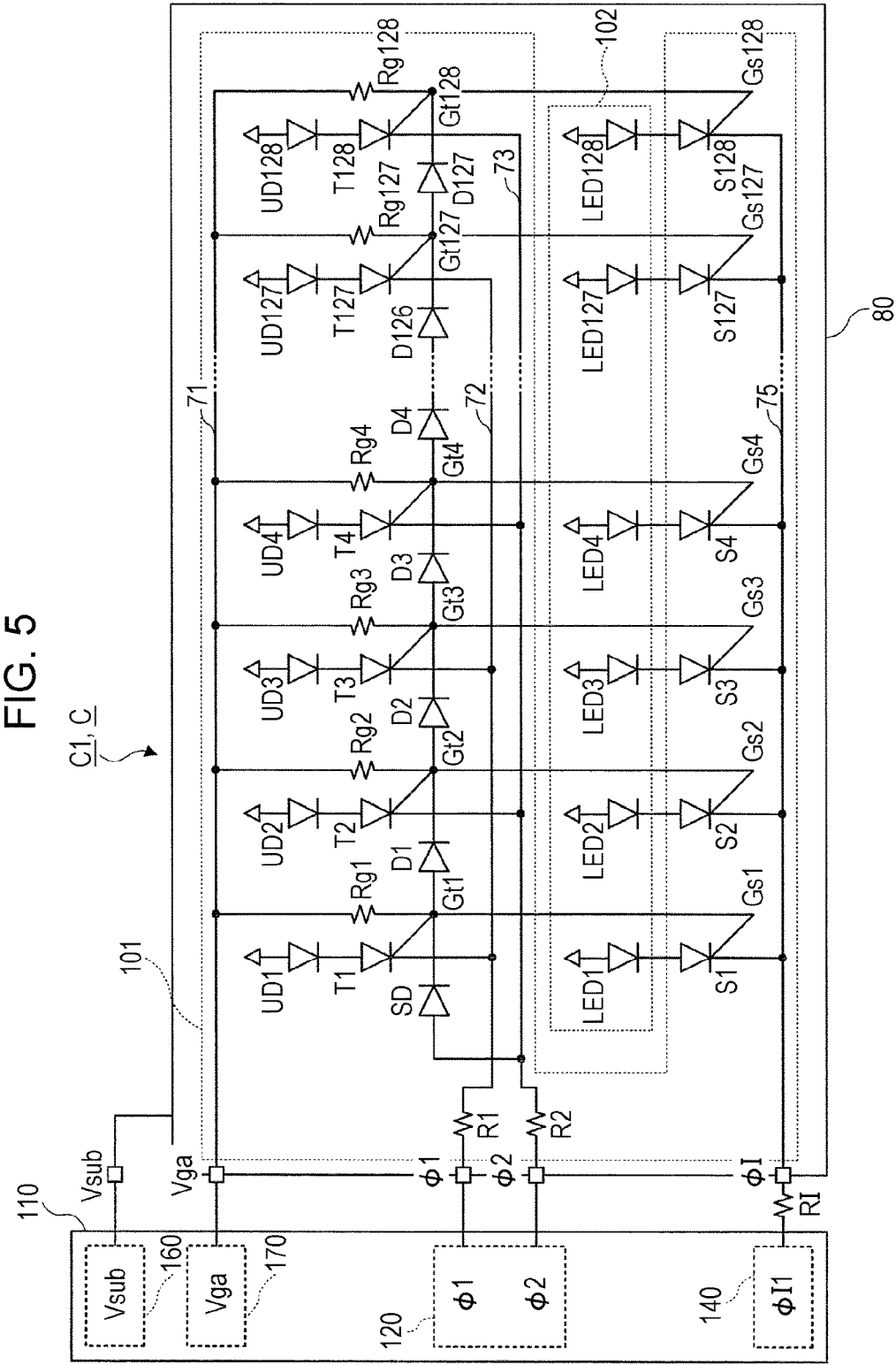
FIG. 5 is an equivalent circuit diagram illustrating a circuit configuration of the light-emitting chip in which a self-scanning light-emitting device (SLED) array according to the first exemplary embodiment is mounted.

FIG. 5 is an equivalent circuit diagram illustrating a circuit configuration of the light-emitting chip C in which a self-scanning light-emitting device (SLED) array according to the first exemplary embodiment is mounted. Elements described below are arranged in accordance with the layout (see FIGS. 6A and 6B described later) on the light-emitting chip C except for the terminals ($\phi 1$, $\phi 2$, Vga, and $\phi I$). Note that the positions of the terminals ($\phi 1$, $\phi 2$, Vga, and $\phi I$) are different from those illustrated in FIG. 4A because the terminals are illustrated on the left end in FIG. 5 in order to describe connections with the signal generation circuit 110. The terminal Vsub provided on the back surface of the substrate 80 is illustrated outside the substrate 80 as an extended terminal.

The light-emitting chips C will be described in relationship with the signal generation circuit 110 by using the light-emitting chip C1 by way of example. Accordingly, the light-emitting chip C is referred to as the light-emitting chip C1(C) in FIG. 5. The other light-emitting chips C2 to C40 have the same or substantially the same configuration as the light-emitting chip C1.

The light-emitting chip C1(C) includes the light-emitting unit 102 (see FIG. 4A) including the light-emitting diodes LED1 to LED128.

The light-emitting chip C1(C) also includes setting thyristors S1 to S128, which are referred to as setting thyristors S when they are not distinguished from one another. The light-emitting diodes LED1 to LED128 are connected to the setting thyristors S1 to S128, respectively, such that the light-emitting diode LED and the setting thyristor S that are assigned the same number are connected in series.

Figure 6A:
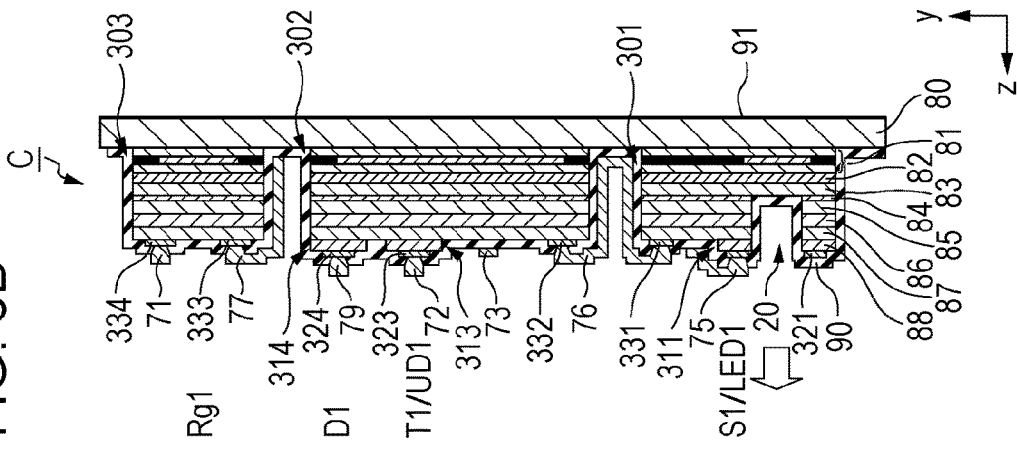
FIGS. 6A and 6B are examples of a plan layout view and a cross-sectional view of the light-emitting chip according to the first exemplary embodiment, specifically.
Figure 6B:
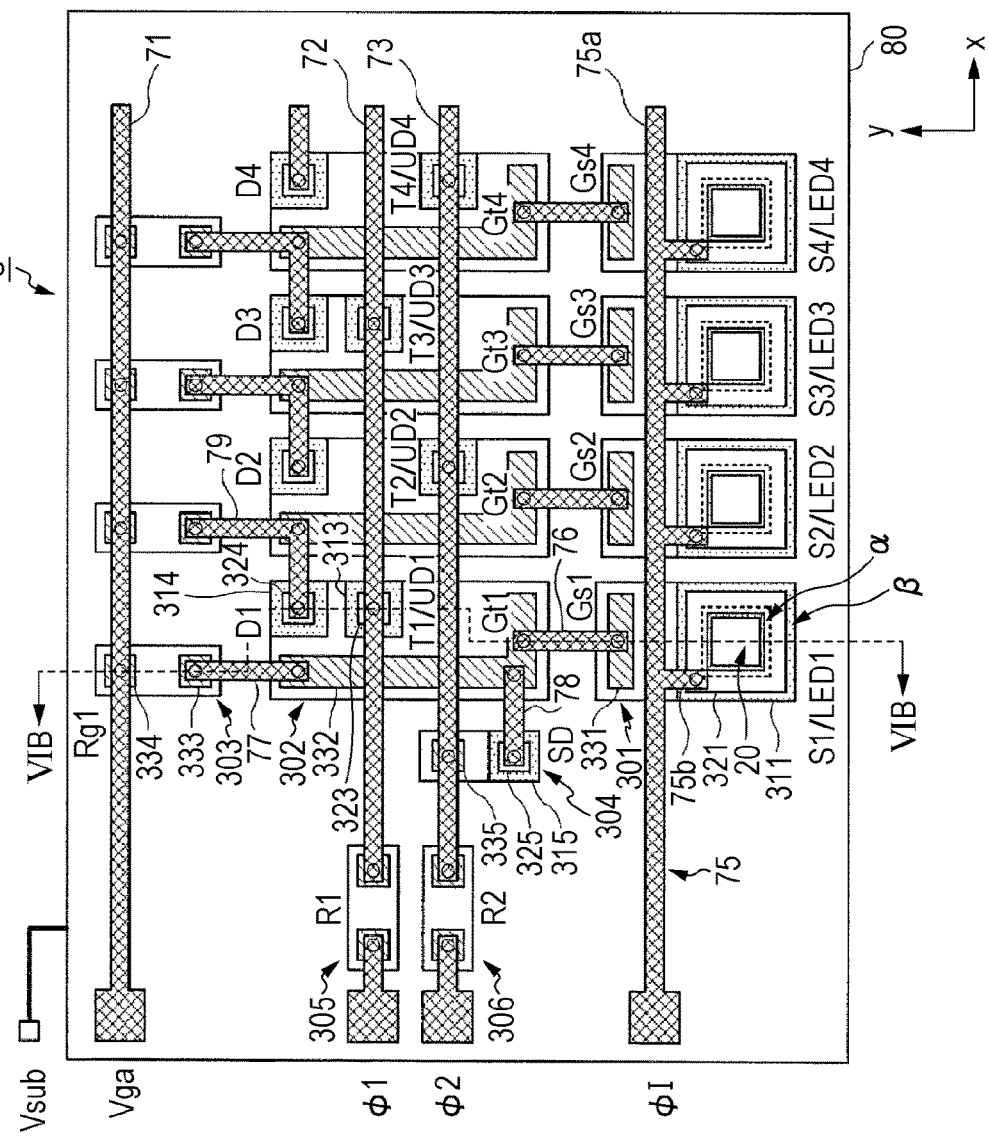

As illustrated in FIG. 6B described later, the light-emitting diodes LED that are arranged in a line on the substrate 80 are stacked on the respective setting thyristors S. Thus, the setting thyristors S1 to S128 are also arranged in a line. Since the setting thyristors S set (control) on/off of the respective light-emitting diodes LED as described later, the setting thyristors S are elements that drive the respective light-emitting diodes LED. Note that the setting thyristors S are sometimes simply referred to as thyristors.

The light-emitting chip C1(C) further includes transfer thyristors T1 to T128 that are also arranged in a line just like the light-emitting diodes LED1 to LED128 and the setting thyristors S1 to S128. The transfer thyristors T1 to T128 are referred to as transfer thyristors T when they are not distinguished from one another.

The light-emitting chip C1(C) also includes lower diodes UD1 to UD128 having a structure substantially the same as that of the light-emitting diodes LED1 to LED128. The lower diodes UD1 to UD128 are referred to as lower diodes UD when they are not distinguished from one another. The lower diodes UD1 to UD128 and the transfer thyristors T1 to T128 are respectively connected to each other. That is, the lower diode UD and the transfer thyristor T assigned the same number are connected in series.

As illustrated in FIG. 6B described later, each transfer thyristor T is stacked on a corresponding one of the lower diodes UD arranged in a line on the substrate 80. Thus, the transfer thyristors S1 to S128 are also arranged in a line. Note that the lower diode UD is an example of a lower element.

Although the description is given here by using the transfer thyristors T as an example of transfer elements, the transfer elements may be any other circuit elements that sequentially turn on. For example, a shift register or a circuit element including a combination of plural transistors may be alternatively used.

In addition, the light-emitting chip C1(C) includes coupling diodes D1 to D127. The transfer thyristors T1 to T128 are paired in the numbered order, and each of the coupling diodes D1 to D127 is disposed between a corresponding one of the pairs. The coupling diodes D1 to D127 are referred to as coupling diodes D when they are not distinguished from one another.

Furthermore, the light-emitting chip C1(C) includes power supply line resistors Rg1 to Rg128, which are referred to as power supply line resistors Rg when they are not distinguished from one another.

The light-emitting chip C1(C) also includes a start diode SD. In addition, the light-emitting chip C1(C) includes current-limiting resistors R1 and R2 that are provided to prevent an excessive current from flowing through a first transfer signal line 72 (described later) used to send the first transfer signal $\phi 1$ and through a second transfer signal line 73 (described later) used to send the second transfer signal $\phi 2$.

In this example, the setting thyristors S1 to S128, the transfer thyristors T1 to T128, the lower diodes UD1 to UD128, the power supply line resistors Rg1 to Rg128, the coupling diodes D1 to D127, the start diode SD, and the current-limiting resistors R1 and R2 constitute a driving unit 101.

The light-emitting diodes LED1 to LED128 of the light-emitting unit 102 and the setting thyristors S1 to S128, the transfer thyristors T1 to T128, and the lower diodes UD1 to UD128 of the driving unit 101 are arranged in the numbered order from the left in FIG. 5. Further, the coupling diodes D1 to D127 and the power supply line resistors Rg1 to Rg128 are also arranged in the numbered order from the left in FIG. 5.

In the first exemplary embodiment, the number of light-emitting diodes LED of the light-emitting unit 102 and the number of setting thyristors S, the number of transfer thyristors T, the number of lower diodes UD, and the number of power supply line resistors Rg of the driving unit 101 are set equal to 128. The number of coupling diodes D is equal to 127, which is less than the number of transfer thyristors T by 1.

The numbers of light-emitting diodes LED and other elements are not limited to the above numbers and may be set equal to predetermined numbers. The number of transfer thyristors T may be greater than the number of light-emitting diodes LED.

Each of the diodes (the light-emitting diodes LED, the lower diodes UD, the coupling diodes D, and the start diode SD) is a two-terminal semiconductor element having an anode terminal (anode) and a cathode terminal (cathode). Each of the thyristors (the setting thyristors S and the transfer thyristors T) is a three-terminal semiconductor element having an anode terminal (anode), a gate terminal (gate), and a cathode terminal (cathode).

As described later, the diodes (the light-emitting diodes LED, the lower diodes UD, the coupling diodes D, and the start diode SD) and the thyristors (the setting thyristors S and the transfer thyristors T) do not necessarily have the anode terminal, the gate terminal, or the cathode terminal that is formed as an electrode in some cases. Thus, hereinafter, the anode terminal, the gate terminal, and the cathode terminal are sometimes referred to as an anode, a gate, or a cathode, respectively.

Electrical connections between the elements of the light-emitting chip C1(C) will be described next.

The anodes of the light-emitting diodes LED and the anodes of the lower diodes UD are connected to the substrate 80 of the light-emitting chip C1(C) (anode-common).

These anodes are connected to the power supply line 200a (see FIG. 4B) through the back-surface electrode 91 (see FIG. 6B described later) which is the terminal Vsub provided on the back surface of the substrate 80. The power supply line 200a is supplied with the reference potential Vsub from the reference potential supplying unit 160.

The cathodes of the light-emitting diodes LED are connected to the corresponding anodes of the respective setting thyristors S. The cathodes of the lower diodes UD are connected to the corresponding anodes of the respective transfer thyristors T.

Note that this connection is a configuration implemented when a p-type substrate is used as the substrate 80. When an n-type substrate is used, the polarity is reversed. When an intrinsic (i-type) substrate that is not doped with any impurities is used, a terminal connected to the power supply line 200a that supplies the reference potential Vsub is provided on the side of the substrate on which the driving unit 101 and the light-emitting unit 102 are disposed.

The cathodes of the odd-numbered transfer thyristors T1, T3, . . . are connected to the first transfer signal line 72 along the line of the transfer thyristors T. The first transfer signal line 72 is connected to the terminal $\phi 1$ through the current-limiting resistor R1. The first transfer signal line 201 (see FIG. 4B) is connected to the terminal $\phi 1$, and the first transfer signal $\phi 1$ is sent to the terminal $\phi 1$ from the transfer signal generation unit 120.

On the other hand, the cathodes of the even-numbered transfer thyristors T2, T4, . . . are connected to the second transfer signal line 73 along the line of the transfer thyristors T. The second transfer signal line 73 is connected to the terminal $\phi 2$ through the current-limiting resistor R2. The second transfer signal line 202 (see FIG. 4B) is connected to the terminal $\phi 2$, and the second transfer signal $\phi 2$ is sent to the terminal $\phi 2$ from the transfer signal generation unit 120.

The cathodes of the setting thyristors S are connected to a turn-on signal line 75. The turn-on signal line 75 is connected to the terminal $\phi I$. The terminal $\phi I$ of the light-emitting chip C1 is connected to the turn-on signal line 204-1 through the current-limiting resistor RI that is provided outside the light-emitting chip C1(C), and the turn-on signal $\phi I1$ is sent to the terminal $\phi I$ from the turn-on signal generation unit 140 (see FIG. 4B). The turn-on signal $\phi I1$ supplies a current to turn on the light-emitting diodes LED1 to LED128. Note that the turn-on signal lines 204-2 to 204-40 are respectively connected to the terminals $\phi I$ of the other light-emitting chips C2 to C40 through the respective current-limiting resistors RI, and the turn-on signals $\phi I2$ to $\phi I40$ are sent to the respective terminals $\phi I$ from the turn-on signal generation unit 140 (see FIG. 4B).

Gates Gt1 to Gt128 of the transfer thyristors T1 to T128 are connected to gates Gs1 to Gs128 of the setting thyristors S1 to S128, respectively, to have a one-to-one correspondence. The gates Gt1 to Gt128 are referred to as gates Gt when they are not distinguished from one another, and the gates Gs1 to Gs128 are referred to as gates Gs when they are not distinguished from one another. Thus, each pair of gates assigned the same number among the gates Gt1 to Gt128 and the gates Gs1 to Gs128 has an electrically equal potential. For example, the expression "gate Gt1 (gate Gs1)" indicates that the gate Gt1 and the gate Gs1 have an equal potential.

Each of the coupling diodes D1 to D127 is connected between a corresponding pair of gates Gt, which are two of the gates Gt1 to Gt128 of the transfer thyristors T1 to T128 in the numbered order. That is, the coupling diodes D1 to D127 are connected in series so that each of the coupling diodes D1 to D127 is interposed between a corresponding pair among the gates Gt1 to Gt128. The coupling diode D1 is connected so that a current flows from the gate Gt1 to the gate Gt2. The same applies to the other coupling diodes D2 to D127.

The gates Gt (gates Gs) of the transfer thyristors T are connected to a power supply line 71 through the respective power supply line registers Rg provided for the corresponding transfer thyristors T. The power supply line 71 is connected to the terminal Vga. The power supply line 200b (see FIG. 4B) is connected to the terminal Vga, and the terminal Vga is supplied with the power supply potential Vga from the power supply potential supplying unit 170.

The gate Gt1 of the transfer thyristor T1 is connected to the cathode terminal of the start diode SD. The anode of the start diode SD is connected to the second transfer signal line 73.

FIGS. 6A and 6B are an example of a plan layout view and a cross-sectional view of the light-emitting chip C according to the first exemplary embodiment. Specifically, FIG. 6A is a plan layout view of the light-emitting chip C, and FIG. 6B is a cross-sectional view taken along line VIB-VIB illustrated in FIG. 6A. Since connections between the light-emitting chips C and the signal generation circuit 110 are not illustrated in FIGS. 6A and 6B, it is not necessary to use the light-emitting chip C1 by way of example. Thus, the term "light-emitting chip C" is used.

FIG. 6A mainly illustrates a portion around the light-emitting diodes LED1 to LED4, the setting thyristors S1 to S4, the transfer thyristors T1 to T4, and the lower diodes UD1 to UD4. Note that the terminals φ1, φ2, Vga, and φI) are illustrated at the left end portion in FIG. 6A for convenience of explanation, and these positions of the terminals are different from those illustrated in FIG. 4A. The terminal Vsub (the back-surface electrode 91) disposed on the back surface of the substrate 80 is illustrated outside the substrate 80 as an extended terminal. When the terminals are disposed in accordance with FIG. 4A, the terminals φ2 and Vga and the current-limiting resistor R2 are disposed at a right end portion of the substrate 80. In addition, the start diode SD may be disposed on the right end portion of the substrate 80.

FIG. 6B, which is a cross-sectional view taken along line VIB-VIB illustrated in FIG. 6A, illustrates the setting thyristor S1/the light-emitting diode LED1, the transfer thyristor T1/the lower diode UD1, the coupling diode D1, and the power supply line resistor Rg1 sequentially from the bottom. Note that the setting thyristor S1 and the light-emitting diode LED1 are stacked. Likewise, the transfer thyristor T1 and the lower diode UD1 are stacked.

FIGS. 6A and 6B illustrate major elements and terminals using reference signs thereof.

Note that a direction in which the light-emitting diodes LED (light-emitting diodes LED1 to LED4) are arranged on the front surface of the substrate 80 is defined as an x direction, and a direction perpendicular to the x direction is defined as a y direction. A direction from the back surface to the front surface of the substrate 80 is defined as a z direction.

First, the cross-sectional structure of the light-emitting chip C is described with reference to FIG. 6B.

A p-type anode layer 81 (the p-anode layer 81), a light-emitting layer 82, and an n-type cathode layer 83 (the n-cathode layer 83) that constitute the light-emitting diode LED and the lower diode UD are disposed on the p-type substrate 80 (the substrate 80).

A tunnel junction (tunnel diode) layer 84 (the tunnel junction layer 84) is disposed on the n-cathode layer 83.

Further, on the tunnel junction layer 84, a p-type anode layer 85 (the p-anode layer 85), an n-type gate layer 86 (the n-gate layer 86), a p-type gate layer 87 (the p-gate layer 87), and an n-type cathode layer 88 (the n-cathode layer 88) that constitute the setting thyristor S, the transfer thyristor T, the coupling diode D1, and the power supply line resistor Rg1 are sequentially disposed. Note that the n-gate layer 86 is an example of a first gate layer, and the p-gate layer 87 is an example of a second gate layer. Although this is a case where the p-type substrate 80 is used, in the case where an n-type substrate is used, the p-gate layer is an example of the first gate layer, and the n-gate layer is an example of the second gate layer.

Note that the aforementioned terms in parentheses are used below. The same applies to the other cases.

In the light-emitting chip C, a protective layer 90 is disposed to cover the upper surface and the side surfaces of these islands as illustrated in FIG. 6B. The protective layer 90 is formed of a light-transmitting insulating material.

In FIG. 6B, an arrow indicates a direction in which light from the light-emitting diode LED exits (light emission direction). Herein, the light emission direction is a direction perpendicular to the front surface of the substrate 80 (a vertical z direction in this example).

Note that the light-emitting diode LED in this example is a surface emitting element, and a surface of the light-emitting diode LED that emits light in the light emission direction is an emission surface.

These islands are connected to wires such as the power supply line 71, the first transfer signal line 72, the second transfer signal line 73, and the turn-on signal line 75 via through-holes (illustrated as circles in FIG. 6A) formed in the protective layer 90. A description of the protective layer 90 and the through-holes will be omitted below.

As illustrated in FIG. 6B, the back-surface electrode 91 serving as the terminal Vsub is disposed on the back surface of the substrate 80.

The p-anode layer 81, the light-emitting layer 82, the n-cathode layer 83, the tunnel junction layer 84, the p-anode layer 85, the n-gate layer 86, the p-gate layer 87, and the n-cathode layer 88 are semiconductor layers and are monolithically stacked by epitaxial growth.

To form plural mutually isolated islands (islands 301, 302, 303, . . . described later), the semiconductor layers between the islands are removed by etching (mesa etching). In addition, the p-anode layer 81 may also serve as the substrate 80.

The terms "p-anode layer 81" and "n-cathode layer 83" herein correspond to functions (operations) in the case where these layers constitute the light-emitting diode LED and the lower diode UD. That is, the p-anode layer 81 functions as the anode, and the n-cathode layer 83 functions as the cathode.

The terms "p-anode layer 85", "n-gate layer 86", "p-gate layer 87", and "n-cathode layer 88" correspond to functions (operations) in the case where these layers constitute the setting thyristor S and the transfer thyristor T. That is, the p-anode layer 85 functions as the anode, the n-gate layer 86 and the p-gate layer 87 function as the gates, and the n-cathode layer 88 functions as the cathode.

These layers have different functions when they constitute the coupling diode D and the power supply line resistor Rg, as described later.

As described below, the plural islands include those not including some of the plural layers, which are the p-anode layer 81, the light-emitting layer 82, the n-cathode layer 83, the tunnel junction layer 84, the p-anode layer 85, the n-gate layer 86, the p-gate layer 87, and the n-cathode layer 88. For example, the island 301 does not include part of the tunnel junction layer 84, the p-anode layer 85, the n-gate layer 86, the p-gate layer 87, and the n-cathode layer 88.

A plan layout of the light-emitting chip C will be described next with reference to FIG. 6A.

In the island 301, the light-emitting diode LED1 and the setting thyristor S1 are disposed. In the island 302, the lower diode UD1, the transfer thyristor T1, and the coupling diode D1 are disposed. In the island 303, the power supply line resistor Rg1 is disposed. In an island 304, the start diode SD is disposed. In an island 305, the current-limiting resistor R1 is disposed. In an island 306, the current-limiting resistor R2 is disposed.

Plural islands that are substantially the same as the islands 301, 302, and 303 are formed in parallel in the light-emitting chip C. In these islands, the light-emitting diodes LED2, LED3, LED4, . . . ; the setting thyristors S2, S3, S4, . . . ; the transfer thyristors T2, T3, T4, . . . ; the lower diodes UD2, UD3, UD4, . . . ; the coupling diodes D2, D3, D4, . . . ; and so forth are provided in the same manner as in the islands 301, 302, and 303.

Now, the islands 301 to 306 will be described in detail with reference to FIGS. 6A and 6B.

As illustrated in FIG. 6A, the light-emitting diode LED1 disposed in the island 301 is constituted by the p-anode layer 81, the light-emitting layer 82, and the n-cathode layer 83. The setting thyristor S1 is constituted by the p-anode layer 85, the n-gate layer 86, the p-gate layer 87, and the n-cathode layer 88, which are stacked on the n-cathode layer 83 of the light-emitting diode LED1 with the tunnel junction layer 84 interposed therebetween.

As illustrated in black in FIG. 6B, the p-anode layer 81 of the light-emitting diode LED includes a current constriction layer (a current constriction layer 81$b$ in FIG. 7A described later) that constricts a current. The current constriction layer 81$b$ is provided to constrict a current that flows through the light-emitting diode LED to a central portion of the light-emitting diode LED. Since a circumferential portion of the light-emitting diode LED often has a defect resulting from mesa etching, non-radiative recombination is likely to occur. Thus, the current constriction layer 81$b$ is provided so that the central portion of the light-emitting diode LED serves as a current passing portion (region) α in which a current easily flows and the circumferential portion of the light-emitting diode LED serves as a current blocking portion (region) β in which a current does not easily flow. As illustrated in the light-emitting diode LED1 in FIG. 6A, the portion inside a dash line corresponds to the current passing portion α, and the portion outside the dash line corresponds to the current blocking portion β. Note that the current constriction layer 81$b$ is schematically illustrated in FIGS. 6A and 6B.

Since the current constriction layer 81$b$ reduces electric power consumed by non-radiative recombination, power consumption is reduced, and light extraction efficiency improves. Note that the light extraction efficiency indicates an amount of light that is successfully extracted per certain amount of power consumption.

The current constriction layer 81$b$ will be described later.

In order to suppress a loss of light emitted from the light-emitting diode LED passing through the setting thyristor S, the setting thyristor S includes an opening 20 in a portion overlapping with the central portion of the light-emitting diode LED from which light is emitted (as an example, the central portion of the current passing portion α when viewed from the emission surface side). In the opening 20 in this example, the n-cathode layer 88, the p-gate layer 87, the n-gate layer 86, the p-anode layer 85, and the tunnel junction layer 84 are removed. That is, the opening 20 is surrounded by the setting thyristor S. In addition, the opening 20 is disposed in the path of light from the light-emitting diode LED. Furthermore, the setting thyristor S is stacked on the light-emitting diode LED in a portion that is not shifted from the central portion where light is emitted from the light-emitting diode LED (the central portion of the current passing portion α). Note that the central portion where light is emitted may also be expressed as a portion where the emitted light amount is the largest on the emission surface of the light-emitting diode LED. That is, the setting thyristor S has an opening at a position overlapping with the portion where the emitted light amount is the largest on the emission surface of the light-emitting diode LED.

An n-type ohmic electrode 321 (the n-ohmic electrode 321) disposed on the n-cathode layer 88 (in a region 311) serves as the cathode electrode. In addition, a p-type ohmic electrode 331 (the p-ohmic electrode 331) disposed on the p-gate layer 87 exposed by removing the n-cathode layer 88 serves as an electrode of the gate Gs1 (also referred to as the gate terminal Gs1).

The lower diode UD1 disposed in the island 302 is constituted by the p-anode layer 81, the light-emitting layer 82, and the n-cathode layer 83. The transfer thyristor T1 is constituted by the p-anode layer 85, the n-gate layer 86, the p-gate layer 87, and the n-cathode layer 88, that are stacked on the n-cathode layer 83 of the lower diode UD1 with the tunnel junction layer 84 interposed therebetween. An n-ohmic electrode 323 disposed on the n-cathode layer 88 (in a region 313) serves as the cathode terminal. In addition, a p-ohmic electrode 332 disposed on the p-gate layer 87 exposed by removing the n-cathode layer 88 serves as a terminal of the gate Gt1 (also referred to as the gate terminal Gt1).

Likewise, the coupling diode D1 disposed in the island 302 is constituted by the p-gate layer 87 and the n-cathode layer 88. An n-ohmic electrode 324 disposed on the n-cathode layer 88 (in a region 314) serves as the cathode terminal. In addition, the p-ohmic electrode 332 disposed on the p-gate layer 87 exposed by removing the n-cathode layer 88 serves as the anode terminal. The anode terminal of the coupling diode D1 here is identical with the gate Gt1 (the gate terminal Gt1).

The power supply line resistor Rg1 disposed in the island 303 is constituted by the p-gate layer 87. That is, the power supply line resistor Rg1 is disposed as a resistor by using the p-gate layer 87 between a p-ohmic electrode 333 and a p-ohmic electrode 334. The p-ohmic electrode 333 and the p-ohmic electrode 334 are disposed on the p-gate layer 87 exposed by removing the n-cathode layer 88.

The start diode SD disposed in the island 304 is constituted by the p-gate layer 87 and the n-cathode layer 88. That is, the start diode SD uses, as the cathode terminal, an n-ohmic electrode 325 disposed on the n-cathode layer 88 (in a region 315). In addition, the start diode SD uses, as the anode terminal, a p-ohmic electrode 335 disposed on the p-gate layer 87 exposed by removing the n-cathode layer 88.

The current-limiting resistor R1 disposed in the island 305 and the current-limiting resistor R2 disposed in the island 306 are provided in the same manner as the power supply line resistor Rg1 disposed in the island 303. The p-gate layer 87 located between two p-ohmic electrodes (assigned no reference signs) serves as the resistor.

Connections between the elements will be described with reference to FIG. 6A.

The turn-on signal line 75 has a trunk portion 75$a$ and plural branch portions 75$b$. The trunk portion 75$a$ extends in a direction of the line of the setting thyristors S/the light-emitting diodes LED. The branch portions 75*b* branch off from the trunk portion 75*a*, and one of the branch portions 75*b* is connected to the n-ohmic electrode 321 which is the cathode terminal of the setting thyristor S1 disposed in the island 301. The same applies to the cathode terminals of the other setting thyristors S.

The turn-on signal line 75 is connected to the terminal ϕI located near the setting thyristor S1/the light-emitting diode LED1.

The first transfer signal line 72 is connected to the n-ohmic electrode 323 which is the cathode terminal of the transfer thyristor T1 disposed in the island 302. The first transfer signal line 72 is also connected to the cathode terminals of the odd-numbered transfer thyristors T disposed in islands that are substantially the same as the island 302. The first transfer signal line 72 is connected to the terminal ϕ1 through the current-limiting resistor R1 disposed in the island 305.

On the other hand, the second transfer signal line 73 is connected to the n-ohmic electrodes (assigned no reference sign) which are the cathode terminals of the even-numbered transfer thyristors T disposed in islands assigned no reference sign. The second transfer signal line 73 is connected to the terminal ϕ2 through the current-limiting resistor R2 disposed in the island 306.

The power supply line 71 is connected to the p-ohmic electrode 334 which is one of the terminals of the power supply line resistor Rg1 disposed in the island 303. The power supply line 71 is also connected to one of the terminals of the other power supply line resistors Rg. The power supply line 71 is connected to the terminal Vga.

The p-ohmic electrode 331 (the gate terminal Gs1) of the setting thyristor S1 disposed in the island 301 is connected to the p-ohmic electrode 332 (the gate terminal Gt1) in the island 302 via a connection wire 76.

The p-ohmic electrode 332 (the gate terminal Gt1) is connected to the p-ohmic electrode 333 (the other terminal of the power supply line resistor Rg1) in the island 303 via a connection wire 77.

The n-ohmic electrode 324 (the cathode terminal of the coupling diode D1) disposed in the island 302 is connected to the p-ohmic electrode (assigned no reference sign) which is the gate terminal Gt2 of the adjacent transfer thyristor T2 via a connection wire 79.

Although a description is omitted here, the same applies to the other light-emitting diodes LED, the other setting thyristors S, the other transfer thyristors T, and the other coupling diodes D.

The p-ohmic electrode 332 (the gate terminal Gt1) in the island 302 is connected to the n-ohmic electrode 325 (the cathode terminal of the start diode SD) disposed in the island 304 via a connection wire 78. The p-ohmic electrode 335 (the anode terminal of the start diode SD) is connected to the second transfer signal line 73.

Figure 7B:
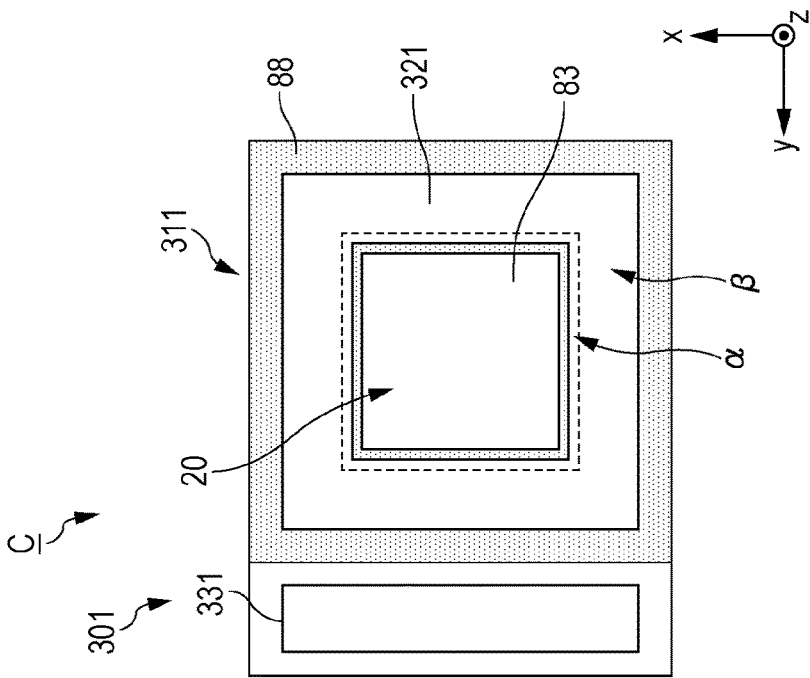
FIGS. 7A and 7B are enlarged views of an island in which a light-emitting diode and a setting thyristor are stacked, specifically.
Figure 7A:
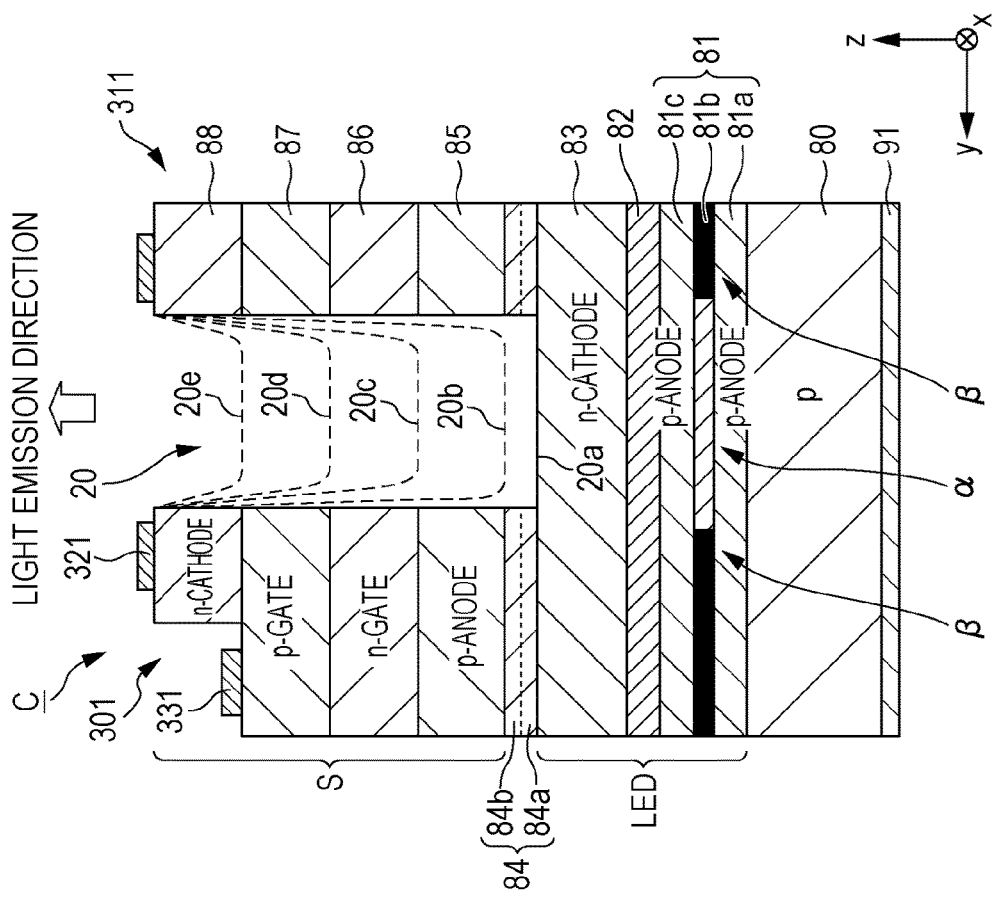

Note that the connections and configurations described above are connections and configurations in the case where the p-type substrate 80 is used. In the case where an n-type substrate is used, the polarity is reversed. In addition, in the case where an i-type substrate is used, a terminal connected to the power supply line 200*a* that supplies the reference potential Vsub is provided on a side of the substrate on which the driving unit 101 and the light-emitting unit 102 are disposed. The connections and configurations in this case is the same as those of the case where the p-type substrate is used or of the case where the n-type substrate is used.
Layered Structure of Driving Thyristor S and Setting Thyristor S FIGS. 7A and 7B are enlarged views of the island 301 in which the light-emitting diode LED and the setting thyristor S are stacked. FIG. 7A is an enlarged cross-sectional view of the island 301, and FIG. 7B is a plan view of the island 301. Note that FIGS. 7A and 7B omit illustration of the protective layer 90 and a region in which the turn-on signal line 75 is disposed in the island 301.

As described above, the setting thyristor S is stacked on the light-emitting diode LED with the tunnel junction layer 84 interposed therebetween. That is, the light-emitting diode LED and the setting thyristor S are connected in series.

As illustrated in FIG. 7A, the light-emitting diode LED is constituted by the p-anode layer 81, the light-emitting layer 82, and the n-cathode layer 83. Note that the light-emitting layer 82 has a quantum well structure in which well layers and barrier layers are alternately stacked. In addition, the light-emitting layer 82 may be an intrinsic (i-type) layer not doped with any impurities. Alternatively, the light-emitting layer 82 may have a structure other than the quantum well structure, for example, a quantum wire structure or a quantum dot structure.

The p-anode layer 81 includes the current constriction layer 81*b*. Specifically, the p-anode layer 81 is constituted by a lower p-anode layer 81*a*, the current constriction layer 81*b*, and an upper p-anode layer 81*c*. That is, the portion of the current constriction layer 81*b* serves as the current blocking portion β, and portions where the current constriction layer 81*b* is not disposed serve as the current passing portion α.

Note that the current constriction layer may be provided in the n-cathode layer 83.

The tunnel junction layer 84 includes an $n^{++}$-layer 84*a* doped with an n-type impurity (dopant) at a high concentration and a $p^{++}$-layer 84*b* doped with a p-type impurity at a high concentration.

The setting thyristor S is constituted by the p-anode layer 85, the n-gate layer 86, the p-gate layer 87, and the n-cathode layer 88. That is, the setting thyristor S has a pnpn four-layer structure.

As described above, in order to suppress a loss of light emitted from the light-emitting diode LED passing therethrough, the setting thyristor S1 includes the opening 20 in a portion overlapping with the central portion of the light-emitting diode LED from which light is emitted (the central portion of the current passing portion α when viewed from the emission surface side). The opening 20 is formed by removing the n-cathode layer 88, the p-gate layer 87, the n-gate layer 86, the p-anode layer 85, and the tunnel junction layer 84, and side surfaces of the opening 20 have a shape (shape 20*a*) that is perpendicular to the substrate 80. That is, the opening 20 reaches a semiconductor layer (the n-cathode layer 83) included in the light-emitting diode LED. Note that the setting thyristor S may be expressed as being stacked on the light-emitting diode LED in a portion away from the central portion of the light-emitting diode LED from which light is emitted (the central portion of the current passing portion α).

When all of the n-cathode layer 88, the p-gate layer 87, the n-gate layer 86, the p-anode layer 85, and the tunnel junction layer 84 are removed in the opening 20, the loss of light emitted from the light-emitting diode LED due to the setting thyristor S and the tunnel junction layer 84 is prevented. However, not all of the n-cathode layer 88, the p-gate layer 87, the n-gate layer 86, the p-anode layer 85, and the tunnel junction layer 84 have to be removed, and side surfaces of the opening 20 may be tilted with respect to the substrate 80. That is, the opening 20 may have any shape that is recessed from the uppermost surface of the n-cathode layer 88, in which the loss of light emitted from the light-emitting diode LED is suppressed compared with a shape that is not recessed in this manner.

For example, the opening 20 having a shape 20*b* is formed by removing the n-cathode layer 88, the p-gate layer 87, the n-gate layer 86, and the p-anode layer 85 but leaving the tunnel junction layer 84 unremoved. The opening 20 having a shape 20*c* is formed by removing the n-cathode layer 88, the p-gate layer 87, and the n-gate layer 86, but leaving the p-anode layer 85 and the tunnel junction layer 84 unremoved. That is, the opening 20 is provided to reach the p-anode layer 85. The opening 20 having a shape 20*d* is formed by removing the n-cathode layer 88 and the p-gate layer 87, but leaving the n-gate layer 86, the p-anode layer 85, and the tunnel junction layer 84 unremoved. That is, the opening 20 is provided to reach the n-gate layer 86. The opening 20 having a shape 20*e* is formed by removing the n-cathode layer 88, but leaving the p-gate layer 87, the n-gate layer 86, the p-anode layer 85, and the tunnel junction layer 84 unremoved. That is, the opening 20 is provided to reach the p-gate layer 87. In addition, in the shapes 20*b* to 20*e*, the opening 20 has a smaller width in a lower portion than in an upper portion.

Note that part of the n-cathode layer 88, the p-gate layer 87, the n-gate layer 86, the p-anode layer 85, or the tunnel junction layer 84 to be removed may remain in the thickness direction in the shapes 20*b* to 20*e* instead of being completely removed. That is, the bottom of the opening 20 may be present in the middle of a layer. Accordingly, the term "reach" includes a state in which the bottom of the opening 20 reaches a surface of a layer and a state in which the bottom of the opening 20 is present in the middle of the layer. In a case of the shape 20*a* in which the n-cathode layer 88, the p-gate layer 87, the n-gate layer 86, the p-anode layer 85, and the tunnel junction layer 84 are removed, part of the n-cathode layer 83 in the thickness direction may be removed.

In addition, the side surfaces of the opening 20 may be perpendicular to the substrate 80 as illustrated in the shape 20*a*, or the opening 20 may become narrower or wider in a lower portion than in an upper portion as illustrated in the shapes 20*b* to 20*e*.

Such openings having the shapes 20*b* to 20*e* are herein also called the opening 20 in this example.

In an opening forming step (FIG. 11B described later) described later, if the opening 20 is made to reach the n-cathode layer 83 of the light-emitting diode LED, the n-cathode layer 83 might possibly be etched. However, if the opening 20 has any of the shapes 20*b* to 20*e*, the n-cathode layer 83 of the light-emitting diode LED might not possibly be etched, preventing damages of the characteristics of the light-emitting diode LED. That is, etching may be performed at less high precision, increasing a manufacturer margin.

In FIG. 7B, the opening 20 having a square plan shape is disposed in the central portion of the region 311 constituted by the n-cathode layer 88. In addition, the setting thyristor S is disposed to surround the opening 20. Note that the plan shape of the opening 20 does not have to be a square, and may be a rectangle, a polygon, a circle, or an oval.

Note that the element resistance is reduced by disposing the setting thyristor S to surround the opening 20 compared with a case where the setting thyristor S does not surround the opening 20. In the configuration illustrated in FIGS. 7A and 7B, when viewed in the light emission direction, the width (area) of the current passing portion α is larger than the width (area) of the opening 20. In such a configuration, a current is more likely to flow through the current passing portion α than in a configuration in which the width of the current passing portion α is smaller, thereby reducing the element resistance. Thus, such a configuration may be used when the element resistance is desired to be reduced, for example. On the other hand, in a configuration in which the width of the current passing portion α is smaller than the width of the opening 20, light is likely to focus in the central portion, and light is unlikely to be absorbed in the setting thyristor S around the opening 20. Accordingly, this configuration may be used when a decrease in the light amount is desired to be suppressed, for example.

Tunnel Junction Layer 84

Figure 8A:
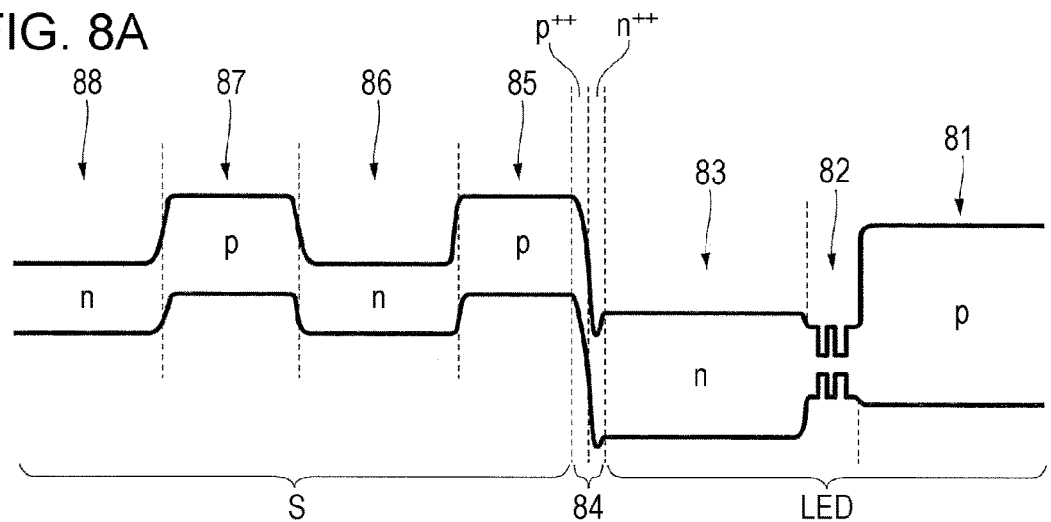
FIGS. 8A to 8C illustrate a stack structure of the light-emitting diode and the setting thyristor in more detail, specifically.
Figure 8B:
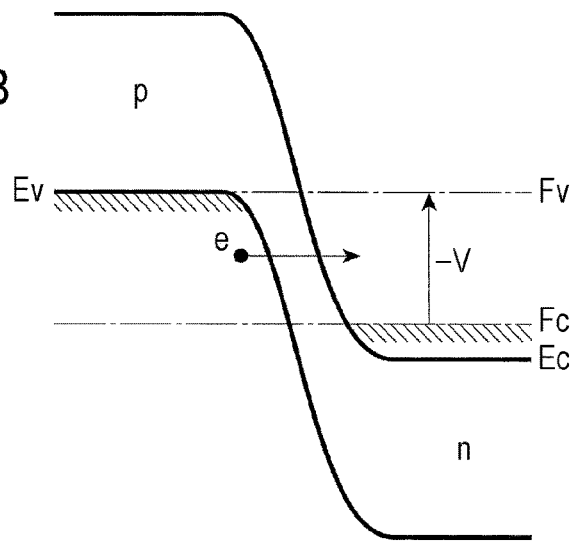
Figure 8C:
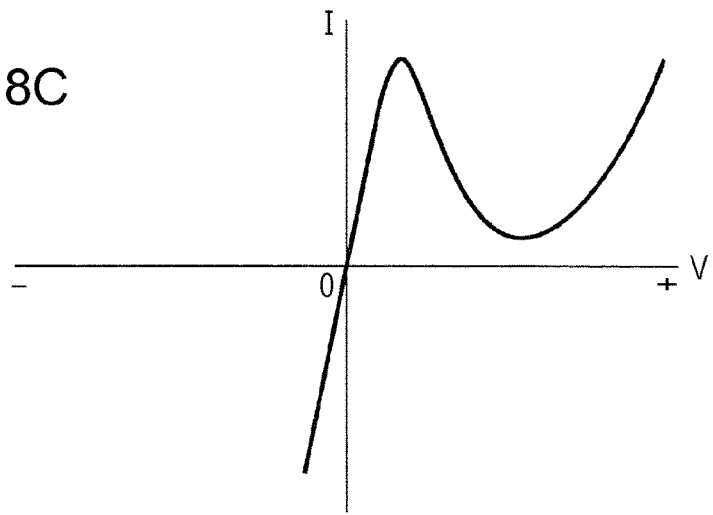

FIGS. 8A to 8C illustrate the stack structure of the light-emitting diode LED and the setting thyristor S in more detail. Specifically, FIG. 8A is a schematic energy band diagram in the stack structure of the light-emitting diode LED and the setting thyristor S, FIG. 8B is an energy band diagram in a reverse-bias state of the tunnel junction layer 84, and FIG. 8C illustrates current-voltage characteristics of the tunnel junction layer 84.

As illustrated in the energy band diagram in FIG. 8A, if a voltage is applied between the n-ohmic electrode 321 and the back-surface electrode 91 in FIG. 7A such that the light-emitting diode LED and the setting thyristor S are forward-biased, the $n^{++}$-layer 84*a* and the $p^{++}$-layer 84*b* of the tunnel junction layer 84 are reverse-biased.

The tunnel junction layer 84 is a junction of the $n^{++}$-layer 84*a* doped with an n-type impurity at a high concentration and the $p^{++}$-layer 84*b* doped with a p-type impurity at a high concentration. Thus, the width of a depletion region is small, and when a reverse bias is applied, electrons tunnel from the conduction band of the $n^{++}$-layer 84*a* to the valence band of the $p^{++}$-layer 84*b*. At this time, negative resistance characteristics are exhibited.

On the other hand, as illustrated in FIG. 8B, when the tunnel junction layer 84 (tunnel junction) is reverse-biased (−V), a potential Ev on the valence band of the $p^{++}$-layer 84*b* becomes higher than a potential Ec on the conduction band of the $n^{++}$-layer 84*a*. Then, electrons tunnel from valence band of the $p^{++}$-layer 84*b* to the conduction band of the $n^{++}$-layer 84*a*. Subsequently, as the reverse bias voltage (−V) is increased, electrons are more likely to tunnel. That is, as illustrated in FIG. 8C, a current is likely to flow through the tunnel junction layer 84 (tunnel junction) in a reverse-bias state.

Thus, as illustrated in FIG. 8A, in response to turn-on of the setting thyristor S, even if the tunnel junction layer 84 is in a reverse-bias state, a current flows between the light-emitting diode LED and the setting thyristor S. Consequently, the light-emitting diode LED emits light (turns on).

As described later, when the connected transfer thyristor T turns on to enter the on-state, the setting thyristor S is ready to enter the on-state. Then, as described later, when the turn-on signal ϕI is set to "L", the setting thyristor S turns on to enter the on-state, and the light-emitting diode LED turns on (turn-on is set). Accordingly, the setting thyristor S is herein called "setting thyristor".

The relation between the lower diode UD and the transfer thyristor T is substantially the same as the relation between the light-emitting diode LED and the setting thyristor S. However, light emitted from the lower diode UD is not used. Accordingly, in the case where the light from the lower diode UD leaks, the size of the lower diode UD may be reduced, or the lower diode UD may be shielded by using a material of a wire or the like.

Thyristor

Next, a basic operation of a thyristor (the transfer thyristor T or the setting thyristor S) will be described. As described before, the thyristor is a semiconductor element having three terminals, i.e., the anode terminal (anode), the cathode terminal (cathode), and the gate terminal (gate), and is constituted by stacking p-type semiconductor layers (the p-anode layer 85 and the p-gate layer 87) and n-type semiconductor layers (the n-gate layer 86 and the n-cathode layer 88) formed of, for example, GaAs, GaAlAs, AlAs, or the like on the substrate 80. That is, a thyristor has a pnpn structure. A description is given here on the assumption that a forward potential (diffusion potential) Vd of a pn junction formed by a p-type semiconductor layer and an n-type semiconductor layer is equal to 1.5 V, for example.

The following description is given on the assumption that the reference potential Vsub supplied to the back-surface electrode 91 (see FIGS. 5 to 6B) serving as the terminal Vsub is a high-level potential (hereinafter, referred to as "H") of 0 V and the power supply potential Vga supplied to the terminal Vga is a low-level potential (hereinafter, referred to as "L") of −5 V, for example. Accordingly, the expressions such as "H" (0 V) and "L" (−5 V) will be used.

First, an operation of the thyristor alone will be described. In this example, the anode of the thyristor is assumed to have a potential of 0 V.

When a potential lower than a threshold voltage (a negative potential having a greater absolute value) is applied to the cathode of a thyristor that is in an off-state in which no current flows between the anode and the cathode, the thyristor enters an on-state (turns on). Note that the threshold voltage of the thyristor is equal to a value obtained by subtracting the forward potential Vd (1.5 V) of the pn junction from the gate potential.

When the thyristor enters the on-state, the gate of the thyristor has a potential close to the potential of the anode terminal. Since the potential of the anode is 0 V in this case, the potential of the gate becomes equal to 0 V. In addition, the cathode of the on-state thyristor has a potential close to a potential obtained by subtracting the forward potential Vd (1.5 V) of the pn junction from the potential of the anode. Since the potential of the anode is 0 V in this case, the cathode of the on-state thyristor has a potential close to −1.5 V (a negative potential having an absolute value greater than 1.5 V). Note that the potential of the cathode is set in accordance with a relationship with a power supply that supplies a current to the on-state thyristor.

When the cathode of the on-state thyristor has a potential (a negative potential having a smaller absolute value, 0 V, or a positive potential) higher than a potential necessary to maintain the thyristor in the on-state (a potential close to −1.5 V), the thyristor enters the off-state (turns off).

On the other hand, when a potential (a negative potential having a greater absolute value) lower than the potential necessary to maintain the thyristor in the on-state is continuously applied to the cathode of the on-state thyristor and a current that successfully maintains the on-state (maintaining current) is supplied to the thyristor, the thyristor is maintained in the on-state.

Next, an operation in a state in which the light-emitting diode LED and the setting thyristor S are stacked will be described.

The light-emitting diode LED and the setting thyristor S are stacked and are connected in series. Thus, the potential of the turn-on signal ϕI is divided into a voltage for the light-emitting diode LED and a voltage for the setting thyristor S. The description is given here on the assumption that the voltage applied to the light-emitting diode LED is equal to −1.7 V. In addition, the description is given on the assumption that −3.3 V is applied to the setting thyristor S when the setting thyristor S is in the off-state.

As described above, when the absolute value of the threshold voltage of the off-state setting thyristor S is smaller than −3.3 V, the setting thyristor S turns on. In response to this, a current flows to the light-emitting diode LED and the setting thyristor S that are connected in series, and the light-emitting diode LED emits light. On the other hand, when the absolute value of the threshold voltage of the setting thyristor S is smaller than −3.3 V, the setting thyristor S does not turn on and is maintained in the off-state. Thus, the light-emitting diode LED is also maintained in the light-off state (off-state).

Note that when the setting thyristor S turns on, the absolute value of a voltage to be applied to the light-emitting diode LED and the setting thyristor S that are connected in series is decreased by the current-limiting resistor RI (see FIG. 5). However, as long as the voltage to be applied to the setting thyristor S is a voltage that maintains the setting thyristor S in the on-state, the setting thyristor S is maintained in the on-state. Thus, the light-emitting diode LED continues to emit light.

Note that the voltages described above are merely examples and are changed in accordance with the emission wavelength or light amount of the light-emitting diode LED. In such a case, the potential ("L") of the turn-on signal ϕI may be adjusted.

Since the thyristor is composed of a semiconductor such as GaAs, the thyristor in the on-state might possibly emit light between the n-gate layer 86 and the p-gate layer 87. The amount of light emitted from the thyristor is determined on the basis of the area of the cathode and a current flowing between the cathode and the anode. Accordingly, in the case where the light emitted from the thyristor is not used, for example, the area of the cathode may be reduced, or the thyristor may be shielded by using a material for forming the electrode (the n-ohmic electrode 321 of the setting thyristor S1 or the n-ohmic electrode 323 of the transfer thyristor T1), a wire, or the like so as to suppress unnecessary light.

Operation of Light-Emitting Device 65

An operation of the light-emitting device 65 will be described next.

As described before, the light-emitting device 65 includes the light-emitting chips C1 to C40 (see FIGS. 3 to 4B).

Since the light-emitting chips C1 to C40 are driven in parallel, a description of the operation of the light-emitting chip C1 may suffice.

Timing Chart

Figure 9:
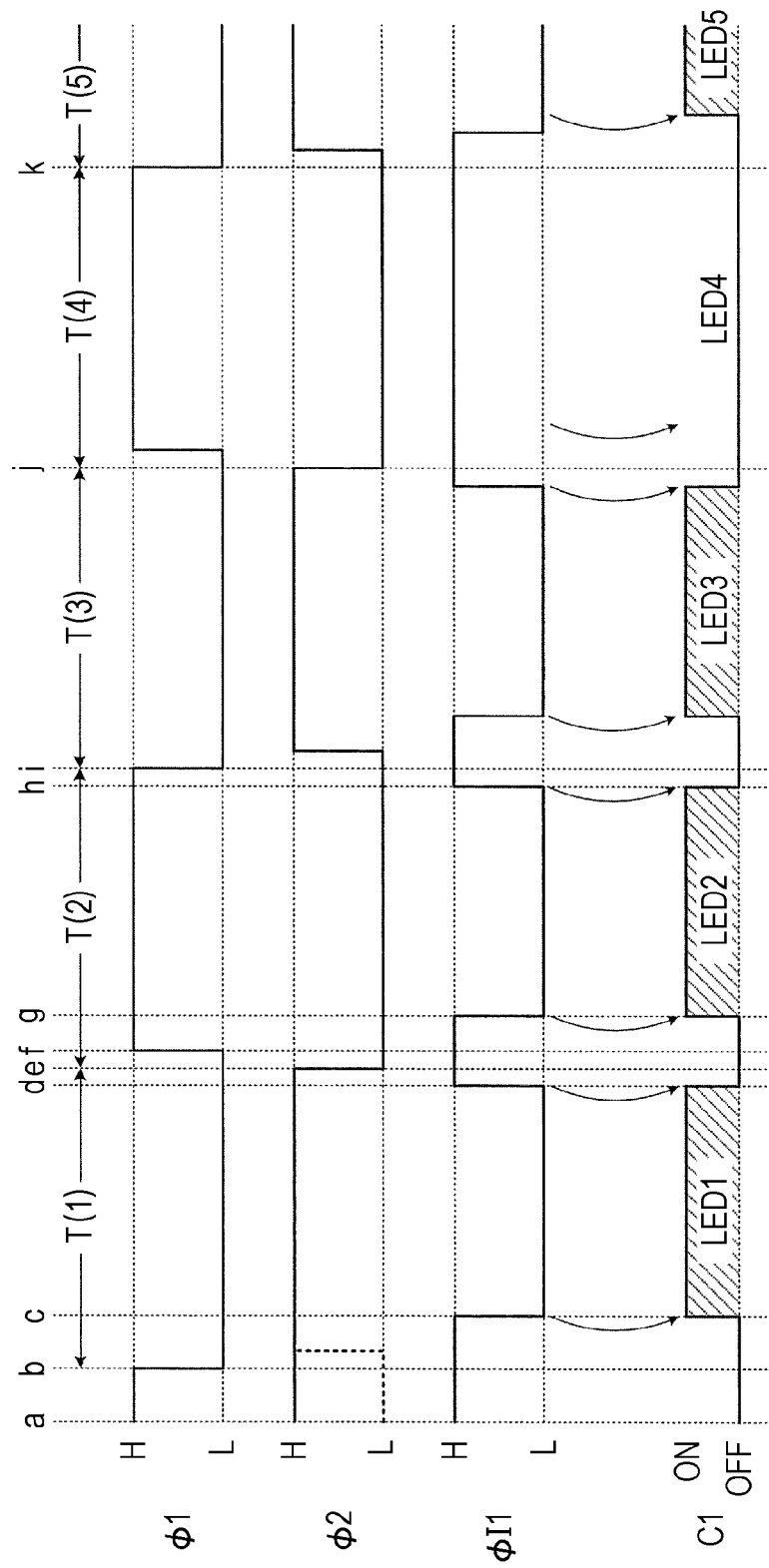
FIG. 9 is a timing chart illustrating an operation of the light-emitting device and an operation of the light-emitting chip.

FIG. 9 is a timing chart illustrating the operation of the light-emitting device 65 and the operation of the light-emitting chip C.

FIG. 9 is a timing chart of a period in which on (oscillation) and off of five light-emitting diodes LED (i.e., the light-emitting diodes LED1 to LED5) of the light-emitting chip C1 are controlled (hereinafter, referred to as turn-on control). Note that the light-emitting diodes LED1, LED2, LED3, and LED5 of the light-emitting chip C1 are turned on and the light-emitting diode LED4 is maintained in the off-state (off) in FIG. 9.

In FIG. 9, time passes in the alphabetical order from time a to time k. On and off of the light-emitting diodes LED1, LED2, LED3, and LED4 are controlled (turn-on control is performed) in periods T(1), T(2), T(3), and T(4), respectively. Turn-on control is performed on the light-emitting diodes LED assigned the numbers of 5 and greater in the similar manner.

It is assumed here that the periods T(1), T(2), T(3), . . . have equal durations and are referred to as periods T when they are not distinguished from one another.

Each of the first transfer signal ϕ1 that is sent to the terminal ϕ1 (see FIGS. 5 to 6B) and the second transfer signal ϕ2 that is sent to the terminal ϕ2 (see FIGS. 5 to 6B) is a signal having two potentials of "H" (0 V) and "L" (−5 V). Each of the first transfer signal ϕ1 and the second transfer signal ϕ2 has a waveform that iterates in a unit of two consecutive periods T (for example, the periods T(1) and T(2)).

Hereinafter, the expressions "H" (0 V) and "L" (−5 V) are sometimes simply referred to as "H" and "L", respectively.

The first transfer signal ϕ1 changes from "H" (0 V) to "L" (−5 V) at the start time b of the period T(1) and changes from "L" to "H" at the time f. The first transfer signal ϕ1 then changes from "H" to "L" at the end time i of the period T(2).

The second transfer signal ϕ2 is at "H" (0 V) at the start time b of the period T(1) and changes from "H" (0 V) to "L" (−5 V) at the time e. Then, the second transfer signal ϕ2 changes from "L" to "H" slightly after the end time i of the period T(2).

Comparison of the first transfer signal ϕ1 and the second transfer signal ϕ2 indicates that the second transfer signal ϕ2 is a signal obtained by shifting the first transfer signal ϕ1 behind by the period T on the time axis. The waveform of the second transfer signal ϕ2 that is indicated by a dotted line in the period T(1) and the waveform in the period T(2) iterate in the period T(3) and subsequent periods. The waveform of the second transfer signal ϕ2 in the period T(1) is different from that in the period T(3) and thereafter because the period T(1) is a period in which the light-emitting device 65 starts the operation.

A set of transfer signals (i.e., the first transfer signal ϕ1 and the second transfer signal ϕ2) specifies the light-emitting diode LED assigned the same number as the number of the on-state transfer thyristor T to be a target of on (oscillation)/off control (turn-on control) by propagating the on-state of the transfer thyristors T in the numbered order as described later.

The turn-on signal ϕI1 that is sent to the terminal ϕ1 of the light-emitting chip C1 will be described next. Note that turn-on signals ϕI2 to ϕI40 are sent to the other light-emitting chips C2 to C40, respectively. The turn-on signal ϕI1 is a signal having two potentials of "H" (0 V) and "L" (−5 V).

The turn-on signal ϕI1 in the period T(1) in which turn-on control is performed on the light-emitting diode LED1 of the light-emitting chip C1 will be described in this example. The turn-on signal ϕI1 is at "H" (0 V) at the start time b of the period T(1) and changes from "H" (0 V) to "L" (−5 V) at the time c. Then, the turn-on signal ϕI1 changes from "L" to "H" at the time d and maintains "H" at the time e.

The operation of the light-emitting device 65 and the operation of the light-emitting chip C1 will be described in accordance with the timing chart illustrated in FIG. 9 with reference to FIGS. 4A to 5. Note that the periods T(l) and T(2) in which turn-on control is performed on the light-emitting diodes LED1 and LED2 will be described below.

(1) Time a

Light-Emitting Device 65

At the time a, the reference potential supplying unit 160 of the signal generation circuit 110 of the light-emitting device 65 sets the reference potential Vsub to "H" (0 V). The power supply potential supplying unit 170 sets the power supply potential Vga to "L" (−5 V). Then, the power supply line 200a on the circuit board 62 of the light-emitting device 65 has the reference potential Vsub ("H" (0 V)), and each of the terminals Vsub of the light-emitting chips C1 to C40 has "H". Likewise, the power supply line 200b has the power supply potential Vga ("L" (−5 V)), and each of the terminals Vga of the light-emitting chips C1 to C40 has "L" (see FIG. 4B). As a result, each of the power supply lines 71 of the light-emitting chips C1 to C40 has "L" (see FIG. 5).

Then, the transfer signal generation unit 120 of the signal generation circuit 110 sets the first transfer signal ϕ1 and the second transfer signal ϕ2 to "H" (0 V). Then, the first transfer signal line 201 and the second transfer signal line 202 have "H" (see FIG. 4B). Consequently, the terminals ϕ1 and ϕ2 of each of the light-emitting chips C1 to C40 have "H". The first transfer signal line 72 that is connected to the terminal ϕ1 through the current-limiting resistor R1 has "H", and the second transfer signal line 73 that is connected to the terminal ϕ1 through the current-limiting resistor R2 also has "H" (see FIG. 5).

Further, the turn-on signal generation unit 140 of the signal generation circuit 110 sets the turn-on signals ϕI1 to ϕI40 to "H" (0 V). Then, the turn-on signal lines 204-1 to 204-40 have "H" (see FIG. 4B). Consequently, the terminal ϕI of each of the light-emitting chips C1 to C40 has "H" through the current-limiting resistor RI, and the turn-on signal line 75 connected to the terminal ϕI also has "H" (0 V) (see FIG. 5).

Light-Emitting Chip C1

The anode (the p-anode layer 85) of the setting thyristor S is connected to the cathode (the n-cathode layer 83) of the light-emitting diode LED with the tunnel junction layer 84 interposed therebetween, and the anode (the p-anode layer 81) of the light-emitting diode LED is connected to the terminal Vsub that is set to "H". The anode (the p-anode layer 85) of the transfer thyristor T is connected to the cathode (the n-cathode layer 83) of the lower diode UD with the tunnel junction layer 84 interposed therebetween, and the anode (the p-anode layer 81) of the lower diode UD is connected to the terminal Vsub that is set to "H".

The cathodes of the odd-numbered transfer thyristors T1, T3, T5, . . . are connected to the first transfer signal line 72 and are set to "H" (0 V). The cathodes of the even-numbered transfer thyristors T2, T4, T6, . . . are connected to the second transfer signal line 73 and are set to "H". Since both the anode and the cathode of each of the transfer thyristors T have "H", the transfer thyristor T is in the off-state. In addition, since both the anode and the cathode of each of the lower diodes UD have "H", the lower diode UD is in the off-state.

The cathode terminal of the setting thyristor S is connected to the turn-on signal line 75 having "H" (0 V). Thus, both the anode and the cathode of the setting thyristor S have "H", and the setting thyristor S is in the off-state. In addition, both the anode and the cathode of the light-emitting diode LED have "H", and the light-emitting diode LED is in the off-state.

The gate Gt1 is connected to the cathode of the start diode SD as described before. The gate Gt1 is connected to the power supply line 71 having the power supply potential Vga ("L" (−5 V)) through the power supply line resistor Rg1. The anode terminal of the start diode SD is connected to the second transfer signal line 73 and is connected to the terminal ϕ2 having "H" (0 V) through the current-limiting resistor R2. Thus, the start diode SD is forward-biased, and the cathode (gate Gt1) of the start diode SD has a potential (−1.5 V) obtained by subtracting the forward potential Vd (1.5 V) of the pn junction from the potential ("H" (0 V)) of the anode of the start diode SD. If the potential of the gate Gt1 becomes equal to −1.5 V, the coupling diode D1 is forward-biased since the anode (gate Gt1) thereof has −1.5 V and the cathode thereof is connected to the power supply line 71 ("L" (−5 V)) through the power supply line resistor Rg2. Thus, the potential of the gate Gt2 becomes equal to −3 V obtained by subtracting the forward potential Vd (1.5 V) of the pn junction from the potential (−1.5 V) of the gate Gt1. In addition, the coupling diode D2 is forward-biased since the anode (gate Gt2) thereof has −3 V and the cathode thereof is connected to the power supply line 71 ("L" (−5 V)) through the power supply line resistor Rg2. Thus, the potential of the gate Gt3 becomes equal to −4.5 V obtained by subtracting the forward potential Vd (1.5 V) of the pn junction from the potential (−3 V) of the gate Gt2. However, there is no influence of the anode of the start diode SD having "H" (0 V) on the gates Gt assigned the numbers of 4 and greater, and these gates Gt have "L" (−5 V) which is the potential of the power supply line 71.

Since the gates Gt serve as the gates Gs, the gates Gs have a potential equal to the potential of the gates Gt. Thus, the threshold voltages of the transfer thyristors T and the setting thyristors S are equal to a value obtained by subtracting the forward potential Vd (1.5 V) of the pn junction from the potential of the gates Gt and Gs. That is, the threshold voltages of the transfer thyristor T1 and the setting thyristor S1 are equal to −3 V, the threshold voltages of the transfer thyristor T2 and the setting thyristor S2 are equal to −4.5 V, the threshold voltages of the transfer thyristor T3 and the setting thyristor S3 are equal to −6 V, and the threshold voltages of the transfer thyristors T and the setting thyristors S assigned the number of 4 or greater are equal to −6.5 V.

(2) Time b

At the time b illustrated in FIG. 9, the first transfer signal φ1 changes from "H" (0 V) to "L" (−5 V). In response to this, the light-emitting device 65 starts the operation.

Upon the first transfer signal φ1 changing from "H" to "L", the potential of the first transfer signal line 72 changes from "H" (0 V) to "L" (−5 V) through the terminal φ1 and the current-limiting resistor R1. Then, since the voltage applied to the transfer thyristor T1 is −3.3 V, the transfer thyristor T1 whose threshold voltage is equal to −3 V turns on. At this time, a current flows through the lower diode UD1, and the lower diode UD1 enters the on-state from the off-state. In response to turn-on of the transfer thyristor T1, the potential of the first transfer signal line 72 becomes equal to a potential close to −3.2 V (a negative potential having an absolute value greater than 3.2 V) obtained by subtracting the forward potential Vd (1.5 V) of the pn junction from the potential of the anode of the transfer thyristor T1 (−1.7 V, which is the potential applied to the lower diode UD1).

Note that the threshold voltage of the transfer thyristor T3 is −6 V, and the threshold voltage of the odd-numbered transfer thyristors T assigned the number of 5 or greater is −6.5 V. The voltage applied to the transfer thyristor T3 and the odd-numbered transfer thyristors T assigned the number of 5 or greater is equal to −1.5 V, which is obtained by adding the voltage of 1.7 V applied to the light-emitting diode LED to −3.2 V. Thus, the transfer thyristor T3 and the odd-numbered transfer thyristors T assigned the number of 5 or greater do not turn on.

On the other hand, the even-numbered transfer thyristors T do not turn on because the second transfer signal φ2 has "H" (0 V) and the second transfer signal line 73 has "H" (0 V).

In response to turn-on of the transfer thyristor T1, the potential of the gate Gt1/Gs1 becomes equal to "H" (0 V) that is the potential of the anode of the transfer thyristor T1. In addition, the potential of the gate Gt2 (gate Gs2) becomes equal to −1.5 V, the potential of the gate Gt3 (gate Gs3) becomes equal to −3 V, the potential of the gate Gt4 (gate Gs4) becomes equal to −4.5 V, and the potential of the gate Gt (gate Gs) assigned the number of 5 or greater becomes equal to "L".

Consequently, the threshold voltage of the setting thyristor S1 becomes equal to −1.5 V, the threshold voltages of the transfer thyristor T2 and the setting thyristor S2 become equal to −3 V, the threshold voltages of the transfer thyristor T3 and the setting thyristor S3 become equal to −4.5 V, the threshold voltages of the transfer thyristor T4 and the setting thyristor S4 become equal to −6 V, and the threshold voltages of the transfer thyristor T and the setting thyristor S assigned the number of 5 or greater become equal to −6.5 V.

However, since the first transfer signal line 72 has −1.5 V due to the on-state transfer thyristor T1, the odd-numbered transfer thyristors T that are in the off-state do not turn on. Since the second transfer signal line 73 has "H" (0 V), the even-numbered transfer thyristors T do not turn on. In addition, the turn-on signal line 75 has "H" (0 V), none of the light-emitting diodes LED turn on.

Immediately after the time b (indicating time at which a steady state is achieved after a change in the thyristor and the like has occurred in response to a change in the potential of the signal at the time b. The same applies to the other cases), the transfer thyristor T1 and the lower diode UD1 are in the on-state and the other transfer thyristors T, the lower diodes UD, the setting thyristors S, and the light-emitting diodes LED are in the off-state.

(3) Time c

At the time c, the turn-on signal φI1 changes from "H" (0 V) to "L" (−5 V).

Upon the turn-on signal φI1 changing from "H" to "L", the turn-on signal line 75 changes from "H" (0 V) to "L" (−5 V) through the current-limiting resistor RI and the terminal φI. Then, −3.3 V obtained by adding the voltage of 1.7 V applied to the light-emitting diode LED is applied to the setting thyristor S1, and the setting thyristor S1 having a threshold voltage of −1.5 V turns on and the light-emitting diode LED1 turns on (emits light). Consequently, the potential of the turn-on signal line 75 becomes equal to a potential close to −3.2 V. Although the threshold voltage of the setting thyristor S2 is equal to −3 V, the voltage applied to the setting thyristor S2 is equal to −1.5 V, which is obtained by adding the voltage of 1.7 V applied to the light-emitting diode LED to −3.2 V. Thus, the setting thyristor S2 does not turn on.

Immediately after the time c, the transfer thyristor T1, the lower diode UD1, and the setting thyristor S1 are in the on-state, and the light-emitting diode LED1 is on (is emitting light).

(4) Time d

At the time d, the turn-on signal φI1 changes from "L" (−5 V) to "H" (0 V).

Upon the turn-on signal φI1 changing from "L" to "H", the potential of the turn-on signal line 75 changes from −3.2 V to "H" through the current-limiting resistor RI and the terminal φI. Since both the cathode of the setting thyristor S1 and the anode of the light-emitting diode LED1 have "H", the setting thyristor S1 turns off, and the light-emitting diode LED1 turns off (off). A period for which the light-emitting diode LED1 is on is a period for which the turn-on signal φI1 is at "L" from the time c at which the turn-on signal φI1 changes from "H" to "L" to the time d at which the turn-on signal φI1 changes from "L" to "H".

Immediately after the time d, the transfer thyristor T1 is in the on-state.

(e) Time e

At the time e, the second transfer signal φ2 changes from "H" (0 V) to "L" (−5 V). At the time e, the period T(1) in which turn-on control is performed on the light-emitting diode LED1 ends, and the period T(2) in which turn-on control is performed on the light-emitting diode LED2 starts.

Upon the second transfer signal φ2 changing from "H" to "L", the potential of the second transfer signal line 73 changes from "H" to "L" through the terminal φ2. As described before, since the threshold voltage of the transfer thyristor T2 is equal to −3 V, the transfer thyristor T2 turns on. At this time, a current also flows through the lower diode UD2, and the lower diode UD2 enters the on-state from the off-state.

Consequently, the potential of the gate terminal Gt2 (gate terminal Gs2) becomes equal to "H" (0 V), the potential of the gate Gt3 (gate Gs3) becomes equal to −1.5 V, the potential of the gate Gt4 (gate Gs4) becomes equal to −3 V, and the potential of the gate Gt5 (Gate Gs5) becomes equal to −4.5 V. In addition, the potential of the gate Gt (gate Gs) assigned the number of 6 or greater becomes equal to −5 V.

Immediately after the time e, the transfer thyristors T1 and T2 and the lower diodes UD1 and UD2 are in the on-state.

(6) Time f

At the time f, the first transfer signal φ1 changes from "L" (−5 V) to "H" (0 V).

Upon the first transfer signal φ1 changing from "L" to "H", the potential of the first transfer signal line 72 changes from "L" to "H" through the terminal φ1. Then, both the anode and the cathode of the on-state transfer thyristor T1 have "H", and the transfer thyristor T1 turns off. At this time, both the anode and the cathode of the lower diode UD1 have "H", and the lower diode UD1 enters the off-state from the on-state.

Then, the potential of the gate Gt1 (gate Gs1) changes toward the power supply voltage Vga ("L" (−5 V)) of the power supply line 71 through the power supply line resistor Rg1. Consequently, the coupling diode D1 enters a state in which a potential is applied so that no current flows therein (a reverse-biased state). Thus, there is no longer an influence of the gate Gt2 (gate Gs2) having "H" (0 V) on the gate Gt1 (gate Gs1). That is, the transfer thyristor T having the gate Gt connected through the reverse-biased coupling diode D has the threshold of −6.5 V and no longer turns on with the first transfer signal φ1 or the second transfer signal φ2 having "L" (−5 V).

Immediately after the time f, the transfer thyristor T2 and the lower diode UD2 are in the on-state.

(7) Other Times

Upon the turn-on signal φI1 changing from "H" (0 V) to "L" (−5 V) at the time g, the setting thyristor S2 turns on, and the light-emitting diode LED2 turns on (emits light) just like the setting thyristor S1 and the light-emitting diode LED1 at the time c.

Then, upon the turn-on signal φI1 changing from "L" (−5 V) to "H" (0 V) at the time h, the setting thyristor S2 turns off and the light-emitting diode LED2 turns off just like the setting thyristor S1 and the light-emitting diode LED1 at the time d.

Further, upon the first transfer signal φ1 changing from "H" (0 V) to "L" (−5 V) at the time i, the transfer thyristor T3 having a threshold voltage of −3 V turns on just like the transfer thyristor T1 at the time b or the transfer thyristor T2 at the time e. At the time i, the period T(2) in which turn-on control is performed on the light-emitting diode LED2 ends, and the period T(3) in which turn-on control is performed on the light-emitting diode LED3 starts.

The above-described operation is repeated thereafter.

Note that if the light-emitting diode LED is maintained off (turned off) instead of turning on, the turn-on signal φ1 is maintained at "H" (0 V) just like the turn-on signal φI1 from the time j to the time k in the period T(4) in which turn-on control is performed on the light-emitting diode LED4 in FIG. 9. With this configuration, even if the threshold voltage of the setting thyristor S4 is equal to −1.5 V, the setting thyristor S4 does not turn on, and the light-emitting diode LED4 is maintained off (turned off).

As described above, the gate terminals Gt of the transfer thyristors T are connected to each other by the corresponding coupling diodes D. Thus, when the potential of the gate Gt changes, the potential of the gate Gt that is connected to the potential-changed gate Gt through the forward-biased coupling diode D also changes. Then, the threshold voltage of the transfer thyristor T having the potential-changed gate also changes. The transfer thyristor T turns on at a timing at which the first transfer signal φ1 or the second transfer signal φ2 changes from "H" (0 V) to "L" (−5 V) if the threshold voltage thereof is higher than −3.3 V (a negative value having a smaller absolute value).

Then, since the setting thyristor S whose gate Gs is connected to the gate Gt of the on-state transfer thyristor T has a threshold voltage of −1.5 V, the setting thyristor S turns on when the turn-on signal φ1 changes from "H" (0 V) to "L" (−5 V), and the light-emitting diode LED that is connected in series with the setting thyristor S turns on (emits light).

That is, the transfer thyristor T enters the on-state to specify the light-emitting diode LED that is the target of turn-on control, and the turn-on signal φ1 at "L" (−5 V) turns on the setting thyristor S connected in series with the light-emitting diode LED that is the target of turn-on control and also turns on the light-emitting diode LED.

Note that the turn-on signal φ1 at "H" (0 V) maintains the setting thyristor S in the off-state and maintains the light-emitting diode LED off. That is, the turn-on signal φ1 sets on/off of the light-emitting diodes LED.

On/off of the light-emitting diodes LED is controlled by setting the turn-on signal φI in accordance with image data in this way.

Method for Manufacturing Light-Emitting Chip C

A method for manufacturing the light-emitting chip C will be described.

Figure 10A:
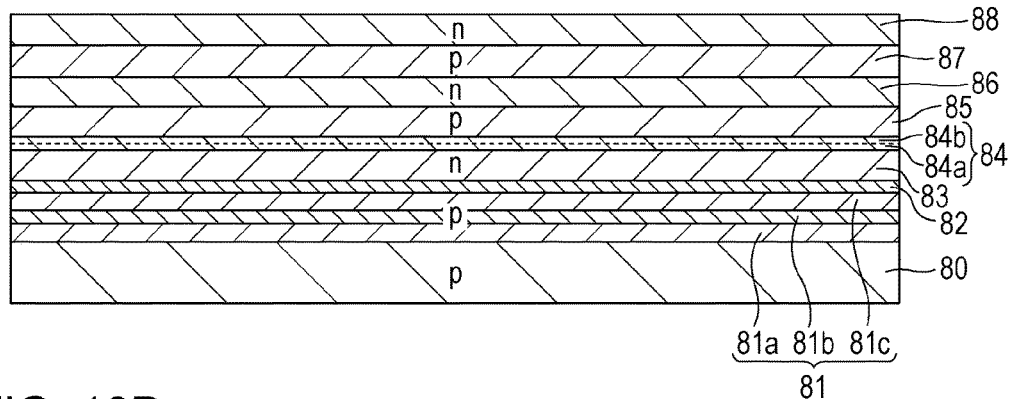
FIGS. 10A to 10C illustrate a method for manufacturing the light-emitting chip, specifically.
Figure 10B:
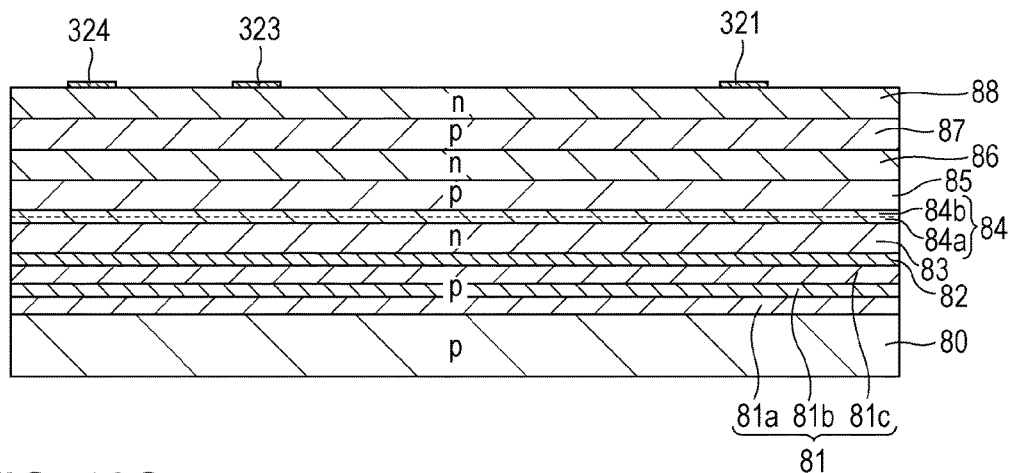
Figure 10C:
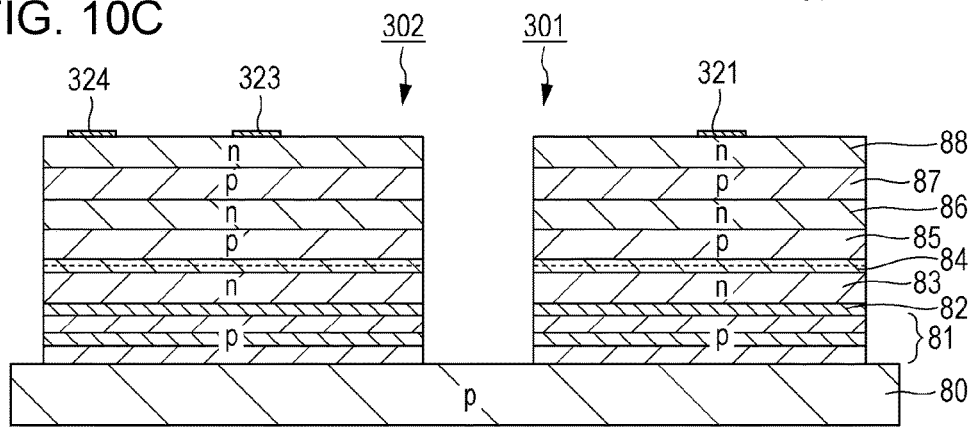
Figure 11A:
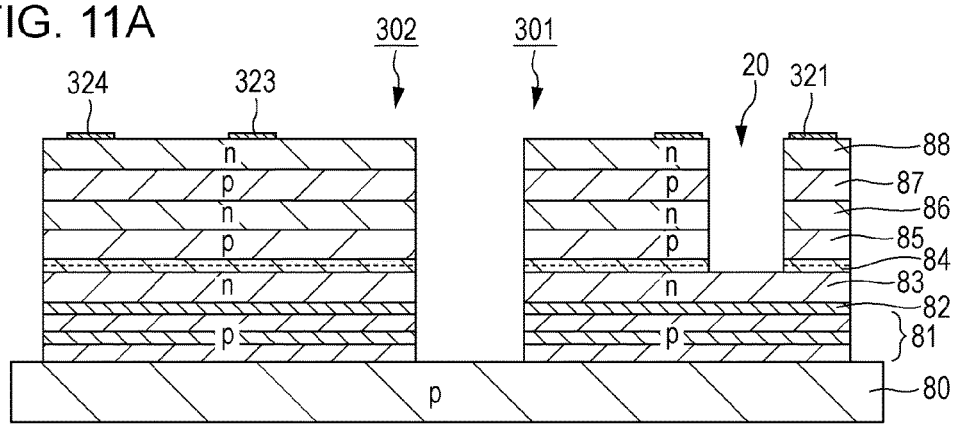
FIGS. 11A to 11C illustrate the method for manufacturing the light-emitting chip, specifically.
Figure 11B:
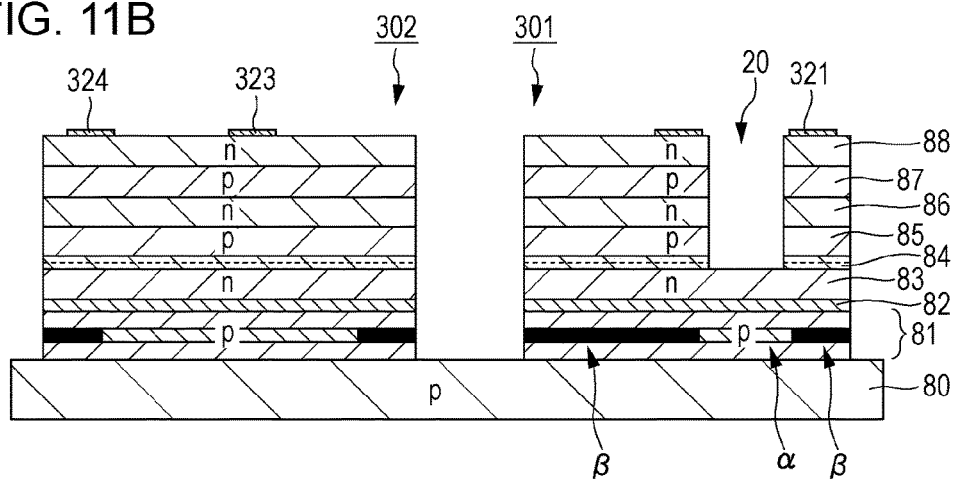
Figure 11C:
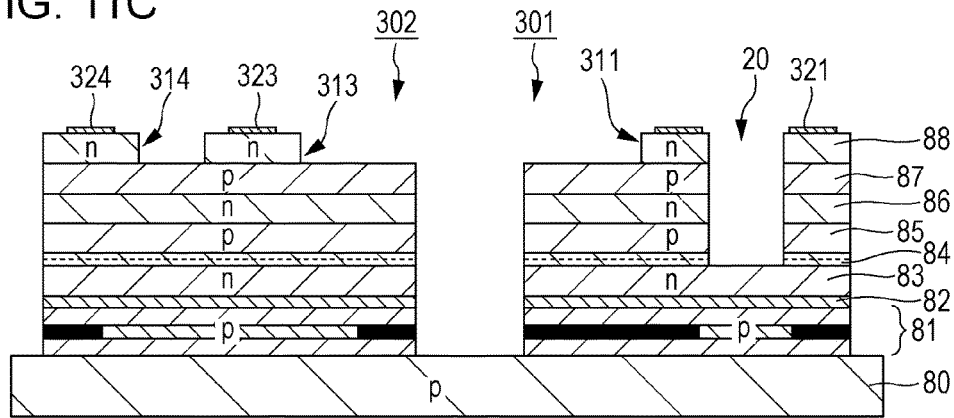
Figure 12A:
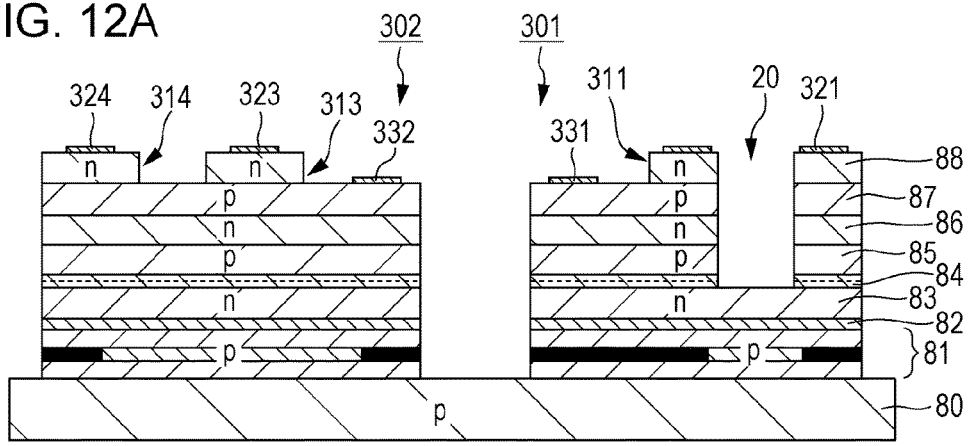
FIGS. 12A to 12C illustrate the method for manufacturing the light-emitting chip, specifically.
Figure 12B:
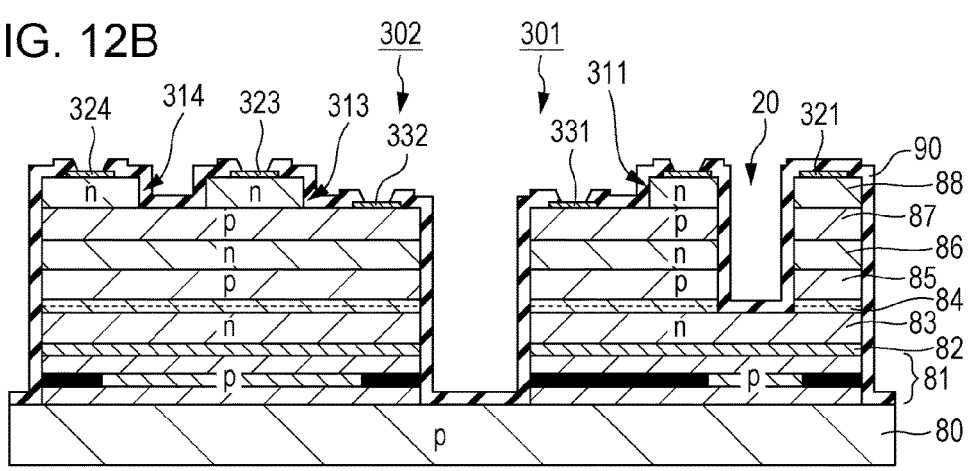
Figure 12C:
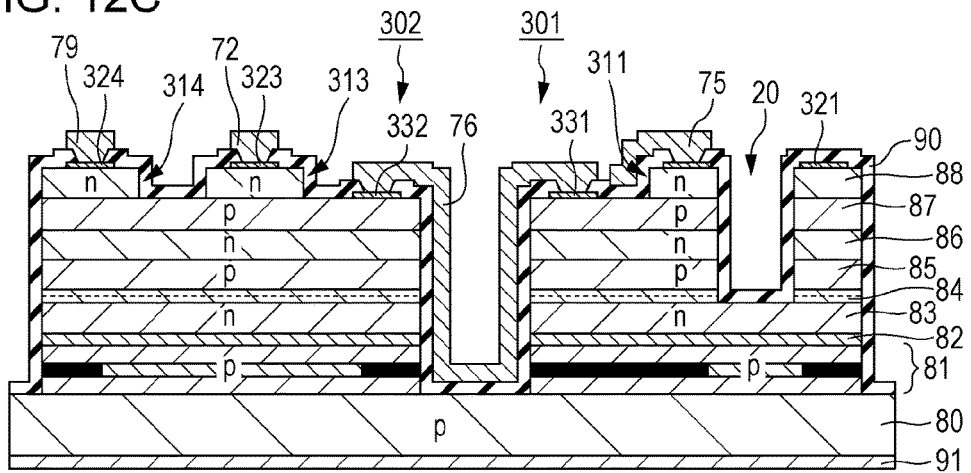

FIG. 10A to FIG. 12C illustrate a method for manufacturing the light-emitting chip C. Specifically, FIG. 10A illustrates a semiconductor stack forming step, FIG. 10B illustrates an n-ohmic electrode forming step for forming n-ohmic electrodes (e.g., the n-ohmic electrodes 321, 323, and 324), and FIG. 10C illustrates a semiconductor stack dividing step. FIG. 11A illustrates an opening forming step for forming the opening 20, FIG. 11B illustrates a current blocking portion forming step for forming the current blocking portion β, and FIG. 11C illustrates a p-gate layer exposure etching step for exposing the p-gate layer 87. FIG. 12A illustrates a p-ohmic electrode forming step for forming p-ohmic electrodes (e.g., the p-ohmic electrodes 331 and 332), FIG. 12B illustrates a protective layer forming step for forming the protective layer 90, and FIG. 12C illustrates a wire-and-electrode forming step for forming wires (e.g., the power supply line 71, the first transfer signal line 72, the second transfer signal line 73, and the turn-on signal line 75) and the back-surface electrode 91.

FIG. 10A to FIG. 12C will be described by using the cross-sectional view of the island 301 illustrated in FIGS. 7A and 7B and of the island 302. The cross-sectional view of these islands is taken along line VIB-VIB illustrated in FIG. 6A, but is viewed from the side (−x direction) opposite to the side illustrated in FIG. 6B. The same applies to the other islands. In addition, the conductivities (p and n) of impurities are illustrated.

Now, the steps will be sequentially described.

In the semiconductor stack forming step illustrated in FIG. 10A, on the p-type substrate 80, the p-anode layer 81, the light-emitting layer 82, the n-cathode layer 83, the tunnel junction layer 84, the p-anode layer 85, the n-gate layer 86, the p-gate layer 87, and the n-cathode layer 88 are epitaxially grown in this order to form a semiconductor stack.

The case of using p-type GaAs as the substrate 80 is described here by way of example; however, n-type GaAs or intrinsic (i-type) GaAs not doped with any impurities may be alternatively used. In addition, for example, a semiconductor substrate formed of InP, GaN, InAs, or other group III-V or group II-VI material, or a substrate formed of sapphire, Si, Ge, or the like may be alternatively used. When the material of the substrate 80 is changed, a material having a lattice constant that substantially matches that of the substrate (including a strain structure, a strain relaxation layer, and metamorphic growth) is used as a material monolithically stacked on the substrate. For example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a S1 substrate. Note that in the case where a semiconductor material is attached to another supporting substrate after its crystal growth, the semiconductor material need not have a lattice that substantially matches that of the supporting substrate.

The p-anode layer 81 is constituted by the lower p-anode layer 81a, the current constriction layer 81b, and the upper p-anode layer 81c that are sequentially stacked.

The lower p-anode layer 81a and the upper p-anode layer 81c of the p-anode layer 81 are formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The current constriction layer 81b is formed of AlAs or p-type AlGaAs with a high composition ratio of Al, for example. Any material may be used as long as Al is oxidized to be $Al_2O_3$ and consequently electrical resistance increases to constrict the current path.

The light-emitting layer 82 has a quantum well structure in which well layers and barrier layers are alternately stacked. The well layers are formed of GaAs, AlGaAs, InGaAS, GaAsP, AlGaInP, GaInAsP, or GaInP, for example. The barrier layers are formed of AlGaAs, GaAs, GaInP, or GaInAsP, for example. Note that the light-emitting layer 82 may have a quantum wire structure or a quantum dot structure.

The n-cathode layer 83 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

The tunnel junction layer 84 is configured by using the junction (see FIG. 7A) of the $n^{++}$-layer 84a doped with an n-type impurity at a high concentration and the $p^{++}$-layer 84b doped with a p-type impurity at a high concentration. The $n^{++}$-layer 84a and the $p^{++}$-layer 84b have a high impurity concentration, which is $1\times10^{20}/cm^3$, for example. Note that a common impurity concentration in the junction is in a range of $10^{17}/cm^3$ to $10^{18}/cm^3$. Examples of the combination of the $n^{++}$-layer 84a and the $p^{++}$-layer 84b (hereinafter referred to as the $n^{++}$-layer 84a/the $p^{++}$-layer 84b) include $n^{++}$GaInP/$p^{++}$GaAs, $n^{++}$GaInP/$p^{++}$AlGaAs, $n^{++}$GaAs/$p^{++}$GaAs, $n^{++}$AlGaAs/$p^{++}$AlGaAs, $n^{++}$InGaAs/$p^{++}$InGaAs, $n^{++}$GaInAsP/$p^{++}$GaInAsP, and $n^{++}$GaAsSb/$p^{++}$GaAsSb. Note that the former and the latter in the combinations may be interchanged.

The p-anode layer 85 is formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The n-gate layer 86 is formed of n-type $Al_{0.9}GaAs$ with an impurity concentration of $1\times10^{17}/cm^3$, for example. The Al composition ratio may be changed within a range of 0 to 1. Note that GaInP or the like may be alternatively used.

The p-gate layer 87 is formed of p-type $Al_{0.9}GaAs$ with an impurity concentration of $1\times10^{17}/cm^3$, for example. The Al composition ratio may be changed within a range of 0 to 1. Note that GaInP or the like may be alternatively used.

The n-cathode layer 88 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

These semiconductor layers are stacked using metal organic chemical vapor deposition (MOCVD) or molecular beam epitaxy (MBE), for example. Consequently, a semiconductor stack is formed.

In the n-ohmic electrode forming step illustrated in FIG. 10B, first, n-ohmic electrodes such as the n-ohmic electrodes 321, 323, and 324 are formed on the n-cathode layer 88.

The n-ohmic electrodes (e.g., the n-ohmic electrodes 321, 323, and 324) are formed of Ge-containing Au (AuGe) that easily forms an ohmic contact with an n-type semiconductor layer such as the n-cathode layer 88, for example.

The n-ohmic electrodes (e.g., the n-ohmic electrodes 321, 323, and 324) are formed by a lift off method, for example.

In the semiconductor stack dividing step illustrated in FIG. 10C, the n-cathode layer 88, the p-gate layer 87, the n-gate layer 86, the p-anode layer 85, the tunnel junction layer 84, the n-cathode layer 83, the light-emitting layer 82, and the p-anode layer 81 are sequentially etched, and islands such as the islands 301 and 302 are divided. This etching may be wet etching using, for example, a sulfuric-acid-based etching solution (sulfuric acid:hydrogen peroxide water:water=1:10:300 in weight ratio) or anisotropic dry etching (RIE) using, for example, boron chloride. The etching in the semiconductor stack dividing step may be called mesa etching or post-etching.

In the opening forming step illustrated in FIG. 11A, the n-cathode layer 88, the p-gate layer 87, the n-gate layer 86, the p-anode layer 85, and the tunnel junction layer 84 are sequentially etched, and thereby the opening 20 is formed. The etching may be performed as in the semiconductor stack dividing step. Note that, as described before, not all of the n-cathode layer 88, the p-gate layer 87, the n-gate layer 86, the p-anode layer 85, or the tunnel junction layer 84 need to be removed by etching, and only part of the n-cathode layer 83 in the thickness direction may be removed by etching.

Subsequently, in the current blocking portion forming step illustrated in FIG. 11B, the current constriction layer 81b whose side surfaces are exposed through the semiconductor stack dividing step is oxidized from the side surfaces, and thereby the current blocking portion β that blocks an electric current is formed. A portion that remains un-oxidized serves as the current passing portion α.

The current constriction layer 81b is oxidized by oxidizing Al in the current constriction layer 81b formed of AlAs, AlGaAs, or the like through steam oxidation at 300 to 400° C., for example. At this time, oxidation progresses from the exposed side faces, and consequently the current blocking portion β formed of $Al_2O_3$, which is an oxide of Al, is formed at the circumferential portion of the islands such as the islands 301 and 302. A portion of the current constriction layer 81b that remains un-oxidized serves as the current passing portion α. Note that the current blocking portion β are illustrated to have different lengths from the side surfaces of the island 301 in FIGS. 11B to 12C for convenience of illustration. Since the oxidation progresses by the same length from the side surfaces of the islands such as the islands 301 and 302, the resultant current blocking portion β has the same length from the side surfaces of the islands.

Note that the current blocking portion β may be formed by implanting a hydrogen ion ($H^+$) ($H^+$ ion implantation) to a semiconductor layer of GaAs, AlGaAs, or the like instead of using a semiconductor layer of AlAs or the like with a high Al composition ratio. That is, the p-anode layer 81 that is not divided into the lower p-anode layer 81a and the upper p-anode layer 81c but is formed as a single layer may be formed without using the current constriction layer 81b, and $H^+$ may be implanted to a portion that serves as the current blocking portion β to inactivate an impurity, thereby forming the current blocking portion β having a high electric resistance.

In the p-gate layer exposure etching step illustrated in FIG. 11C, the n-cathode layer 88 is etched so as to expose the p-gate layer 87.

This etching may be wet etching using a sulfuric-acid-based etching solution (sulfuric acid:hydrogen peroxide water:water=1:10:300 in weight ratio) or anisotropic dry etching using, for example, boron chloride.

In the p-ohmic electrode forming step illustrated in FIG. 12A, p-ohmic electrodes such as the p-ohmic electrodes 331 and 332 are formed on the p-gate layer 87.

The p-ohmic electrodes (e.g., the p-ohmic electrodes 331 and 332) are formed of Zn-containing Au (AuZn) that easily forms an ohmic contact with a p-type semiconductor layer such as the p-gate layer 87, for example.

The p-ohmic electrodes (e.g., the p-ohmic electrodes 331 and 332) are formed by a lift off method, for example.

In the protective layer forming step illustrated in FIG. 12B, the protective layer 90 of an insulating material such as $SiO_2$, SiON, or SiN, for example, is formed to cover the surfaces of the islands 301 and 302 and the like.

Subsequently, through-holes (openings) are formed in the protective layer 90 at portions above the n-ohmic electrodes (e.g., the n-ohmic electrodes 321, 323, and 324) and the p-ohmic electrodes (e.g., the p-ohmic electrodes 331 and 332).

In the wire-and-electrode forming step illustrated in FIG. 12C, wires (the power supply line 71, the first transfer signal line 72, the second transfer signal line 73, and the turn-on signal line 75) that connect the n-ohmic electrodes (e.g., the n-ohmic electrodes 321, 323, and 324) and the p-ohmic electrodes (e.g., the p-ohmic electrodes 331 and 332) to each other via the through-holes in the protective layer 90, and the back-surface electrode 91 are formed.

The wires and the back-surface electrode 91 are formed of Al, Au, or the like.

As described before, in each of the light-emitting chips C according to the first exemplary embodiment, the light-emitting diodes LED and the setting thyristors S are stacked. Such a configuration makes the light-emitting chips C be of self-scanning type that sequentially turn on the light-emitting diodes LED by using the transfer thyristors T and the setting thyristors S. As a result, the number of terminals provided in the light-emitting chips C is reduced, and the light-emitting chips C and the light-emitting device 65 become more compact.

The setting thyristors S are sometimes used as light-emitting thyristors (light-emitting elements) without disposing the setting thyristors S above the light-emitting diodes LED. That is, the p-anode layer 81, the light-emitting layer 82, and the n-cathode layer 83 that constitute the light-emitting diodes LED and the lower diodes UD are not provided.

In this case, driving characteristics and light emission characteristics are not separately (independently) settable. Thus, it is difficult to increase the driving speed, increase the output power of light, increase the efficiency, reduce the power consumption, and reduce the cost.

In contrast, in the first exemplary embodiment, the light-emitting diodes LED perform light emission while the transfer thyristors T and the setting thyristors S perform transfer. That is, light emission and transfer are separated from each other, and the setting thyristors S need not emit light. Thus, light emission characteristics, for example, are successfully improved by configuring the light-emitting diodes LED to have the quantum well structure, and driving characteristics of the transfer thyristors T and the setting thyristors S are also successfully improved. That is, the light-emitting diodes LED of the light-emitting unit 102 and the transfer thyristors T and the setting thyristors S of the driving unit 101 are separately (independently) settable. This makes it easier to achieve a higher driving speed, a higher output power of light, a higher efficiency, a lower power consumption, and a lower cost.

In addition, in the first exemplary embodiment, the light-emitting diode LED and the setting thyristor S are stacked with the tunnel junction layer 84 interposed therebetween. In this case, although the light-emitting diode LED is reverse-biased in the tunnel junction layer 84, a current flows through the tunnel junction layer 84 even in the reverse-biased state.

If the tunnel junction layer 84 is not provided, a portion of the junction between the light-emitting diode LED and the setting thyristor S is reverse-biased. Accordingly, a voltage greater than or equal to a breakdown voltage of the reverse-biased junction is applied in order to allow a current to flow through the light-emitting diode LED the setting thyristor S. That is, the driving voltage increases.

However, the driving voltage is reduced by stacking the light-emitting diode LED and the setting thyristor S with the tunnel junction layer 84 interposed therebetween, compared with the case where the light-emitting diode LED and the setting thyristor S are stacked without the tunnel junction layer 84 interposed therebetween.

Further, as described above, the tunnel junction layer 84 has a high impurity concentration. The tunnel junction layer 84 has, for example, an impurity concentration of $10^{19}/cm^3$, which is higher than the impurity concentrations of the other layers that are in a range of $10^{17}$ to $10^{18}/cm^3$. Si that is used as an impurity has a lattice constant, a bond strength, and the number of valence electrons that are different from those of GaAs, which is an example of a semiconductor material serving as a base. Thus, when a semiconductor layer of GaAs or the like is grown on the tunnel junction layer 84, defects are more likely to occur. The higher the impurity concentration, the higher the likelihood of defects. The defects continue to the semiconductor layer formed thereon.

In addition, in order to make the impurity concentration of a layer such as the tunnel junction layer 84 higher than those of the other layers, the layer needs to be grown at a low temperature. That is, the growth conditions (temperature, growth speed, and ratio) need to be changed. Thus, the growth conditions of a semiconductor layer disposed on the tunnel junction layer 84 deviates from the optimum growth conditions.

As a result, the semiconductor layer disposed on the tunnel junction layer 84 contains many defects.

In particular, the light emission characteristics of light-emitting elements such as the light-emitting diodes LED are easily affected by the defects contained in the semiconductor layer. On the other hand, thyristors (the setting thyristors S and the transfer thyristors T) are only required to turn on and supply a current to the light-emitting diodes LED and the lower diodes UD. That is, the thyristors (the setting thyristors S and the transfer thyristors T) are robust against the influence of the defects.

Accordingly, in the first exemplary embodiment, the light-emitting diodes LED and the lower diodes UD are disposed on the substrate 80, and the setting thyristors S and the transfer thyristors T are disposed on the light-emitting diodes LED and the lower diodes UD, respectively, with the tunnel junction layer 84 interposed therebetween. In this way, the occurrence of defects is suppressed in the light-emitting diodes LED and the lower diodes UD, particularly, in the light-emitting diodes LED, and the influence of the defects on the light emission characteristics is reduced. In addition, the setting thyristors S and the transfer thyristors T are epitaxially grown to be monolithically stacked.

Metallic Conducting Group III-V Compound Layer

In the above-described light-emitting chip C, the setting thyristor S and the transfer thyristor T are stacked on the light-emitting diode LED and the lower diode UD, respectively, with the tunnel junction layer 84 interposed therebetween.

Instead of the tunnel junction layer 84, a group III-V compound layer that has a metallic conductivity and is epitaxially grown on a group III-V compound semiconductor layer may be used. In this case, the "tunnel junction layer 84" in the above description may be replaced with a "metallic conducting group III-V compound layer 84" described below.

Figure 13A:
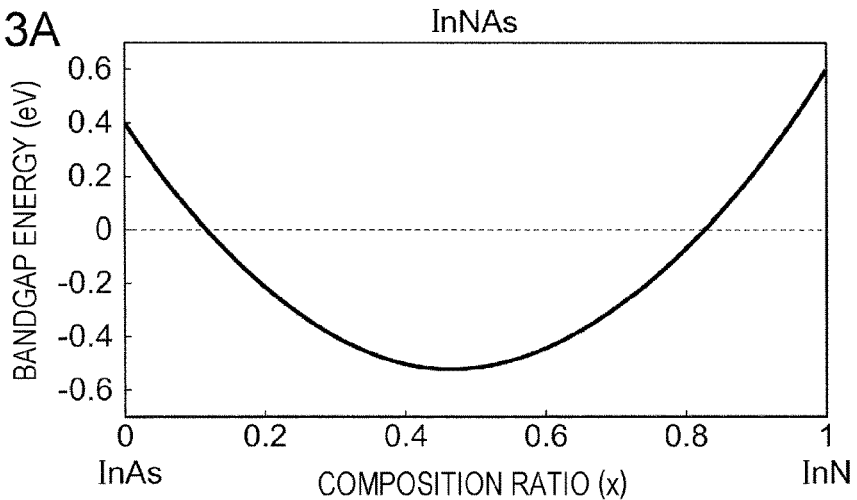
FIGS. 13A to 13C illustrate materials for forming a metallic conducting group III-V compound layer, specifically.
Figure 13B:
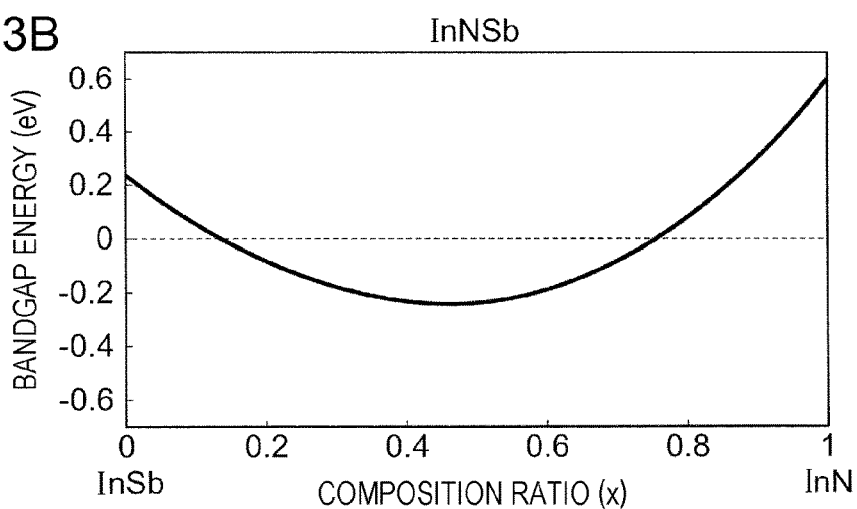
Figure 13C:
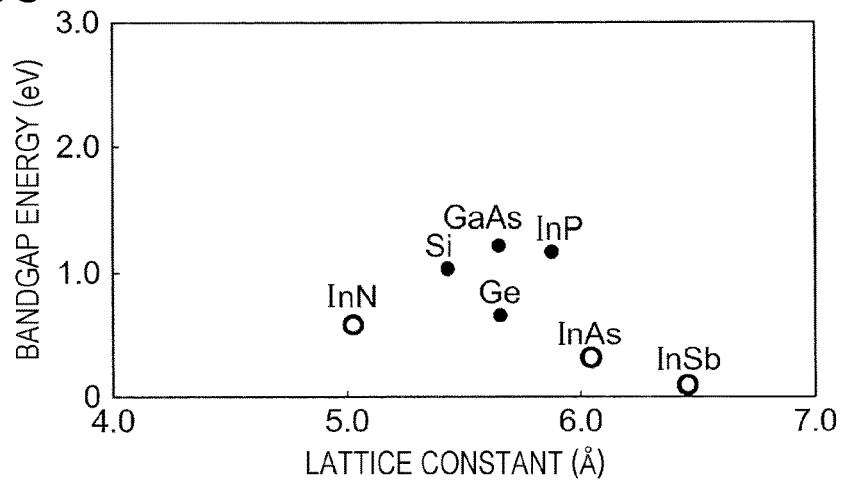

FIGS. 13A to 13C are graphs that illustrate materials for forming the metallic conducting group III-V compound layer. Specifically, FIG. 13A illustrates a bandgap of InNAs with respect to an InN composition ratio x, FIG. 13B illustrates a bandgap of InNSb with respect to the InN composition ratio x, and FIG. 13C illustrates lattice constants of group VI elements and group III-V compounds with respect to the bandgap.

FIG. 13A illustrates the bandgap energy (eV) of InNAs, which is a compound between InN with a composition ratio x (x=0 to 1) and InAs with a composition ratio (1−x).

FIG. 13B illustrates the bandgap energy (eV) of InNSb, which is a compound between InN with a composition ratio x (x=0 to 1) and InSb with a composition ratio (1−x).

InNAs and InNSb, which are described as examples of the material for forming the metallic conducting group III-V compound layer, are known to have a negative bandgap energy in a particular composition ratio x range, as illustrated in FIGS. 13A and 13B. A negative bandgap energy means that the material has no bandgap. Thus, conducting properties (conductive properties) similar to those of metal are exhibited. Metallic conducting properties (conductivity) means that the current will flow as long as there is a slope in potential as in metal.

As illustrated in FIG. 13A, InNAs exhibits a negative bandgap energy when the InN composition ratio x is within the range of about 0.1 to about 0.8.

As illustrated in FIG. 13B, InNSb exhibits a negative bandgap energy when the InN composition ratio x is within the range of about 0.2 to about 0.75.

That is, InNAs and InNSb exhibit metallic conductive properties (conductivity) within these ranges.

In regions, other than these ranges, where the bandgap energy is small, electrons obtain energy due to thermal energy and are able to transition through a slight bandgap. As with the case when the bandgap energy is negative or with the case of metal, the current smoothly flows when there is a slope in the potential.

Even when InNAs and InNSb contain Al, Ga, Ag, P, or the like, it is possible to maintain the bandgap energy close to zero or at a negative value by adjusting the composition. If there is a slope in the potential, the current will flow.

As illustrated in FIG. 13C, the lattice constants of the group III-V compounds (semiconductors) such as GaAs and InP are within the range of 5.6 Å to 5.9 Å. The lattice constants are close to that of Si, which is about 5.43 Å and that of Ge, which is about 5.66 Å.

In contrast, the lattice constant of the InN, which is also a group III-V compound, is about 5.0 Å for a zinc blende structure, and the lattice constant of InAs is about 6.06 Å. The lattice constant of InNAs, which is a compound between InN and InAs, is able to take a value close to 5.6 Å to 5.9 Å, which is a lattice constant of GaAs or the like.

The lattice constant of InSb, which is a group III-V compound, is about 6.48 Å. Since the lattice constant of InN is about 5.0 Å, the lattice constant of InNSb, which is a compound between InSb and InN, is able to take a value close to 5.6 Å to 5.9 Å, which is a lattice constant of GaAs or the like.

That is, InNAs and InNSb are able to be monolithically epitaxially grown on a layer of a group III-V compound (semiconductor), such as GaAs. Furthermore, a layer of a group III-V compound (semiconductor) such as GaAs is able to be monolithically epitaxially grown on the InNAs or InNSb layer.

Thus, when the light-emitting diode LED and the setting thyristor S are stacked with a metallic conducting group III-V compound layer interposed therebetween instead of the tunnel junction layer 84 such that the light-emitting diode LED and the setting thyristor S are connected in series, the n-cathode layer 83 of the light-emitting diode LED and the p-anode layer 85 of the setting thyristor S are suppressed from becoming reverse-biased.

A metallic conducting group III-V compound layer formed of InNAs, InNSb, or the like theoretically has a negative bandgap, but is more difficult to grow and has a lower quality than a material such as GaAs or InP. In particular, if the N composition ratio is increased, the growth becomes much more difficult. Thus, defects are more likely to occur when, for example, a semiconductor layer of GaAs or the like is grown on the metallic conducting group III-V compound layer.

As described above, the light emission characteristics of light-emitting elements such as the light-emitting diodes LED are easily affected by defects contained in the semiconductor layer. On the other hand, thyristors (the setting thyristors S and the transfer thyristors T) are only required to turn on and supply a current to the light-emitting diodes LED and the lower diodes UD. That is, the thyristors (the setting thyristors S and the transfer thyristors T) are robust against the influence of the defects.

Accordingly, as in the tunnel junction layer 84, the light-emitting diode LED and the lower diode UD are provided on the substrate 80, and the setting thyristor S and the transfer thyristor T are provided on the light-emitting diode LED and the lower diode UD, respectively, with the metallic conducting group III-V compound layer interposed therebetween. In this way, the occurrence of defects is suppressed in the light-emitting diodes LED and the lower diodes UD, particularly, in the light-emitting diodes LED, and the influence of the defects on the light emission characteristics is reduced. In addition, the setting thyristors S and the transfer thyristors T may be monolithically stacked.

Voltage Reduction Layer 89

In the light-emitting chip C described above, the setting thyristors S and the transfer thyristors T are respectively stacked on the light-emitting diodes LED and the lower diodes UD with the tunnel junction layer 84 interposed therebetween. Thus, the absolute values of the voltages of the power supply potential Vga, the first transfer signal φ1, the second transfer signal φ2, and the turn-on signal φ1 have increased. As described before, "L" (−5 V) is used.

Accordingly, a voltage reduction layer 89 that reduces voltages applied to the thyristors (the setting thyristors S and the transfer thyristors T) may be used in order to reduce the absolute values of the voltages of the power supply potential Vga, the first transfer signal φ1, the second transfer signal φ2, and the turn-on signal φ1.

Figure 14:
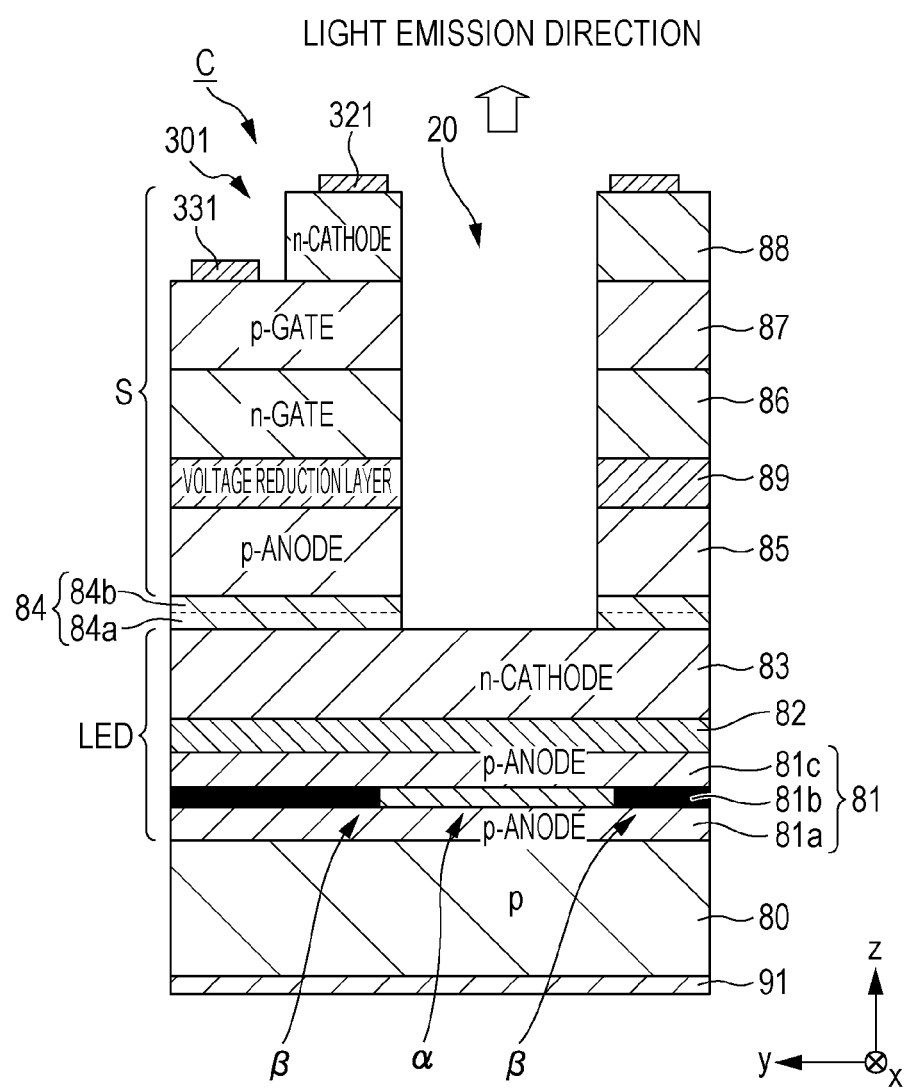
FIG. 14 is an enlarged cross-sectional view of an island in which the light-emitting diode and a setting thyristor including a voltage reduction layer are stacked.

FIG. 14 is an enlarged cross-sectional view of the island 301 in which the light-emitting diode LED and the setting thyristor S including the voltage reduction layer 89 are stacked. FIG. 14 is equivalent to FIG. 7A additionally including the voltage reduction layer 89. Thus, portions substantially the same as those illustrated in FIG. 7A are assigned the same reference signs to omit a description thereof, and different part will be described.

In this example, the voltage reduction layer 89 is disposed between the p-anode layer 85 and the n-gate layer 86 of the setting thyristor S. The same applies to the transfer thyristor T.

The voltage reduction layer 89 may be part of the p-anode layer 85, that is, may be a p-type layer with an impurity concentration similar to that of the p-anode layer 85. Alternatively, the voltage reduction layer 89 may be part of the n-gate layer 86, that is, may be an n-type layer with an impurity concentration similar to that of the n-gate layer 86. In addition, the voltage reduction layer 89 may be an i-type layer.

A function of the voltage reduction layer 89 in the setting thyristor S and the transfer thyristor T will be described by generalizing the setting thyristor S and the transfer thyristor T as thyristors.

Figure 15A:
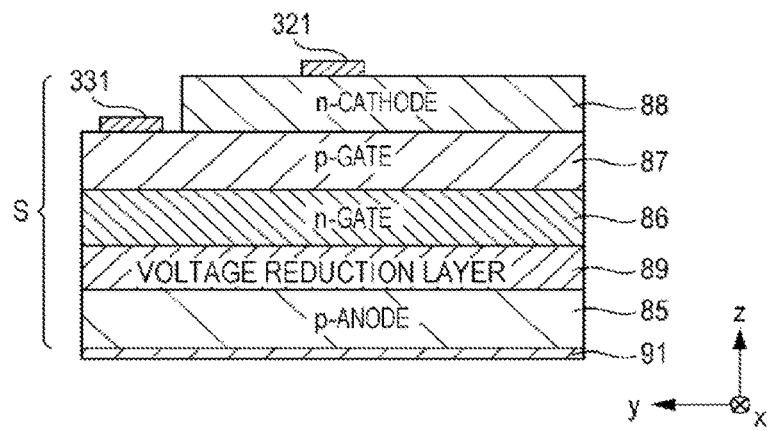
FIGS. 15A to 15C illustrate structures and characteristics of thyristors, specifically.
Figure 15B:
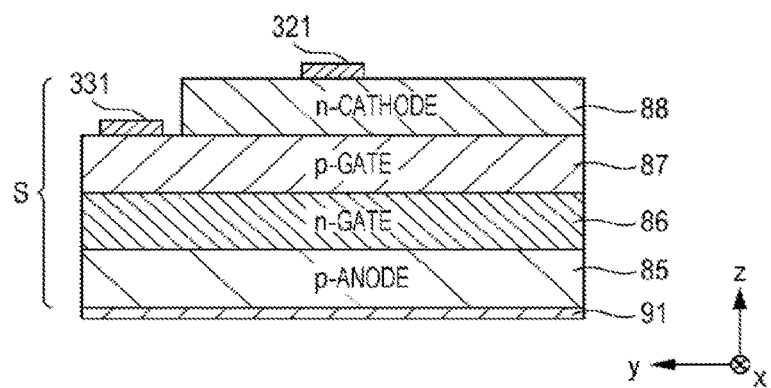
Figure 15C:
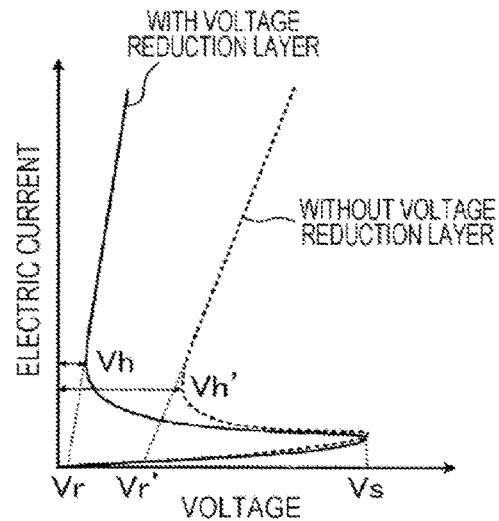

FIGS. 15A to 15C illustrate structures and characteristics of thyristors. Specifically, FIG. 15A is a cross-sectional view of a thyristor not including the voltage reduction layer 89, FIG. 15B is a cross-sectional view of a thyristor including the voltage reduction layer 89, and FIG. 15C illustrates characteristics of the thyristors. Cross-sections in FIGS. 15A and 15B correspond to cross-sections of the setting thyristor S that is not stacked on the light-emitting diode LED, for example. Accordingly, it is assumed that the back-surface electrode 91 is disposed on the back surface of the p-anode layer 85.

The thyristor illustrated in FIG. 15A includes the voltage reduction layer 89 between the p-anode layer 85 and the n-gate layer 86. Note that the voltage reduction layer 89 serves as part of the p-anode layer 85 if the voltage reduction layer 89 is a p-type layer with an impurity concentration that is substantially the same as that of the p-anode layer 85, or serves as part of the n-gate layer 86 if the voltage reduction layer 89 is an n-type layer with an impurity concentration that is substantially the same as that of the n-gate layer 86. The voltage reduction layer 89 may be alternatively an i-type layer.

The thyristor illustrated in FIG. 15B does not include the voltage reduction layer 89.

The rising voltages (see Vr and Vr' in FIG. 15C) of the thyristors are determined by the smallest bandgap energy among bandgap energies of the semiconductor layers that constitute the thyristors. Note that the rising voltage of a thyristor is a voltage obtained when a current flowing through the thyristor in an on-state is extrapolated to the voltage axis.

As illustrated in FIG. 15C, the rising voltage Vr of the thyristor including the voltage reduction layer 89 is lower than the rising voltage Vr' of the thyristor not including the voltage reduction layer 89. This is because the bandgap energy of the voltage reduction layer 89 is smaller than that of any of the p-anode layer 85, the n-gate layer 86, the p-gate layer 87, and the n-cathode layer 88. In addition, as an example, the bandgap of the voltage reduction layer 89 is smaller than that of the light-emitting layer 82.

The thyristors (the setting thyristor S and the transfer thyristors T) are not used as the light-emitting elements. The thyristors (the setting thyristor S and the transfer thyristors T) function as part of the driving unit 101 that drives light-emitting elements, such as the light-emitting diodes LED. Thus, the bandgap is determined independently of the wavelength of light actually emitted by the light-emitting element. Accordingly, the rising voltage Vr of the thyristor is reduced by providing the voltage reduction layer 89 having a bandgap smaller than the bandgap of the light-emitting layer 82.

This reduces the voltage applied to the thyristors and the light-emitting elements in a state where the thyristors and the light-emitting elements are in the on-state.

Figure 16:
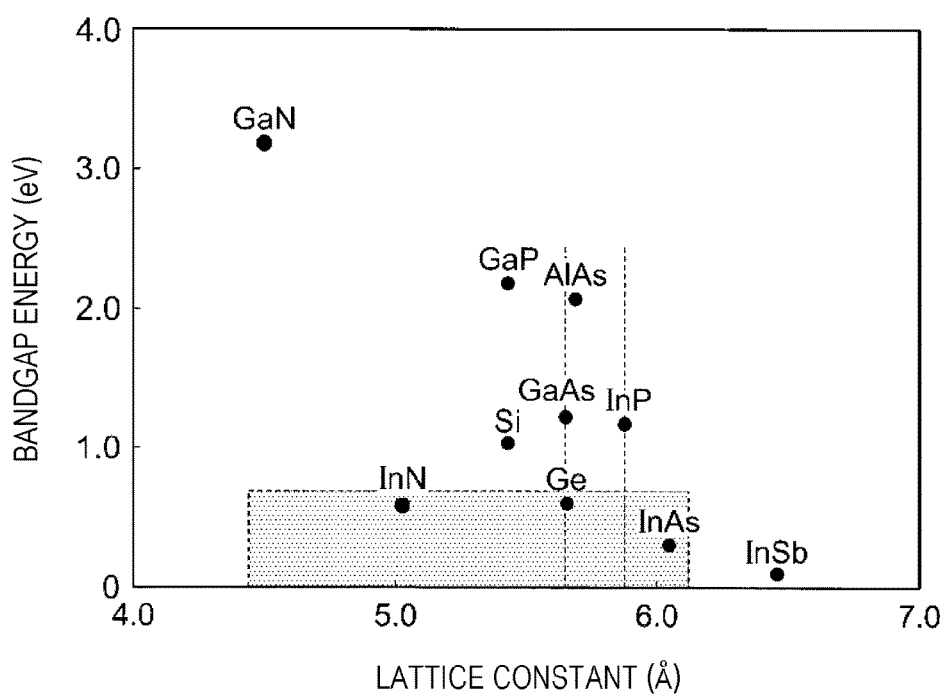
FIG. 16 illustrates bandgap energies of materials for forming semiconductor layers.

FIG. 16 illustrates bandgap energies of materials for forming semiconductor layers.

The lattice constant of GaAs is about 5.65 Å. The lattice constant of AlAs is about 5.66 Å. Thus, a material having a lattice constant close to this lattice constant is able to be epitaxially grown on a GaAs substrate. For example, Ge or AlGaAs, which is a compound of GaAs and AlAs, is able to be epitaxially grown on a GaAs substrate.

In addition, the lattice constant of InP is about 5.87 Å. A material having a lattice constant close to this lattice constant is able to be epitaxially grown on an InP substrate.

GaN has different lattice constants depending on the growth face. The lattice constant of the a-plane is 3.19 Å and the lattice constant of the c-plane is 5.17 Å. A material having a lattice constant close to one of these lattice constants is able to be epitaxially grown on a GaN substrate.

Materials having bandgap energies that reduce the rising voltage of the thyristor for GaAs, InP, and GaN are in a shaded range in FIG. 16. That is, when a material in the shaded range is used for a layer of the thyristor, the rising voltage Vr of the thyristor becomes equal to bandgap energy of the material in the shaded range.

For example, the bandgap energy of GaAs is about 1.43 eV. Thus, the rising voltage Vr of the thyristor is about 1.43 V without the voltage reduction layer 89. However, when a material in the shaded range is used for or included in a layer of the thyristor, the rising voltage Vr of the thyristor is able to be set to be higher than 0 V and lower than 1.43 V (0 V<Vr<1.43 V).

Consequently, power consumption is reduced when the thyristor is in the on-state.

The materials in the shaded range include Ge which has a bandgap energy of about 0.67 eV for GaAs. In addition, the materials include InAs which has a bandgap energy of about 0.36 eV for InP. In addition, materials having a smaller bandgap energy such as a compound of GaAs and InP, a compound of InN and InSb, and a compound of InN and InAs may be used for a GaAs substrate or an InP substrate. In particular, a GaInNAs-based mixed compound is suitable. These may contain Al, Ga, As, P, Sb, and so forth. In addition, GaNP may serve as the voltage reduction layer 89 for GaN. In addition, (1) an InN layer or an InGaN layer obtained by metamorphic growth, for example; (2) quantum dots of InN, InGaN, InNAs, or InNSb; or (3) an InAsSb layer having a lattice constant equivalent to the doubled lattice constant of GaN (the a-plane), for example, may be used as the voltage reduction layer 89. These may contain Al, Ga, N, As, P, Sb, and so forth.

The description has been given using the rising voltages Vr and Vr' of the thyristors in this example. The same applies to hold voltages Vh and Vh' that are the minimum voltages applied to maintain the thyristors in the on-state and to voltages applied to the on-state thyristors (see FIG. 15C).

On the other hand, a switching voltage Vs (see FIG. 15C) of a thyristor is determined by a depletion layer of a reverse-biased semiconductor layer. Thus, the influence of the voltage reduction layer 89 on the switching voltage Vs of the thyristor is small.

That is, the voltage reduction layer 89 maintains the switching voltage Vs of the thyristor and reduces the rising voltage Vr. Consequently, the voltage applied to the on-state thyristor is reduced, and power consumption is reduced. The switching voltage Vs of the thyristor is set to a given value by adjusting the materials, impurity concentrations, and the like of the p-anode layer 85, the n-gate layer 86, the p-gate layer 87, and the n-cathode layer 88. Note that the switching voltage Vs changes depending on the position at which the voltage reduction layer 89 is inserted.

Although FIG. 14 illustrates an example in which a single voltage reduction layer 89 is provided, plural voltage reduction layers 89 may be provided. For example, the voltage reduction layer 89 may be disposed between the p-anode layer 85 and the n-gate layer 86 and between the p-gate layer 87 and the n-cathode layer 88. Alternatively, the voltage reduction layer 89 may be disposed in the n-gate layer 86 and in the p-gate layer 87. In addition, two or three layers may be selected from among the p-anode layer 85, the n-gate layer 86, the p-gate layer 87, and the n-cathode layer 88, and the voltage reduction layer 89 may be disposed in each of the two or three selected layers. The conductivity types of these voltage reduction layers 89 may be set to match the conductivity types of the anode layer, the cathode layer, and the gate layers where the respective voltage reduction layers 89 are disposed or may be i-type.

A material used for the voltage reduction layer 89 is more difficult to grow and has a lower quality than a material such as GaAs or InP. Thus, defects are more likely to occur in the voltage reduction layer 89 and the defects extend to a semiconductor layer of GaAs or the like that is grown on the voltage reduction layer 89.

As described above, light emission characteristics of light-emitting elements, such as the light-emitting diodes LED, are easily affected by defects contained in the semiconductor layer. On the other hand, thyristors (the setting thyristors S and the transfer thyristors T) are only required to turn on and supply a current to the light-emitting diodes LED and the lower diodes UD. That is, when the thyristors including the voltage reduction layer 89 are not used as the light-emitting layers but are used for reducing the voltage, the semiconductor layers that constitute the thyristors may contain defects.

Accordingly, the light-emitting diodes LED and the lower diodes UD are disposed on the substrate 80, and then the setting thyristors S and the transfer thyristors T including the voltage reduction layer 89 are respectively disposed on the light-emitting diodes LED and the lower diodes UD as in the case of the tunnel junction layer 84 or the metallic conducting group III-V compound layer. In this way, the occurrence of defects is suppressed in the light-emitting diodes LED and the lower diodes UD, particularly, in the light-emitting diodes LED, to make the defects less influential in the light emission characteristics. In addition, the setting thyristors S and the transfer thyristors T may be monolithically stacked.

Next, a modification of the light-emitting chip C according to the first exemplary embodiment will be described below. Although the following modification will describe a portion in which the light-emitting diode LED and the setting thyristor S are stacked in the island 301 of the light-emitting chip C, the same applies to a portion in which the lower diode UD and the transfer thyristor T are stacked. Since the rest of the configuration is substantially the same as that of the light-emitting chip C described above, a description of the substantially the same part is omitted, and different part will be described.

First Modification of Light-emitting Chip C
According to First Exemplary Embodiment FIGS. 17A and 17B are enlarged views of the island 301 in which the light-emitting diode LED and the setting thyristor S are stacked for illustrating a first modification. Specifically, FIG. 17A is an enlarged cross-sectional view of the island 301, and FIG. 17B is a plan view of the island 301.

Although the setting thyristor S is disposed to surround the current passing portion α of the light-emitting diode LED in the light-emitting chip C according to the first exemplary embodiment, the setting thyristor S is disposed along one of sides of the island 301 having a square plan shape in the first modification. The setting thyristor S is only required to turn on to change the light-emitting diode in the on-state. Accordingly, the setting thyristor S may also be configured in this way. Note that the setting thyristor S may be disposed along part of a side of the light-emitting diode LED, or along two or three sides. In addition, such a configuration is also an example of a configuration including an opening, and a portion of the light-emitting diode LED where the setting thyristor S is not disposed is referred to as the opening 20. That is, as in the light-emitting chip C (FIGS. 7A and 7B) according to the first exemplary embodiment, the opening 20 is disposed in the path of light from the light-emitting diode LED. Furthermore, the setting thyristor S is stacked on the light-emitting diode LED in a portion that is shifted from the central portion where light is emitted from the light-emitting diode LED (the central portion of the current passing portion α). Note that the central portion where light is emitted may also be expressed as a portion where the emitted light amount is the largest on the emission surface. That is, the setting thyristor S is disposed at a position not overlapping with the portion where the emitted light amount is the largest on the emission surface of the light-emitting diode LED.

Note that the opening 20 may reach part of a semiconductor layer constituting the setting thyristor S as illustrated in the shapes 20b to 20e in FIG. 7A.

Note that the first modification is realized by modifying the method for manufacturing the light-emitting chip C according to the first exemplary embodiment illustrated in FIGS. 10A to 12C. According to the first modification, the formation of the opening 20 is made easier in the opening forming step illustrated in FIG. 11A than in the case where the opening 20 having a fine hole shape is formed.

As described above, by using the light-emitting chip C according to the first exemplary embodiment, the characteristics of the light-emitting element are improved compared with a structure in which a light-emitting element (e.g., the light-emitting diode LED) is stacked on a driving element (thyristor). This improves the performance of the printhead 14 and the image forming apparatus 1.

Second Exemplary Embodiment

In a light-emitting chip C according to a second exemplary embodiment, the light-emitting layer 82 is sandwiched by two distributed Bragg reflector layers (hereinafter, referred to as DBR layers). That is, the p-anode layer 81 and the n-cathode layer 83 in the light-emitting chip C according to the first exemplary embodiment are constituted as DBR layers. Although the following description will be given for a portion in which the light-emitting diode LED and the setting thyristor S are stacked in the island 301 of the light-emitting chip C, the same applies to a portion in which the lower diode UD and the transfer thyristor T are stacked. Since the rest of the configuration is substantially the same as that of the light-emitting chip C described above, a description of the substantially the same part is omitted, and different part will be described.

Figure 18B:
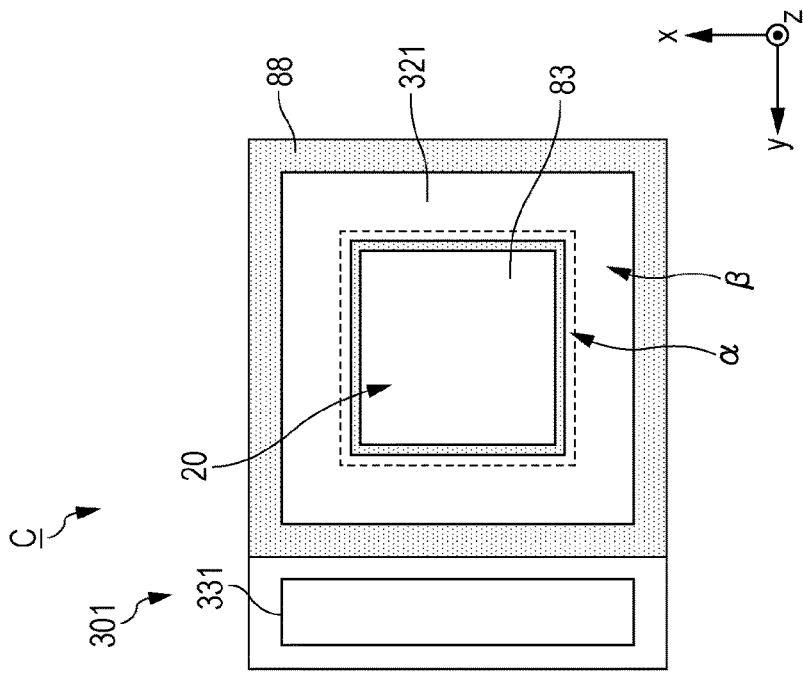
FIGS. 18A and 18B are enlarged views of an island in which a light-emitting diode and a setting thyristor are stacked in a light-emitting chip according to a second exemplary embodiment, specifically.
Figure 18A:
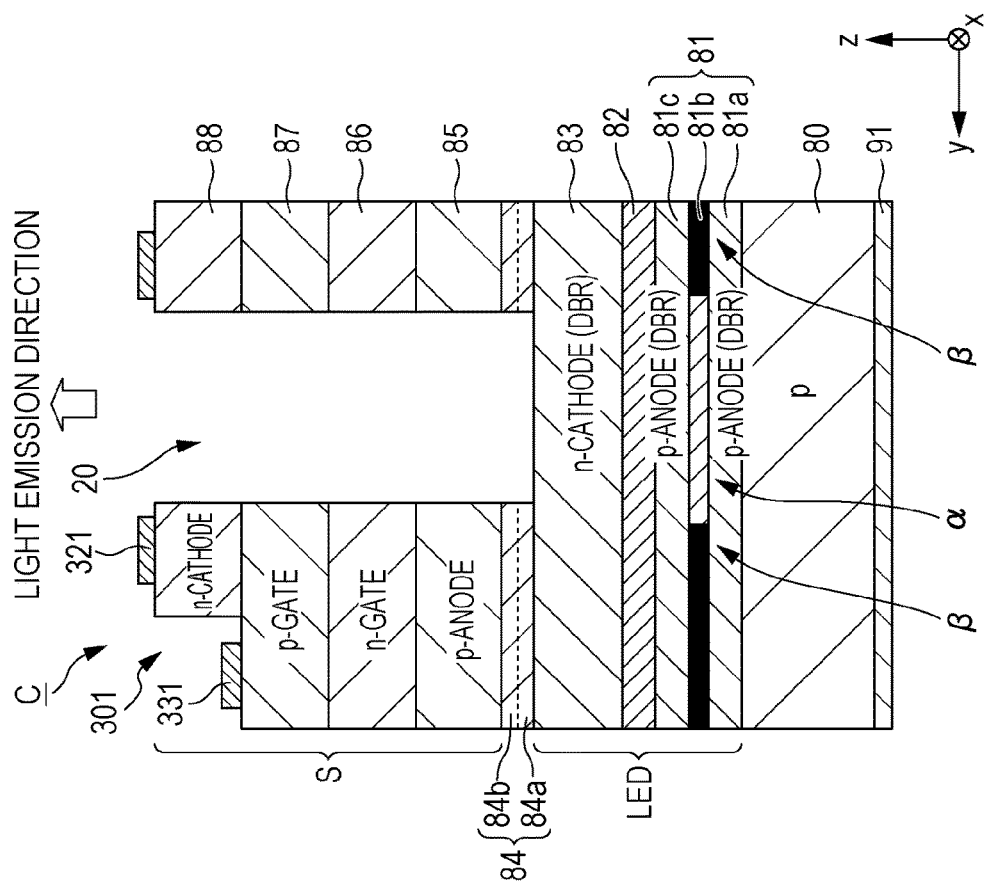

FIGS. 18A and 18B are enlarged views of the island 301 in which the light-emitting diode LED and the setting thyristor S are stacked in the light-emitting chip C according to the second exemplary embodiment. Specifically, FIG. 18A is an enlarged cross-sectional view of the island 301, and FIG. 18B is a plan view of the island 301.

In a light-emitting chip C according to the second exemplary embodiment, the light-emitting layer 82 of the light-emitting diode LED is sandwiched by two DBR layers. That is, the p-anode layer 81 and the n-cathode layer 83 are constituted as DBR layers. The p-anode layer 81 includes the current constriction layer 81b. That is, in the p-anode layer 81, the lower p-anode layer 81a, the current constriction layer 81b, and the upper p-anode layer 81c are stacked in this order, and the lower p-anode layer 81a and the upper p-anode layer 81c are constituted as DBR layers. Thus, the lower p-anode layer 81a and the upper p-anode layer 81c may be referred to as a lower p-anode (DBR) layer 81a and an upper p-anode (DBR) layer 81c, respectively. In addition, the lower p-anode (DBR) layer 81a and the upper p-anode (DBR) layer 81c may collectively be referred to as a p-anode (DBR) layer 81, and the n-cathode layer 83 may be referred to as an n-cathode (DBR) layer 83.

A DBR layer is constituted by stacking plural semiconductor layers with varying refractive index. A DBR layer reflects light. That is, the p-anode (DBR) layer 81 and the n-cathode (DBR) layer 83 constitute a resonator (cavity) that reflects light emitted from the light-emitting layer 82 of the light-emitting diode LED, and the intensity of light from the light-emitting layer 82 is increased by resonance before the light is output. That is, in the light-emitting chip C according to the second exemplary embodiment, the setting thyristor S is stacked on a resonance-type light-emitting diode LED.

Since the current constriction layer 81b is provided, electric power consumed by non-radiative recombination is reduced. Consequently, power consumption is reduced, and light extraction efficiency improves.

A DBR layer is constituted by a combination of low refractive index layers with a high Al composition ratio of, for example, $Al_{0.9}Ga_{0.1}As$ and high refractive index layers with a low Al composition ratio of, for example, $Al_{0.2}Ga_{0.8}As$. Thicknesses (optical path length) of the low refractive index layers and the high refractive index layers are set to 0.25 (¼) of the center wavelength, for example. Note that the Al composition ratios of the low refractive index layers and the high refractive index layers may be changed within a range of 0 to 1.

Note that the thickness (optical path length) of the current constriction layer 81b is determined by the structure adopted in the p-anode (DBR) layer 81. In the case where importance is placed on extraction efficiency and process reproducibility, the thickness (optical path length) of the current constriction layer 81b is desirably set to an integer multiple of the thickness (optical path length) of the low refractive index layers and the high refractive index layers constituting the DBR layer. The thickness is set to 0.75 (¾) of the center wavelength, for example. In the case of an odd multiple, the current constriction layer 81b is desirably sandwiched by a high refractive index layer and a high refractive index layer. In the case of an even multiple, the current constriction layer 81b is desirably sandwiched by a high refractive index layer and a low refractive index layer. That is, the current constriction layer 81b is desirably provided to suppress a disturbance in the period of the refractive index due to the DBR layer. Conversely, in the case where a reduction of the influences of an oxidized portion (in the refractive index and distortion) is desired, the thickness of the current constriction layer 81b is desirably set to several tens of nanometers (nm) and is desirably inserted at a portion corresponding to a node of a standing wave caused in the DBR layer.

The light-emitting chip C according to the second exemplary embodiment is manufactured by partly modifying the manufacturing method according to the first exemplary embodiment illustrated in FIGS. 10A to 12C. That is, in the semiconductor stack forming step illustrated in FIG. 10A, the lower p-anode layer 81a and the upper p-anode layer 81c of the p-anode layer 81 and the n-cathode layer 83 are formed as DBR layers.

The light-emitting chip C according to the second exemplary embodiment operates in accordance with the timing chart illustrated in FIG. 9 described in the first exemplary embodiment.

As described in the first exemplary embodiment, also in the light-emitting chip C according to the second exemplary embodiment, the position of the current constriction layer may be changed, the metallic conducting group III-V compound layer may be used in place of the tunnel junction layer 84, and the voltage reduction layer 89 may be disposed in the transfer thyristor T and the setting thyristor S.

In addition, as in the first modification (FIGS. 17A and 17B) of the first exemplary embodiment, the setting thyristor S may be disposed along one of sides of the island 301 having a square plan shape, for example.

A modification of the light-emitting chip C according to the second exemplary embodiment will be described below. Although the following modification will describe a portion in which the light-emitting diode LED and the setting thyristor S are stacked in the island 301 of the light-emitting chip C, the same applies to a portion in which the lower diode UD and the transfer thyristor T are stacked. Since the rest of the configuration is substantially the same as that of the light-emitting chip C described above, a description of the substantially the same part is omitted, and different part will be described.

Figure 19B:
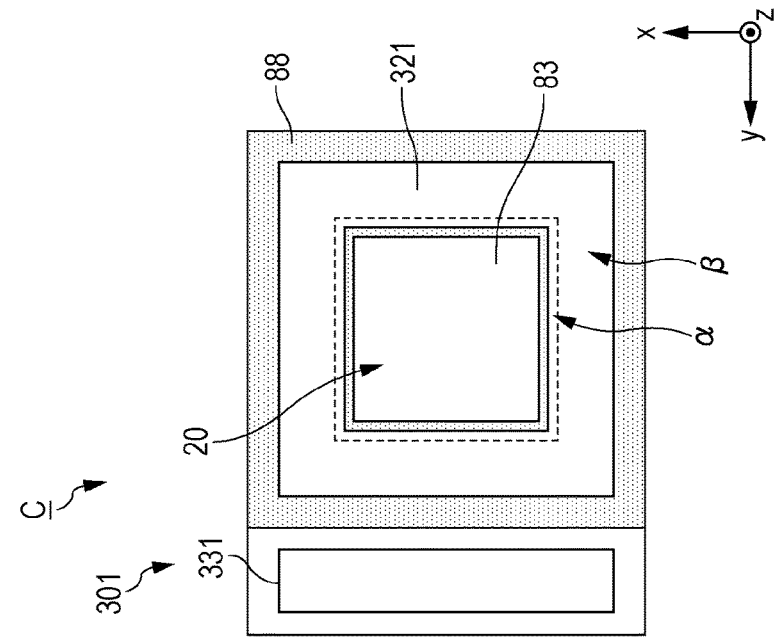
FIGS. 19A and 19B are enlarged views of an island in which a light-emitting diode and a setting thyristor are stacked for illustrating a second modification, specifically.
Figure 19A:
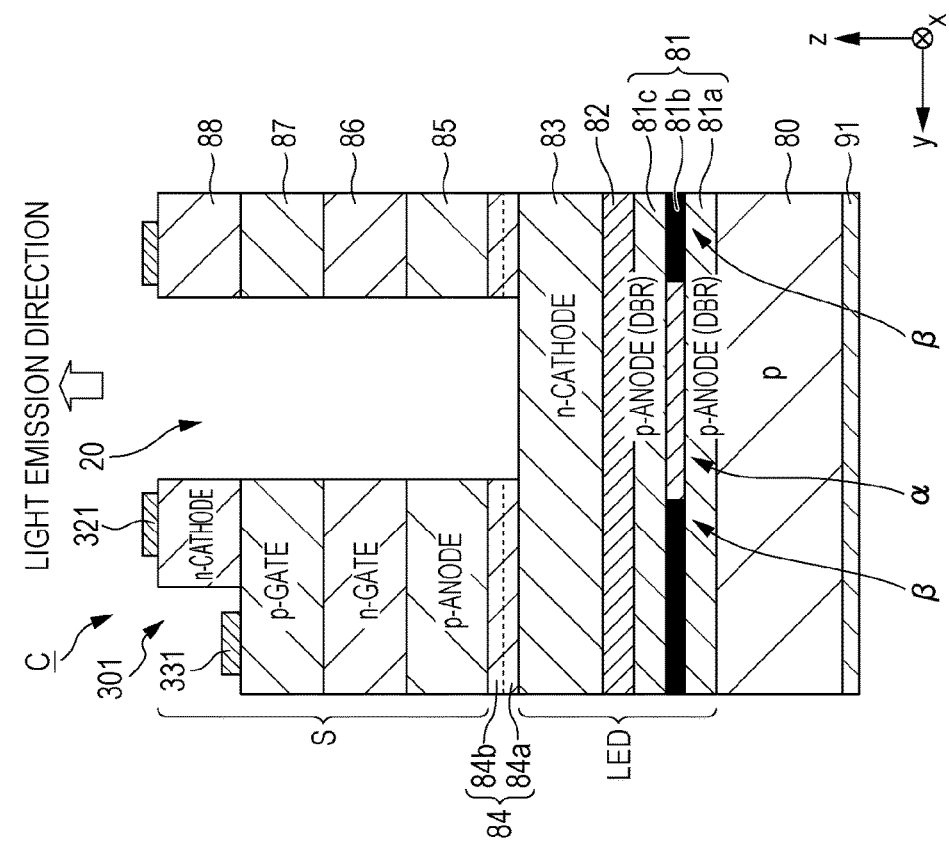

Second Modification of Light-emitting Chip C According to Second Exemplary Embodiment FIGS. 19A and 19B are enlarged views of the island 301 in which the light-emitting diode LED and the setting thyristor S are stacked for illustrating a second modification. Specifically, FIG. 19A is an enlarged cross-sectional view of the island 301, and FIG. 19B is a plan view of the island 301.

In the second modification, the n-cathode (DBR) layer 83 of the light-emitting chip C illustrated in FIGS. 18A and 18B is replaced with the n-cathode layer 83 that is not a DBR layer. The rest of the configuration is substantially the same as that of the light-emitting chip C according to the first exemplary embodiment.

In the light-emitting chip C according to the second modification, the p-anode (DBR) layer 81 is disposed under the light-emitting layer 82 (on the side closer to the substrate 80). In this case, since a reflectance of 30% is achieved at an interface between the n-cathode layer 88 and air, the intensity of light from the light-emitting layer 82 is increased by resonance before the light is output.

In addition, light that travels toward the substrate 80 out of light from the light-emitting layer 82 is reflected and then travels towards the exit. Thus, the light use efficiency increases compared with the case where the p-anode layer 81 is not a DBR layer.

The light-emitting chip C according to the second modification is manufactured by partly modifying the manufacturing method according to the first exemplary embodiment illustrated in FIGS. 10A to 12C. That is, in the semiconductor stack forming step illustrated in FIG. 10A, the lower p-anode layer 81a and the upper p-anode layer 81c of the p-anode layer 81 are formed as DBR layers.

The rest of the configuration is substantially the same as that of the light-emitting chip C according to the second exemplary embodiment. In addition, as in the first modification (FIGS. 17A and 17B) of the first exemplary embodiment, the setting thyristor S may be provided along one of sides of the island 301 having a square plan shape, for example.

Third Exemplary Embodiment

In the light-emitting chip C according to the first exemplary embodiment and the light-emitting chip C according to the second exemplary embodiment, the light-emitting elements are the light-emitting diodes LED. A light-emitting chip C according to a third exemplary embodiment uses vertical-cavity surface-emitting lasers (VCSEL) as light-emitting elements.

Although the following description will be given for a portion in which the vertical-cavity surface-emitting laser VCSEL and the setting thyristor S are stacked in the island 301 of the light-emitting chip C, the same applies to a portion in which the lower diode UD and the transfer thyristor T are stacked. The rest of the configuration is substantially the same as that of the light-emitting chip C according to the first exemplary embodiment. That is, the light-emitting diode LED in the light-emitting chip C according to the first exemplary embodiment is substituted for the vertical-cavity surface-emitting laser VCSEL. Thus, a description of substantially the same part is omitted, and different part will be described.

Figure 20B:
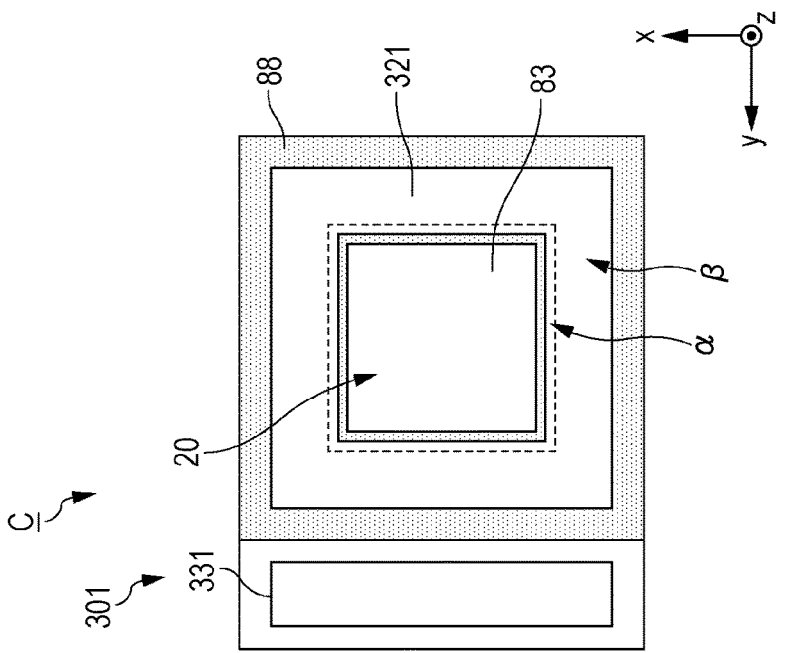
FIGS. 20A and 20B are enlarged views of an island in which a vertical cavity surface emitting laser and a setting thyristor are stacked in a light-emitting chip according to a third exemplary embodiment, specifically.
Figure 20A:
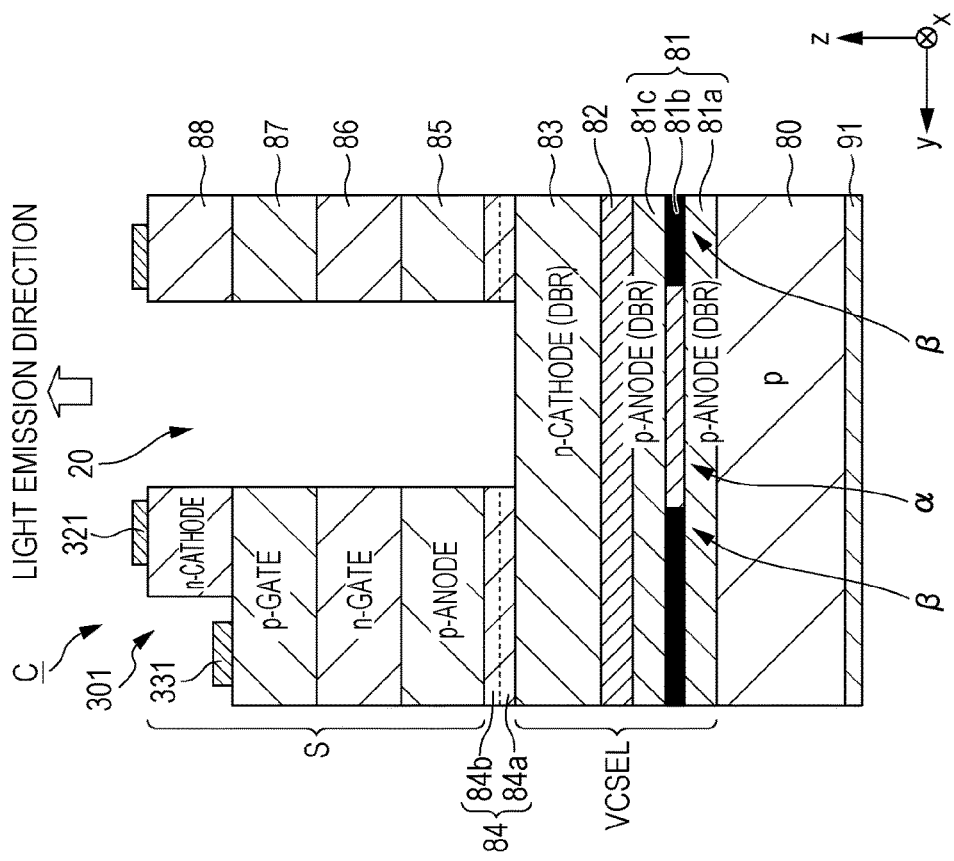

FIGS. 20A and 20B are enlarged views of the island 301 in which the vertical cavity surface emitting laser VCSEL and the setting thyristor S are stacked in the light-emitting chip C according to the third exemplary embodiment. Specifically, FIG. 20A is an enlarged cross-sectional view of the island 301, and FIG. 20B is a plan view of the island 301.

The vertical cavity surface emitting laser VCSEL and the setting thyristor S are stacked.

The vertical-cavity surface-emitting laser VCSEL resonates light in the light-emitting layer 82 sandwiched by the two DBR layers (the p-anode (DBR) layer 81 and the n-cathode (DBR) layer 83) to cause laser oscillation. When, for example, the reflectance between the light-emitting layer 82 and the two DBR layers (the p-anode (DBR) layer 81 and the n-cathode (DBR) layer 83) becomes 99% or higher, laser oscillation occurs.

The basic structure is substantially the same as that of the light-emitting chip C according to the second exemplary embodiment illustrated in FIGS. 18A and 18B, and therefore a description thereof will be omitted.

The light-emitting chip C according to the third exemplary embodiment is manufactured by partly modifying the manufacturing method according to the first exemplary embodiment illustrated in FIGS. 10A to 12C. That is, in the semiconductor stack forming step illustrated in FIG. 10A, the lower p-anode layer 81a and the upper p-anode layer 81c of the p-anode layer 81 and the n-cathode layer 83 are formed as DBR layers.

The light-emitting chip C according to the third exemplary embodiment operates in accordance with the timing chart illustrated in FIG. 9 described in the first exemplary embodiment.

As described in the first exemplary embodiment, also in the light-emitting chip C according to the third exemplary embodiment, the position of the current constriction layer may be changed, the metallic conducting group III-V compound layer may be used in place of the tunnel junction layer 84, and the voltage reduction layer 89 may be disposed in the transfer thyristor T and the setting thyristor S.

In addition, as in the first modification (FIGS. 17A and 17B) of the first exemplary embodiment, the setting thyristor S may be disposed along one of sides of the island 301 having a square plan shape, for example.

A modification of the light-emitting chip C according to the third exemplary embodiment will be described below. In the modification described below, although a portion in which the vertical-cavity surface-emitting laser VCSEL and the setting thyristor S are stacked in the island 301 of the light-emitting chip C will be described, the same applies to a portion in which the lower diode UD and the transfer thyristor T are stacked. Since the rest of the configuration is substantially the same as that of the light-emitting chip C described above, the different part is described, and a description of the substantially the same part is omitted.

Figure 21B:
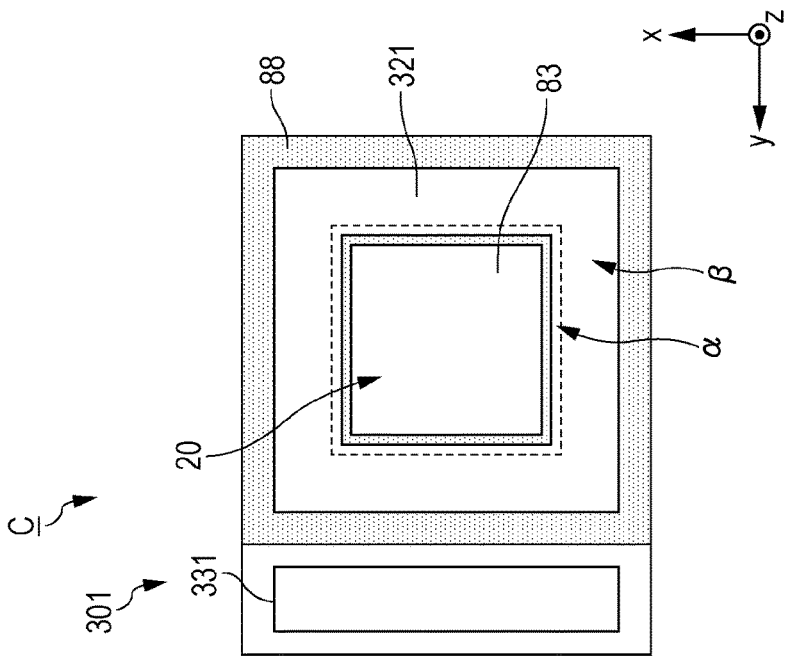
FIGS. 21A and 21B are enlarged views of an island in which a vertical cavity surface emitting laser and a setting thyristor are stacked for illustrating a third modification, specifically.
Figure 21A:
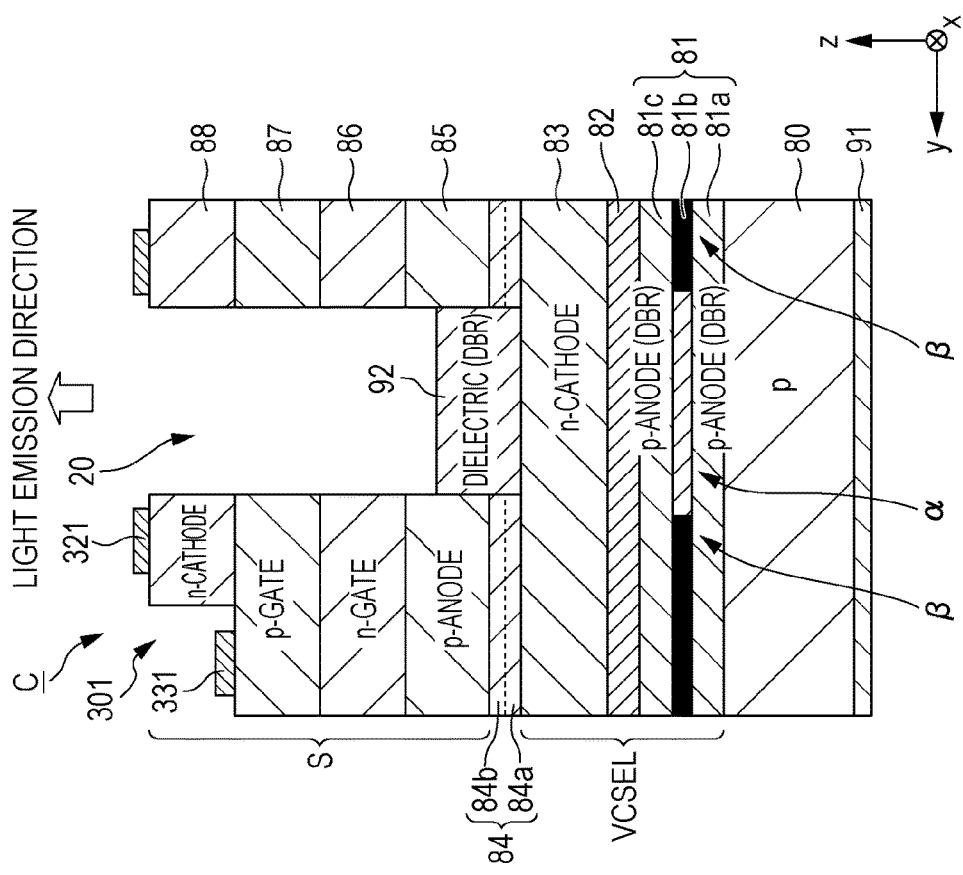

Third Modification of Light-emitting Chip C According to Third Exemplary Embodiment FIGS. 21A and 21B are enlarged views of the island 301 in which the vertical cavity surface emitting laser VCSEL and the setting thyristor S are stacked for illustrating a third modification. Specifically, FIG. 21A is an enlarged cross-sectional view of the island 301, and FIG. 21B is a plan view of the island 301.

In the third modification, a dielectric (DBR) layer 92 is provided in the opening 20 instead of replacing the n-cathode layer 83 of the vertical-cavity surface-emitting laser VCSEL with the DBR layer. That is, the vertical-cavity surface-emitting laser VCSEL resonates light between the p-anode (DBR) layer 81 and the dielectric (DBR) layer 92 to cause laser oscillation.

The dielectric (DBR) layer 92 is a so-called dielectric mirror constituted by staking plural dielectric layers having different refractive indexes.

The light-emitting chip C according to the third modification is manufactured by partly modifying the manufacturing method according to the first exemplary embodiment illustrated in FIGS. 10A to 12C. That is, in the semiconductor stack forming step illustrated in FIG. 10A, the lower p-anode layer 81a and the upper p-anode layer 81c of the p-anode layer 81 are formed as DBR layers. In addition, after the opening forming step in FIG. 12A, the dielectric (DBR) layer 92 is formed.

The rest of the configuration is substantially the same as that of the light-emitting chip C according to the third exemplary embodiment. In addition, as in the first modification (FIGS. 17A and 17B) of the first exemplary embodiment, the setting thyristor S may be provided along one of sides of the island 301 having a square plan shape, for example.

In the third modification, since the dielectric (DBR) layer 92 is formed in the opening 20, the light emission direction may be opposite to the direction indicated in FIG. 21A. In other words, the light may be emitted from the back surface of the substrate 80.

Fourth Exemplary Embodiment

In the first to third exemplary embodiments, the transfer thyristor T is disposed on the lower diode UD, and the lower diode UD and the transfer thyristor T are connected in series. Accordingly, the potential "L" of the first transfer signal φ1 and the second transfer signal φ2 supplied to the transfer thyristor T is applied to the lower diode UD and the transfer thyristor T that are connected in series. Accordingly, the potential is "L" (−5 V), for example.

In a fourth exemplary embodiment, the transfer thyristor T and the lower diode UD are not connected in series. Thus, the potential "L" of the first transfer signal φ1 and the second transfer signal φ2 supplied to the transfer thyristor T decreases and may be a potential applied across the anode and the cathode of the transfer thyristor T. The potential may be "L" (−3.3 V), for example.

The configuration of the fourth exemplary embodiment is substantially the same as that of the first exemplary embodiment except for the structure of the light-emitting chip C. Thus, a description of substantially the same part is omitted, and different part will be described.

Figure 22:
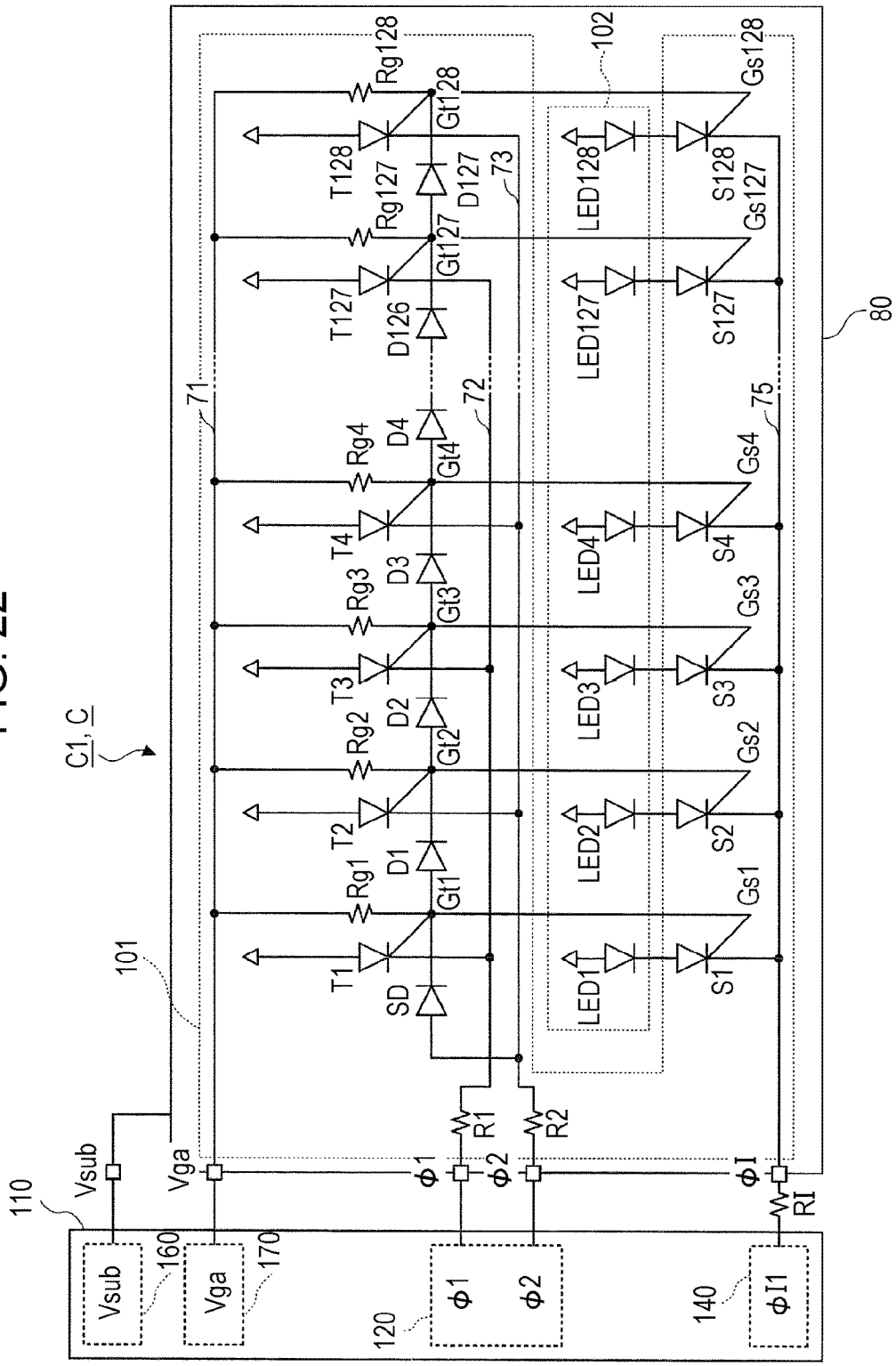
FIG. 22 is an equivalent circuit diagram illustrating a circuit configuration of a light-emitting chip in which a self-scanning light-emitting device (SLED) array according to a fourth exemplary embodiment is mounted.

FIG. 22 is an equivalent circuit diagram illustrating a circuit configuration of the light-emitting chip C in which a self-scanning light-emitting device (SLED) array is mounted according to the fourth exemplary embodiment.

The light-emitting chip C1(C) includes the light-emitting unit 102 (see FIG. 4A) constituted by the light-emitting diodes LED1 to LED128. The light-emitting chip C1(C) includes the driving unit 101 constituted by the setting thyristors S1 to S128, the transfer thyristors T1 to T128, the coupling diodes D1 to D127, the power supply line registers Rg1 to Rg128, the start diode SD, and the current-limiting resistors R1 and R2.

That is, the light-emitting chip C according to the fourth exemplary embodiment does not include the lower diodes UD1 to UD128 that are included in the light-emitting chip C according to the first exemplary embodiment illustrated in FIG. 5.

Figure 23:
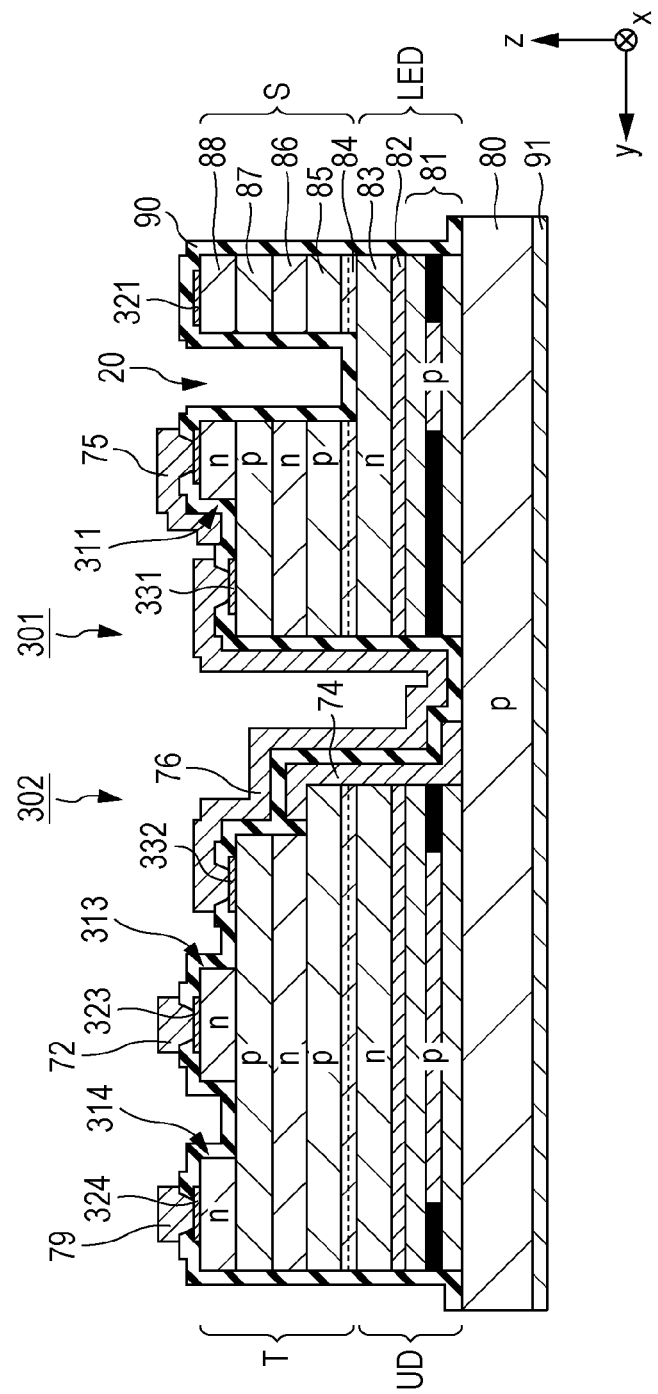
FIG. 23 is a cross-sectional view of islands of the light-emitting chip according to the fourth exemplary embodiment.

FIG. 23 is a cross-sectional view of the islands 301 and 302 of the light-emitting chip C according to the fourth exemplary embodiment.

The plan layout of the light-emitting chip C according to the fourth exemplary embodiment is substantially the same as that of the light-emitting chip C according to the first exemplary embodiment illustrated in FIG. 6A. Thus, a description thereof is omitted.

The cross-section of the islands 301 and 302 of the light-emitting chip C according to the fourth exemplary embodiment illustrated in FIG. 23 is a cross-section taken along line VIB-VIB in FIG. 6A. However, as in FIGS. 10A to 12C, this cross-section is viewed from the side opposite to the side illustrated in FIG. 6B. In addition, the cross-section illustrated in FIG. 23 corresponds to the cross-section of the light-emitting chip C according to the first exemplary embodiment illustrated in FIG. 12C.

As illustrated in FIG. 23, the surface of the p-anode layer 85 of the transfer thyristor T is partly exposed in the island 302 of the light-emitting chip C according to the fourth exemplary embodiment. In addition, the exposed part of the p-anode layer 85 and the p-type substrate 80 are connected to each other via a connection wire 74. The connection wire 74 is formed of Zn-containing Au (AuZn) that easily forms an ohmic contact with the p-type semiconductor layer. The connection wire 74 is disposed at an end of the island 302 in the −y direction. Furthermore, the connection wire 76 is disposed so as to overlap with the connection wire 74 with the protective layer 90 interposed therebetween.

With such a configuration, the potential of the p-anode layer 85 of the transfer thyristor T is set to the reference potential Vsub ("H" (0 V)) that is supplied to the back-surface electrode 91 of the substrate 80.

In addition, the side faces of the p-anode layer 81, the light-emitting layer 82, and the n-cathode layer 83 of the lower diode UD located under the transfer thyristor T are short-circuited by the connection wire 74. With this configuration, the lower diode UD is present but does not operate.

The light-emitting chip C according to the fourth exemplary embodiment is manufactured by partly modifying the manufacturing method according to the first exemplary embodiment illustrated in FIGS. 10A to 12C. That is, after the p-gate layer exposure etching step illustrated in FIG. 11C, an etching step is performed to expose part of the surface of the p-anode layer 85 in the island 302, and after the p-ohmic electrode forming step illustrated in FIG. 12A, a connection-wire forming step for forming the connection wire 74 is performed. In addition, the connection wire 74 may be connected to the n-cathode layer 83. Since a current flows from the connection wire 74 to the transfer thyristor T through the n-cathode layer 83 and the tunnel junction layer 84, the current does not flow through the lower diode UD, and the lower diode UD does not consume any electric power. This is true when the connection wire 74 is connected to part of the tunnel junction layer 84.

Figure 24:
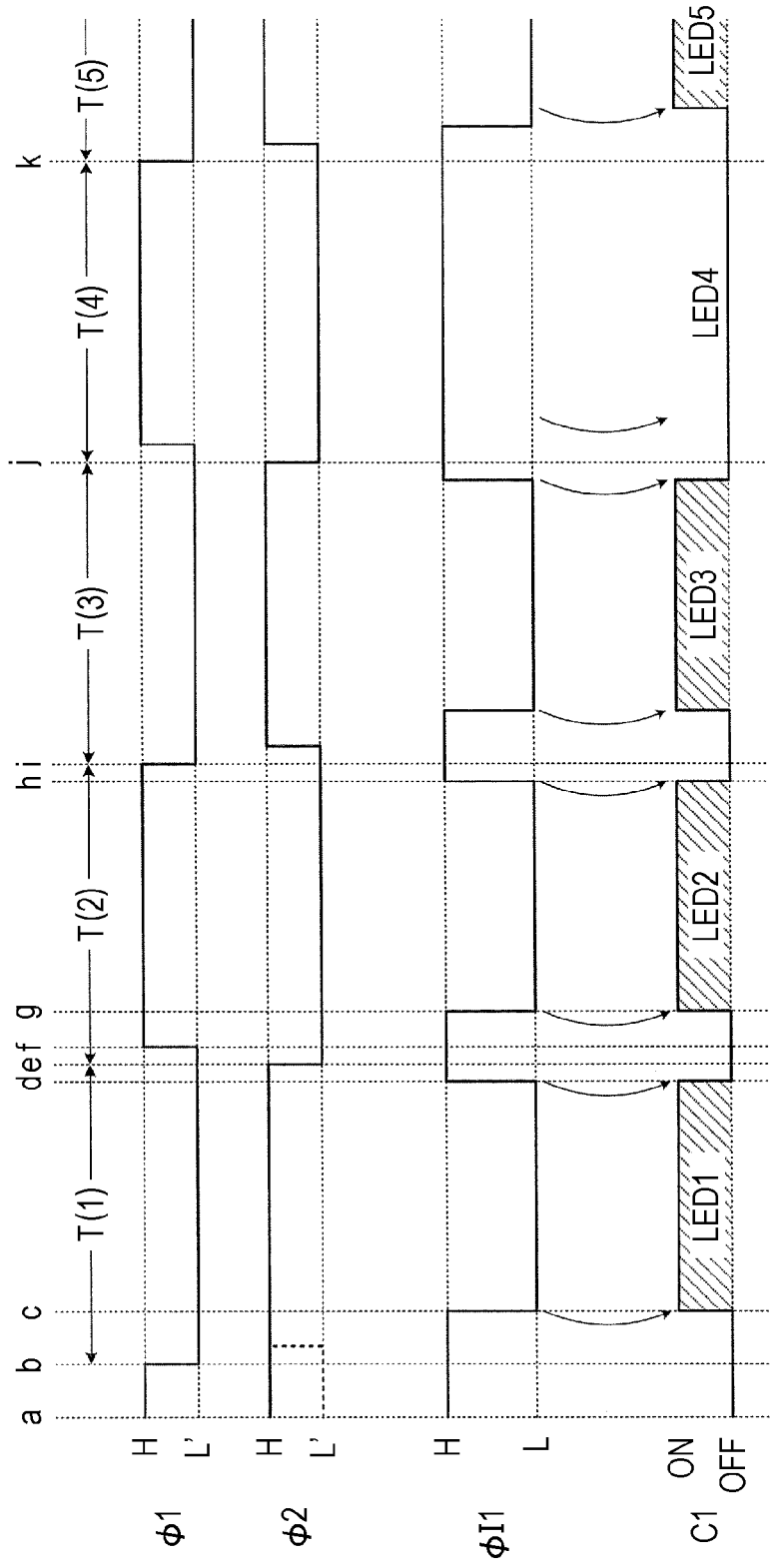
FIG. 24 is a timing chart illustrating an operation of the light-emitting chip according to the fourth exemplary embodiment.

FIG. 24 is a timing chart illustrating an operation of the light-emitting chip according to the fourth exemplary embodiment.

The potential "L" of the first transfer signal φ1 and the second transfer signal φ2 in the timing chart illustrating the operation of the light-emitting chip C according to the first exemplary embodiment in FIG. 9 is changed to "L'". As described before, the first transfer signal φ1 and the second transfer signal φ2 are applied across the anode and the cathode of the transfer thyristor T. Thus, the first transfer signal φ1 and the second transfer signal φ2 used in the light-emitting chip C according to the fourth exemplary embodiment may have a voltage whose absolute value is smaller than that of the first transfer signal φ1 and the second transfer signal φ2 used in the light-emitting chip C according to the first exemplary embodiment. That is, the voltage (1.7 V in this example) applied to the lower diode UD is no longer used. In this example, the potential "L'" is equal to −3.3 V. As for the operation of the light-emitting chip C, the potential "L" (−5 V) of the first transfer signal φ1 and the second transfer signal φ2 is changed to "L'" (−3.3 V) and the operation of the lower diode UD is ignored.

The voltage of the first transfer signal φ1 and the second transfer signal φ2 used for the operation is reduced, and consequently power consumption is reduced.

A modification of the light-emitting chip C according to the fourth exemplary embodiment will be described below. In the modification described below, the islands 301 and 302 are different from those of the light-emitting chip C according to the fourth exemplary embodiment illustrated in FIG. 23. Since the rest of the configuration is substantially the same as that of the light-emitting chip C described above, a description of substantially the same part is omitted, and different part will be described.

Figure 25:
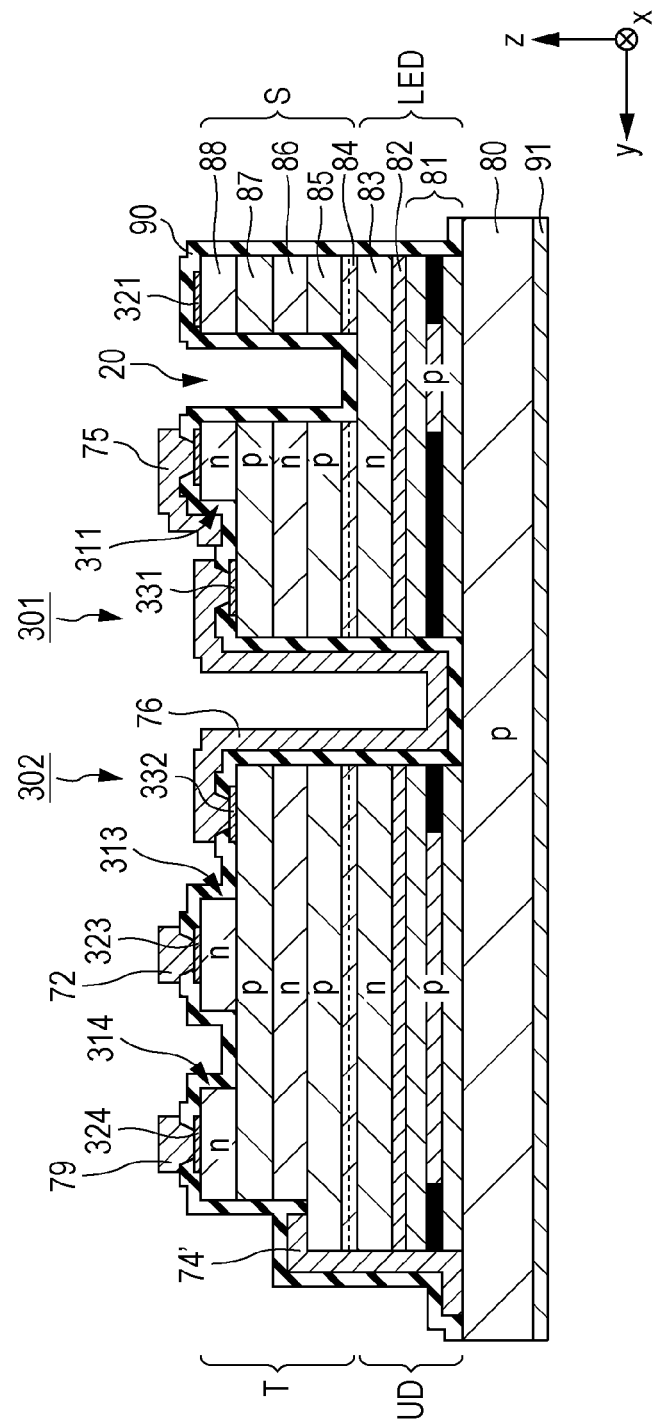
FIG. 25 is a cross-sectional view of islands of a light-emitting chip according to a fourth modification.

FIG. 25 is a cross-sectional view of the islands 301 and 302 of the light-emitting chip C according to a fourth modification. In the fourth modification, a connection wire 74' is disposed at the end portion of the island 302 in the y direction. In this configuration, the connection wire 74' and the connection wire 76 do not overlap with the protective layer 90 interposed therebetween. Such a configuration reduces a possibility of the connection wire 74 and the connection wire 76 being short-circuited as in the light-emitting chip C (FIG. 23) according to the fourth exemplary embodiment. Note that the state in which the connection wire 74' is disposed at the end portion in the y direction is an example in which the connection wire 74' and the connection wire 76 do not overlap with the protective layer 90 interposed therebetween. Specifically, the connection wire 74' may be disposed at any other position where the connection wire 74' and the connection wire 76 do not overlap with the protective layer 90 interposed therebetween (on the −x direction side or on the x direction side of the island 302). That is, the connection wire 74' may be disposed at a blank space in the plan layout of the light-emitting chip C illustrated in FIG. 6A.

In particular, portions near the first transfer signal line 72 or the second transfer signal line 73 or portions under the first transfer signal line 72 or the second transfer signal line 73 in the plan layout view of FIG. 6A are used only for disposing these signal lines, and the semiconductor regions thereunder are not used. Thus, the connection wire 74 or 74' is desirably disposed at the portion near or under the first transfer signal line 72 or the second transfer signal line 73 since the size of the chip is not increased and the circuit configuration is not changed. For example, for the odd-numbered transfer thyristors T1, T3, . . . , the connection wire 74 or 74' is disposed between the transfer thyristors T1, T3, . . . , and the second transfer signal line 73 or under the second transfer signal line 73. For the even-numbered transfer thyristors T2, T4, . . . , the connection wire 74 or 74' is disposed between the transfer thyristors T2, T4, . . . and the first transfer signal line 72 or under the first transfer signal line 72.

The configuration of the light-emitting chip C according to the fourth exemplary embodiment or the configuration according to the fourth modification may be used in the light-emitting chips C according to the first to third exemplary embodiments.

In the first to fourth exemplary embodiments, the description has been given by using the light-emitting diodes LED and the vertical-cavity surface-emitting lasers VCSEL as light-emitting elements; however, other light-emitting elements may be used. For example, the light-emitting elements may be laser transistors having the anode terminal, the cathode terminal, and the control terminal that controls on/off of laser oscillation or the intensity of laser light. The light-emitting elements do not have to be surface emitting light-emitting elements and may be constituted by, for example, a combination of a horizontal cavity laser and a mirror or the like that reflects light emitted from the horizontal cavity laser upward.

The self-scanning light-emitting device (SLED) array according to the first to fourth exemplary embodiments includes the light-emitting unit 102 including the light-emitting elements (the light-emitting diodes LED or the vertical-cavity surface-emitting lasers VCSEL) and the driving unit 101 including the setting thyristors S, the lower diodes UD, and the transfer thyristors T, for example; however, the driving unit 101 may further include control thyristors disposed between the setting thyristors S and the transfer thyristors T. Further, other components such as diodes or resistors may be further included.

In addition, the transfer thyristors T are connected to each other by the respective coupling diodes D. However, the transfer thyristors T may be connected to each other by respective members capable of transferring a change in the potential, such as resistors.

In addition, the lower diodes UD may be used as the light-emitting elements (the light-emitting diodes LED or the vertical-cavity surface-emitting lasers VCSEL) without using the light-emitting elements (the light-emitting diodes LED or the vertical-cavity surface-emitting lasers VCSEL) and the setting thyristors S, and the turn-on signal φ1 may be superimposed onto the first transfer signal φ1 and the second transfer signal φ2 supplied to the transfer thyristors T. Such a configuration reduces the number of elements used and makes the light-emitting chip C more compact. In this case, elements, such as the transfer thyristors T, other than the light-emitting elements constitute the driving unit 101.

In the first to fourth exemplary embodiments, the conductivity types of the light-emitting elements (the light-emitting diodes LED and the vertical-cavity surface-emitting lasers VCSEL) and of the setting thyristors S, the lower diodes UD, and the transfer thyristors T may be reversed, and the polarity of the circuit may be changed. That is, the anode-common circuit may be changed to a cathode-common circuit; conversely, the cathode-common circuit may be changed to the anode-common circuit.

To reduce light emission delay and relaxation oscillation at the time of turn-on of the light-emitting elements (the light-emitting diodes LED and the vertical-cavity surface-emitting lasers VCSEL), a small current that is greater than or equal to a threshold current may be caused to flow through the light-emitting elements in advance to set the light-emitting elements in a light-emitting state or an oscillation-state in a slight degree. That is, the light-emitting elements may be caused to emit weak light before the respective setting thyristors S turn on, and the amount of light emitted by the light-emitting elements may be increased when the respective setting thyristors S turn on so that a predetermined amount of light is emitted. Examples of such a configuration may include the following. For example, an electrode is formed at the anode layer of each light-emitting element (the light-emitting diode LED or the vertical-cavity surface-emitting laser VCSEL). A voltage or current source may be connected to this electrode, and a weak current may be supplied to the light-emitting element from this voltage or current source before the setting thyristor S turns on.

In addition, the transfer thyristors T and the setting thyristors S used in each of the exemplary embodiments may have a structure other than the pnpn four-layer structure as long as the structure implements functions of the transfer thyristors T and the setting thyristors S in the exemplary embodiment. For example, the transfer thyristors T and the setting thyristors S may have a pinin structure, a pipin structure, an npip structure, or a pnin structure having properties of the thyristors. In this case, one of the i-layer, the n-layer, and the i-layer sandwiched by the p-layer and the n-layer in the pinin structure and one of the n-layer and the i-layer sandwiched by the p-layer and the p-layer in the pnin structure may serve as a gate layer, and the n-ohmic electrode disposed on the gate layer may serve as the terminal of the gate Gt (gate Gs). Alternatively, one of the i-layer, the p-layer, and the i-layer sandwiched by the n-layer and the p-layer in the npip structure and one of the p-layer and the i-layer sandwiched by the n-layer and the p-layer in the npip structure may serve as the gate layer, and the p-ohmic electrode 332 disposed on the gate layer may serve as the terminal of the gate Gt (gate Gs).

Further, the semiconductor structure in which plural semiconductor layers constituting a thyristor and plural semiconductor layers constituting a light-emitting element are stacked with one or more semiconductor layers constituting a tunnel junction interposed therebetween in accordance with each of the exemplary embodiments is usable for a component other than the self-scanning light-emitting device (SLED) array. For example, the semiconductor structure is usable as a single light-emitting component that includes a single light-emitting element (such as the light-emitting diode LED or the vertical-cavity surface-emitting laser VCSEL) and the setting thyristor S stacked on the light-emitting element and that turns on in response to input of an electric signal or optical signal from the outside. In this case, the light-emitting element constitutes the light-emitting unit 102, and the setting thyristor S constitutes the driving unit 101.

The above description has been given mainly of the case where the substrate 80 is formed of p-type GaAs by way of example. An example of semiconductor layers (of a semiconductor stack formed in the semiconductor stack forming step in FIG. 10A) when a substrate of another type is used will be described.

First, an example of the semiconductor stack in the case where a GaN substrate is used is as described below.

The p-anode layer 81 is formed of p-type $Al_{0.9}GaN$ with an impurity concentration of $1 \times 10^{18}/cm^3$, for example. The Al composition ratio may be changed within a range of 0 to 1.

Since it is difficult to use an oxidized constriction layer as the current constriction layer on the GaN substrate, it is effective to use ion implantation as a current constriction method.

The light-emitting layer 82 has a quantum well structure in which well layers and barrier layers are alternately stacked. The well layers are formed of GaN, InGaN, or AlGaN, for example, and the barrier layers are formed of AlGaN or GaN, for example. The light-emitting layer 82 may have a quantum wire structure or a quantum dot structure.

The n-cathode layer 83 is formed of n-type $Al_{0.9}GaN$ with an impurity concentration of $1 \times 10^{18}/cm^3$, for example. The Al composition ratio may be changed within a range of 0 to 1.

The tunnel junction layer 84 is constituted by a junction of the $n^{++}$-layer 84a doped with an n-type impurity at a high concentration and the $p^{++}$-layer 84b doped with a p-type impurity at a high concertation (see FIG. 7A). The $n^{++}$-layer 84a and the $p^{++}$-layer 84b have a high impurity concentration, which is $1 \times 10^{20}/cm^3$, for example. Note that a common impurity concentration in the junction is in a range of $10^{17}/cm^3$ to $10^{18}/cm^3$. Examples of the combination of the $n^{++}$-layer 84a and the $p^{++}$-layer 84b (hereinafter, referred to as the $n^{++}$-layer 84a/the $p^{++}$-layer 84b) include $n^{++}GaN/p^{++}GaN$, $n^{++}GaInN/p^{++}GaInN$, and $n^{++}AlGaN/p^{++}AlGaN$. Note that the former and the latter in the combinations may be interchanged.

The p-anode layer 85 is formed of p-type $Al_{0.9}GaN$ with an impurity concentration of $1 \times 10^{18}/cm^3$, for example. The Al composition ratio may be changed within a range of 0 to 1.

The n-gate layer 86 is formed of n-type $Al_{0.9}GaN$ with an impurity concentration of $1 \times 10^{17}/cm^3$, for example. The Al composition ratio may be changed within a range of 0 to 1.

The p-gate layer 87 is formed of p-type $Al_{0.9}GaN$ with an impurity concentration of $1 \times 10^{17}/cm^3$, for example. The Al composition ratio may be changed within a range of 0 to 1.

The n-cathode layer 88 is formed of n-type $Al_{0.9}GaN$ with an impurity concentration of $1 \times 10^{18}/cm^3$, for example. The Al composition ratio may be changed within a range of 0 to 1.

An example of the semiconductor stack in the case where an InP substrate is used is as described below.

The p-anode layer 81 is formed of p-type InGaAsP with an impurity concentration of $1 \times 10^{18}/cm^3$, for example. The Ga composition ratio or/and the As composition ratio may be changed within a range of 0 to 1.

Since it is difficult to use an oxidized constriction layer as the current constriction layer on the InP substrate, it is effective to use ion implantation as a current constriction method.

The light-emitting layer 82 has a quantum well structure in which well layers and barrier layers are alternately stacked. The well layers are formed of InAs, InGaAsP, AlGaInAs, or GaInAsPSb, for example, and the barrier layers are formed of InP, InAsP, InGaAsP, or AlGaInAsP, for example. Note that the light-emitting layer 82 may have a quantum wire stricture or a quantum dot structure.

The n-cathode layer 83 is formed of n-type InGaAsP with an impurity concentration of $1 \times 10^{18}/cm^3$, for example. The Ga composition ratio or/and the As composition ratio may be changed within a range of 0 to 1.

The tunnel junction layer 84 is constituted by a junction of the $n^{++}$-layer 84a doped with an n-type impurity at a high concentration and the $p^{++}$-layer 84b doped with a p-type impurity at a high concertation (see FIG. 7A). The $n^{++}$-layer 84a and the $p^{++}$-layer 84b have a high impurity concentration, which is $1 \times 10^{20}/cm^3$, for example. Note that a common impurity concentration in the junction is in a range of $10^{17}/cm^3$ to $10^{18}/cm^3$. Examples of the combination of the $n^{++}$-layer 84a and the $p^{++}$-layer 84b (hereinafter, referred to as the $n^{++}$-layer 84a/the $p^{++}$-layer 84b) include $n^{++}$InP/$p^{++}$InP, $n^{++}$InAsP/$p^{++}$InAsP, $n^{++}$InGaAsP/$p^{++}$InGaAsP, and $n^{++}$InGaAsPSb/$p^{++}$InGaAsPSb. Note that the former and the latter in the combinations may be interchanged.

The p-anode layer 85 is formed of p-type InGaAsP with an impurity concentration of $1 \times 10^{18}/\text{cm}^3$, for example. The Ga composition ratio or/and the As composition ratio may be changed within a range of 0 to 1.

The n-gate layer 86 is formed of n-type InGaAsP with an impurity concentration of $1 \times 10^{17}/\text{cm}^3$, for example. The Ga composition ratio or/and the As composition ratio may be changed within a range of 0 to 1.

The p-gate layer 87 is formed of p-type InGaAsP with an impurity concentration of $1 \times 10^{17}/\text{cm}^3$, for example. The Ga composition ratio or/and the As composition ratio may be changed within a range of 0 to 1.

The n-cathode layer 88 is formed of n-type InGaAsP with an impurity concentration of $1 \times 10^{18}/\text{cm}^3$, for example. The Ga composition ratio or/and the As composition ratio may be changed within a range of 0 to 1.

These semiconductor layers are stacked using metal organic chemical vapor deposition (MOCVD) or molecular beam epitaxy (MBE), for example. Consequently, the semiconductor stack is formed.

In addition, the exemplary embodiments described above may be applied to p-type, n-type, and i-type layers formed of organic materials.

Further, each of the exemplary embodiments may be used in combination of another exemplary embodiment.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
   a substrate;
   a plurality of light-emitting elements that are disposed on the substrate and emit light in a direction perpendicular to a front surface of the substrate; and
   a plurality of thyristors that are respectively stacked on the plurality of light-emitting elements and turn on to drive the light-emitting elements to emit light or to increase an emitted light amount,
   wherein each of the thyristors includes an opening in a path of light from the corresponding light-emitting element to the thyristor.

2. The light-emitting component according to claim 1, wherein the opening included in each of the thyristors reaches a semiconductor layer constituting the corresponding light-emitting element.

3. The light-emitting component according to claim 1,
   wherein each of the thyristors is constituted by at least one of an anode layer and a cathode layer, a first gate layer, a second gate layer, and the other of the anode layer and the cathode layer that are sequentially stacked on the substrate, and
   wherein the opening included in each of the thyristors is disposed in the other of the anode layer and the cathode layer from a surface of the other of the anode layer and the cathode layer.

4. The light-emitting component according to claim 1,
   wherein each of the thyristors is constituted by at least one of an anode layer and a cathode layer, a first gate layer, a second gate layer, and the other of the anode layer and the cathode layer that are sequentially stacked on the substrate, and
   wherein the opening included in each of the thyristors is disposed to reach the second gate layer.

5. The light-emitting component according to claim 1,
   wherein each of the thyristors is constituted by at least one of an anode layer and a cathode layer, a first gate layer, a second gate layer, and the other of the anode layer and the cathode layer that are sequentially stacked on the substrate, and
   wherein the opening included in each of the thyristors is disposed to reach the first gate layer.

6. The light-emitting component according to claim 1,
   wherein each of the thyristors is constituted by at least one of an anode layer and a cathode layer, a first gate layer, a second gate layer, and the other of the anode layer and the cathode layer that are sequentially stacked on the substrate, and
   wherein the opening included in each of the thyristors is disposed to reach the one of the anode layer and the cathode layer.

7. The light-emitting component according to claim 1, wherein each of the thyristors is stacked on the corresponding light-emitting element with a tunnel junction layer or a metallic conducting group III-V compound layer interposed therebetween.

8. The light-emitting component according to claim 1, wherein each of the thyristors includes a voltage reduction layer that reduces a rise voltage of the thyristor.

9. The light-emitting component according to claim 1 further comprising
   a plurality of transfer elements that are respectively disposed on lower elements and respectively connected to the plurality of thyristors and sequentially turn on to set the thyristors to an on-state, the lower elements having an identical structure with the plurality of light-emitting elements,
   wherein the transfer elements are connected to the substrate via a connection wire with none of the lower elements interposed therebetween or with part of a plurality of semiconductor layers constituting the lower elements interposed therebetween.

10. A printhead comprising:
    the light-emitting component according to claim 1; and
    an optical system that focuses light emitted from the light-emitting component to form an image.

11. An image forming apparatus comprising:
    an image bearing member;
    a charging member that charges the image bearing member;
    the printhead according to claim 10;
    a developing member that develops an electrostatic latent image obtained by being exposed to light by the printhead and formed on the image bearing member; and
    a transfer member that transfers an image developed on the image bearing member to a transferred-image-receiving medium.

12. A light-emitting component comprising:
a light-emitting element; and
a thyristor that is stacked on an emission surface side of the light-emitting element, includes an opening in a path of light emitted from the light-emitting element, and drives the light-emitting element.

13. The light-emitting component according to claim 12, wherein the opening is disposed at a position overlapping with a portion where an emitted light amount is largest on an emission surface of the light-emitting element.

14. The light-emitting component according to claim 12, wherein the opening is surrounded by the thyristor.

15. The light-emitting component according to claim 12,
wherein the light-emitting element includes a current passing portion that constricts an electric current, and
wherein a width or an area of the current passing portion is larger than a width or an area of the opening.

16. The light-emitting component according to claim 12,
wherein the light-emitting element includes a current passing portion that constricts an electric current, and
wherein a width or an area of the current passing portion is smaller than a width or an area of the opening.

17. A light-emitting component comprising:
a light-emitting element; and
a thyristor that is stacked on an emission surface side of the light-emitting element at a portion not overlapping with a portion where an emitted light amount is largest on an emission surface of the light-emitting element and that drives the light-emitting element.

* * * * *